United States Patent
Li et al.

(10) Patent No.: US 10,830,943 B2
(45) Date of Patent: Nov. 10, 2020

(54) OPTICAL FIBERS AND OPTICAL SYSTEMS COMPRISING THE SAME

(71) Applicant: Corning Incorporated, Corning, NY (US)

(72) Inventors: Ming-Jun Li, Horseheads, NY (US); Anping Liu, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 42 days.

(21) Appl. No.: 16/169,263

(22) Filed: Oct. 24, 2018

(65) Prior Publication Data

US 2019/0129093 A1 May 2, 2019

Related U.S. Application Data

(60) Provisional application No. 62/579,614, filed on Oct. 31, 2017.

(51) Int. Cl.
*G02B 6/02* (2006.01)
*G02B 6/036* (2006.01)
(Continued)

(52) U.S. Cl.
CPC ...... *G02B 6/02076* (2013.01); *B23K 26/0736* (2013.01); *B23K 26/53* (2015.10); *G02B 6/02338* (2013.01); *G02B 6/036* (2013.01); *G02B 6/03611* (2013.01); *G02B 6/262* (2013.01); *G02B 27/0927* (2013.01); *G02B 27/0955* (2013.01); *G02B 27/0994* (2013.01);
(Continued)

(58) Field of Classification Search
None
See application file for complete search history.

(56) References Cited

U.S. PATENT DOCUMENTS

| | | | |
|---|---|---|---|
| 7,724,422 B2 | 5/2010 | Abramczyk et al. | |
| 8,358,888 B2 | 1/2013 | Ramachandran | |

(Continued)

FOREIGN PATENT DOCUMENTS

| | | |
|---|---|---|
| CN | 104181637 A | 12/2014 |
| CN | 104898287 A | 9/2015 |

(Continued)

OTHER PUBLICATIONS

Deng et al. "All fiber Bessel beam generator based on M-type optical fiber", Proceedings of SPIE 8924, 2013. pp. 89240F.

(Continued)

*Primary Examiner* — Chad H Smith
(74) *Attorney, Agent, or Firm* — Smit Kapadia

(57) ABSTRACT

An optical fiber for converting a Gaussian laser beam into a Bessel laser beam may include a first segment optically coupled to a second segment with a transition region, the first segment having a first outer diameter greater than a second outer diameter of the second segment. The first segment may include a first core portion with a first cladding portion extending around the first core portion. The second segment may include a second core portion with a second cladding portion extending around the second core portion. The optical fiber may have a non-axisymmetric refractive index profile or may be coupled to an end cap with a non-axisymmetric refractive index profile.

9 Claims, 31 Drawing Sheets

(51) Int. Cl.
*H01S 5/022* (2006.01)
*G02B 27/09* (2006.01)
*G02B 6/26* (2006.01)
*B23K 26/53* (2014.01)
*B23K 26/073* (2006.01)
*G02B 6/32* (2006.01)
*G02B 6/14* (2006.01)
*G02B 6/255* (2006.01)

(52) U.S. Cl.
CPC ........ *H01S 5/02284* (2013.01); *G02B 6/0365* (2013.01); *G02B 6/03688* (2013.01); *G02B 6/14* (2013.01); *G02B 6/255* (2013.01); *G02B 6/32* (2013.01)

(56) References Cited

U.S. PATENT DOCUMENTS

2018/0088358 A1* 3/2018 Kliner .................... B33Y 50/02
2018/0210212 A1 7/2018 Li et al.
2018/0221988 A1 8/2018 Liu et al.

FOREIGN PATENT DOCUMENTS

DE 102011109845 A1 5/2012
JP 2012159749 A 8/2012
KR 1020621 B1 3/2011

OTHER PUBLICATIONS

Meyer et al. "Single-shot ultrafast laser processing of high-aspect-ratio nanochannels using elliptical Bessel beams", Optics Letters 42(21) 2017, pp. 4307.

International Search Report and Written Opinion PCT/US2018/058238 dated Feb. 4, 2019, 14 Pgs.

Borghi et al; "M2 Factor of Bessel-Gauss Beams"; Optics Letters, vol. 22 (5), pp. 262-264; (1997).

Siegman "New Developments in Laser Resonators"; Proc. SPIE, vol. 1224; Optical Resonators; 14 Pages (1990).

* cited by examiner

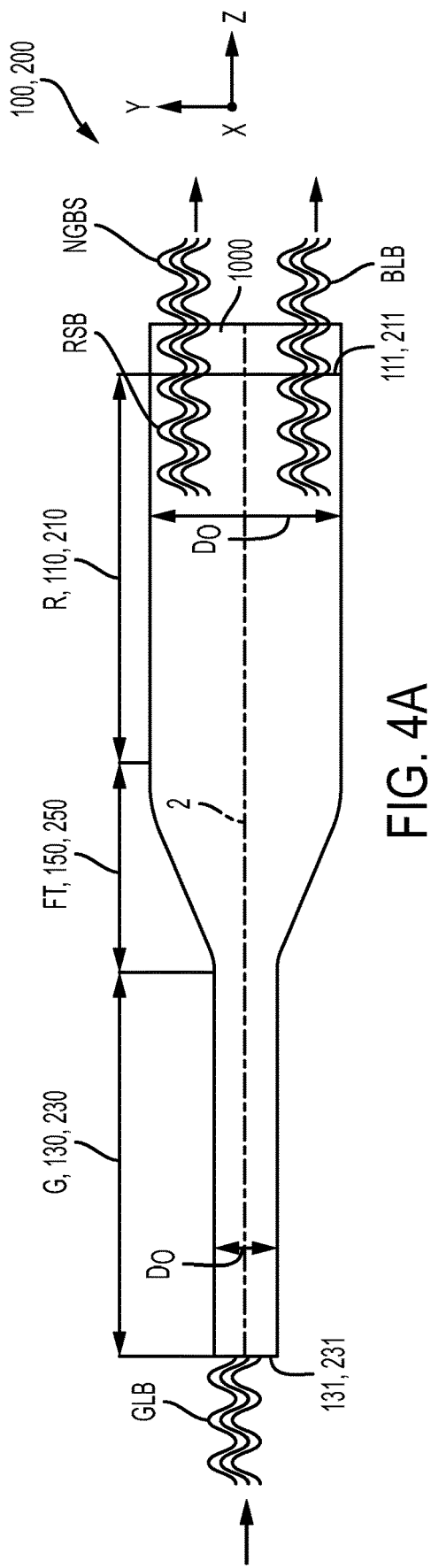
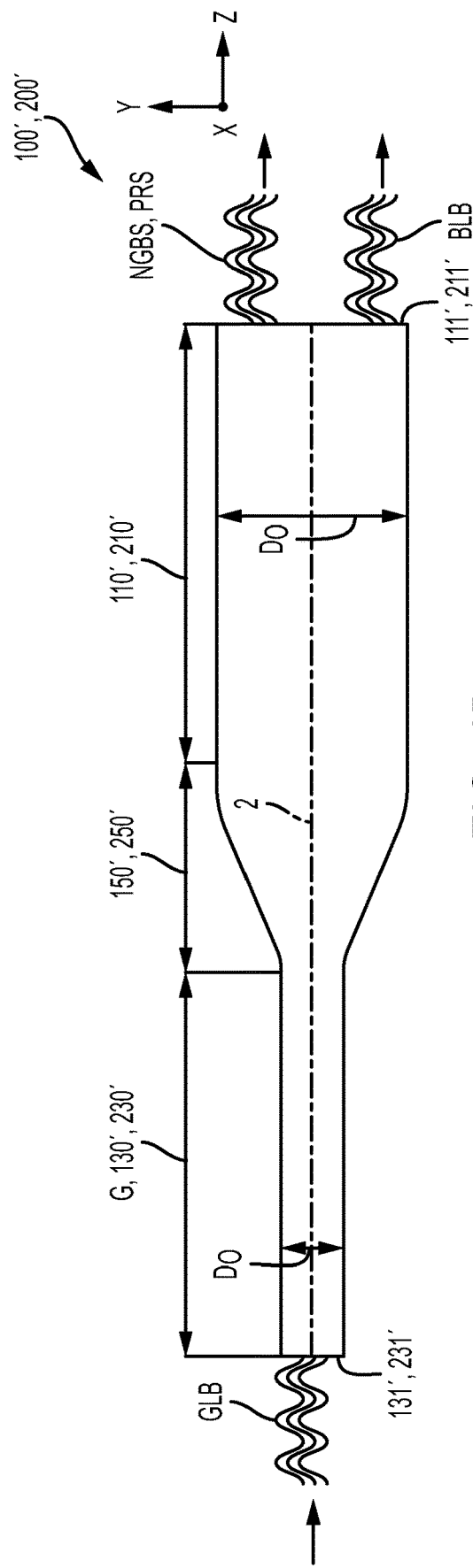
FIG. 4A
FIG. 4B

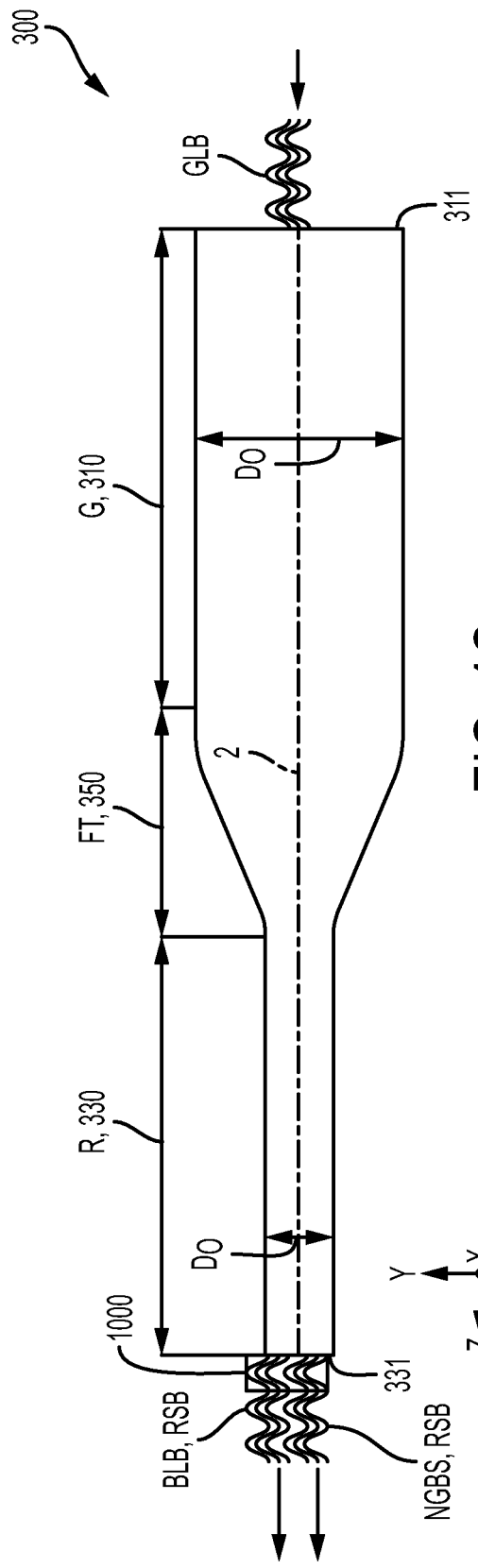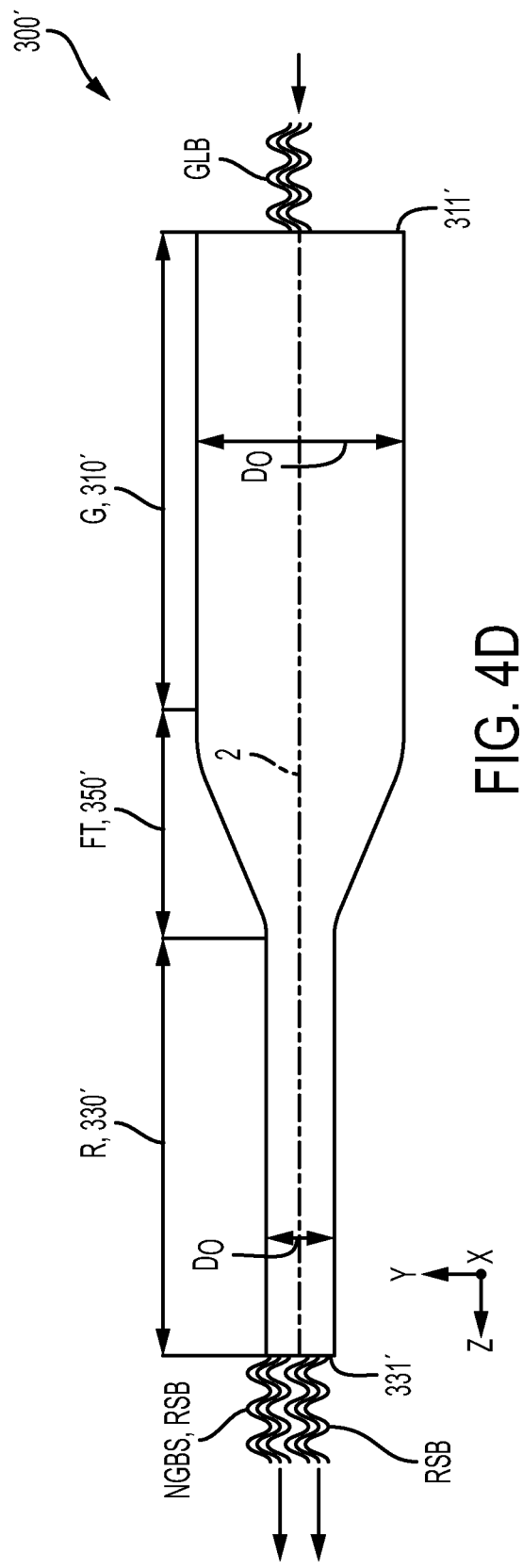

OPTICAL FIBERS AND OPTICAL SYSTEMS COMPRISING THE SAME

This application claims the benefit of priority under 35 U.S.C. § 119 of U.S. Provisional Application Ser. No. 62/579,614, filed on Oct. 31, 2017, the content of which is relied upon and incorporated herein by reference in its entirety.

BACKGROUND

Field

The present specification generally relates to optical fibers and, more specifically, to optical fibers for converting a Gaussian laser beam into a non-axisymmetric quasi non-diffracting laser beams and laser delivery systems comprising the same.

Technical Background

Diffraction is one factor that leads to divergence of laser beams. Other factors include focusing or defocusing caused by the optical systems forming the laser beams or refraction and scattering at interfaces.

Quasi non-diffracting laser beams (e.g., Bessel laser beams) may be desirable for material processing applications. A quasi non-diffracting laser beam does not diffract (spread out) like a Gaussian beam as it propagates along a beam axis. When a quasi non-diffracting laser like a Bessel laser beam is focused, the depth of focus can be more than ten times greater than for a conventional Gaussian laser beam. For example, a Gaussian laser beam with a 1.06 micrometers (μm) wavelength can be focused to about a 1 μm diameter focal spot and has a depth of focus of about 1 μm. In contrast, a quasi non-diffracting laser beam such as a Bessel laser beam having the same wavelength (1.06 μm) can achieve the same focal spot diameter (1 μm) and have a depth of focus of more than 10 μm, for example more than 50 μm (i.e., at least 10× larger, r than that achieved by a typical Gaussian beam). Such an increase in the depth of focus is desirable for laser characterization techniques, laser processing techniques, etc.

Conventional laser systems generate a Gaussian laser beam, which unlike a Bessel laser beam, diffracts while propagating along a beam axis. A Bessel laser beam may be generated or converted from a Gaussian laser beam using free-space optics systems such as an annular aperture, an axicon prism, or a combination thereof. However, free-space optics systems are bulky and have low alignment tolerances and high cost.

Accordingly, a need exists for alternative apparatuses for converting a Gaussian laser beam into a quasi non-diffracting laser beam, for example a Bessel laser beam.

SUMMARY

According to one embodiment A method for laser processing a transparent workpiece comprises:
  forming a contour line in the transparent workpiece, the contour line comprising defects in the transparent workpiece, wherein forming the contour line comprises:
  directing a pulsed laser beam provided by a beam source through either
    (a) an optical fiber comprising a at least one segment with non-axisymmetric refractive index profile that forms a non-axisymmetric pulsed laser beam
    (b) an optical fiber generating a ring-shaped beam and an end-cap with a with non-axisymmetric refractive index profile coupled to the optical fiber generating a ring-shaped beam, such that the end-cap forms a non-axisymmetric pulsed laser beam;
  wherein the portion of the non-axisymmetric pulsed laser beam directed into the transparent workpiece generates an induced absorption within the transparent workpiece, the induced absorption producing a defect within the transparent workpiece, and the portion of the pulsed laser beam directed into the transparent workpiece comprises:
    a wavelength $\lambda$;
    an effective spot size $w_{o,eff}$; and
    a non-axisymmetric beam cross section that comprises a minimum Rayleigh range $Z_{Rx,min}$ in a cross-sectional x-direction and a minimum Rayleigh range $Z_{Ry,min}$ in a cross-sectional y-direction, wherein the smaller of $Z_{Rx,min}$ and $Z_{Ry,min}$ is greater than $$F_D \frac{\pi w_{0,eff}^2}{\lambda},$$

where $F_D$ is a dimensionless divergence factor comprising a value of 10 or greater.

According to some embodiments, the method further comprises translating the transparent workpiece and the non-axisymmetric pulsed laser beam relative to each other along the contour line, thereby laser forming a plurality of defects along the contour line within the transparent workpiece. According to some embodiments the dimensionless divergence factor $F_D$ comprises a value of from about 50 to about 1500.

According to some embodiments an optical system for for laser processing a transparent workpiece comprises:
  a laser beam source for providing a pulsed laser beam,
  an optical fiber component structured to convert the laser beam provided from the source to a laser beam having a non-axisymmetric cross section, the optical fiber component comprising:
    (i) an optical fiber comprising at least two fiber segments optically coupled to one another, one segment optically coupled to the laser beam source and structured to propagate a substantially Gaussian laser beam, and another fiber segment structured to convert the Gaussian laser beam into a non-Gaussian ring shaped laser beam, and an end-cap adjacent to said another fiber segment, the end cap structured to convert the a non-Gaussian ring shaped beam into a non-axisymmetric laser beam, the end cap having non-axisymmetric refractive index profile, or
    (ii) an optical fiber comprising at least two fiber segments optically coupled to one another, one segment optically coupled to the laser beam source and structured to propagate a substantially Gaussian beam, and another fiber segment structured to convert the Gaussian beam into a non-axisymmetric laser beam, said another fiber segment having non-axisymmetric refractive index profile,
  the non-axisymmetric laser beam having
  a wavelength $\lambda$;
  a maximum beam intensity;

an effective spot size $w_{o,eff}$, which effective spot size is defined as a shortest radial distance in any direction from a beam propagation pathway z at which beam intensity decreases to $1/e^2$ of the maximum beam intensity;

a pulse energy and pulse duration sufficient to exceed a damage threshold of a transparent workpiece to thereby form the contour line in the transparent workpiece which contour line comprises a defect in the transparent work piece;

wherein the non-axisymmetric beam cross section has a minimum Rayleigh range $Z_{Rx,min}$ in the x-direction and a minimum Rayleigh range $Z_{Ry,min}$ in the y-direction wherein the smaller of $Z_{Rx,min}$ and $Z_{Ry,min}$ is greater than $$F_D \frac{\pi w_{0,eff}^2}{\lambda},$$

when $F_D$ is a dimensionless divergence factor having a value of 10 or greater, and wherein the smaller of the minimum Rayleigh ranges in the x and y direction is the distance along the beam pathway at which the optical intensity of the beam decays to one half of the maximum beam intensity.

According to some embodiments the non-axisymmetric laser beam incident on the work piece is a quasi-non-diffracting laser beam. According to some embodiments the optical comprises a focusing component situated to focus the non-axisymmetric laser beam into a laser focal line with a non-axisymmetric cross-section.

According to some embodiments the component comprises (I) an optical fiber comprising:
 (i) a first segment comprising:
  a first core portion having a radius $R_1$ from an axial centerline of the optical fiber, the first core portion comprising a first annular core region centered on the axial centerline of the optical fiber and having an inner radius $R_0$ and a first radial thickness $T_{AC}=R_1-R_0$; and
  a first cladding portion extending around the first core portion, the first cladding portion having a radial thickness $T_{CL}$, the first annular core region having a relative refractive index $\Delta_{AC}\%$ relative to the first cladding portion;
(II) a second segment comprising:
 (ii) a second core portion having a radius $r_1$ from the axial centerline of the optical fiber, wherein at least a portion of the second core portion is optically coupled to the first annular core region and the radius $R_1$ is greater than the radius $r_1$; and
  a second cladding portion extending around the second core portion, the second cladding portion having a radial thickness $t_{cl}$ that is less than the radial thickness $T_{CL}$ of the first cladding portion; and
(II) an end-cap, situated adjacent to and in contact with the first segment of the optical fiber, said end-cap having said non-circularly symmetric refractive index profile.

According to some embodiments the second core portion has a relative refractive index $\Delta_c\%$ relative to the second cladding portion, and $\Delta_{AC}\%$ is substantially equal to $\Delta_c\%$. According to some embodiments. According to some embodiments the end-cap comprises a core region with at least one region R, wherein the first annular core region of the first segment is adjacent and substantially overlaps the-core region of the end-cap, so as to enable light propagated from the first annular core region of the first segment to be coupled into the core region of the end-cap and to propagate through the end-cap in a non-circularly symmetrical manner.

According to some embodiments an optical fiber comprises:

(I) a first segment comprising:
 a first core portion having a radius $R_1$ from an axial centerline of the optical fiber, the first core portion comprising a first core region centered on the axial centerline of the optical fiber and having an inner radius $R_0$ and a first radial thickness $T_{AC}=R_1-R_0$; the first core region having non-circularly symmetric refractive index profile and
 a first cladding portion extending around the first core portion, the first cladding portion having a radial thickness $T_{CL}$, the first a core region having a relative refractive index $\Delta_{AC}\%$ relative to the first cladding portion;
(I) a second segment comprising:
 a second core portion having a radius $r_1$ from the axial centerline of the optical fiber, wherein at least a portion of the second core portion is optically coupled to the first core region and the radius $R_1$ is greater than the radius $r_1$; and
 a second cladding portion extending around the second core portion, the second cladding portion having a radial thickness $t_{cl}$ that is less than the radial thickness $T_{CL}$ of the first cladding portion.

According to some embodiments the second core portion has a relative refractive index $\Delta_c\%$ relative to the second cladding portion, and $\Delta_{AC}\%$ is substantially equal to $\Delta_c\%$.

According to some embodiments, first core segment comprises an air hole, down doped silica, or pure silica. According to some embodiments the first segment has a region R with an index of refraction that is different from the rest of the first region. According to some embodiments first core portion includes at least one region R, first the region R having a relative refractive index with respect to the first cladding portion that is smaller than $\Delta_{AC}\%$. According to some embodiments the first core region is shaped as a partial ring. According to some embodiments the first core portion includes at least one region R, first the region R having a relative refractive index with respect to the first cladding portion that is smaller than $\Delta_{AC}\%$.

According to some embodiments an fiber component comprises:

(I) an optical fiber comprising:
 (a) a first segment comprising:
  a first core portion comprising a first central core region, a first annular core region, and a first low-index core region, wherein the first central core region is disposed within the first annular core region and is spaced apart from the first annular core region by the first low-index core region; and
  a first cladding portion extending around the first core portion, the first central core region having a relative refractive index $\Delta_{CC}\%$ relative to the first cladding portion, the first annular core region having a relative refractive index $\Delta_{AC}\%$ relative to the first cladding portion, and the first low-index core region having a relative refractive index $\Delta_{LIC}\%$ relative to the first cladding portion, wherein $\Delta_{LIC}\%$ is less than $\Delta_{CC}\%$ and $\Delta_{AC}\%$;

(b) a second segment comprising:
  a second core portion comprising a second central core region, a second annular core region, and a second low-index core region, wherein the second central core region is disposed within the second annular core region and is spaced apart from the second annular core region by the second low-index core region, wherein at least the second central core region is optically coupled to the first annular core region; and
  a second cladding portion extending around the second core portion, the second central core region having a relative refractive index $\Delta_{cc}$% relative to the second cladding portion, the second annular core region having a relative refractive index $\Delta_{ac}$% relative to the second cladding portion, and the second low-index core region having a relative refractive index $\Delta_{lic}$% relative to the first cladding portion, wherein $\Delta_{lic}$% is less than $\Delta_{cc}$% and $\Delta_{ac}$%; and
(II) an end-cap, situated adjacent to and in contact with the first segment of the optical fiber, the end-cap having the non-circularly symmetric refractive index profile.

According to some embodiments, the first segment is optically coupled to the second segment with a transition region, the first segment having a first outer diameter $D_0$, the second segment having a second outer diameter $d_0$, wherein the first outer diameter $D_0$ is greater than the second outer diameter $d_0$.

According to some embodiments an optical system comprises:
a laser light source emitting an output beam having a Gaussian profile; and an optical fiber coupled to the output beam of the laser light source, the optical fiber comprising:
a first segment having a first outer diameter $D_0$;
a second segment having a second outer diameter $d_0$, wherein the first outer diameter $D_0$ is greater than the second outer diameter $d_0$ and a ratio of the second outer diameter $d_0$ to the first outer diameter $D_0$ is greater than or equal to 0.2 and less than or equal to 0.9; and a transition region integrally formed with and optically coupling the first segment and the second segment, wherein the first segment comprises a first core portion having a first annular core region optically coupled to a second core portion of the second segment, the optical fiber converting the output beam of the laser light source from the Gaussian profile to a Bessel profile; and
an end-cap with a with non-axisymmetric refractive index profile coupled to the optical fiber, the end-cap modifying the Bessel profile into a non-axisymmetric Bessel profile.

According to some embodiments the optical system comprises
a laser light source emitting an output beam having a Gaussian profile; and
an optical fiber coupled to the output beam of the laser light source, the optical fiber having a non-axisymmetric refractive index profile and further comprising:
  a first segment having a first outer diameter $D_0$;
  a second segment having a second outer diameter $d_0$, wherein the first outer diameter $D_0$ is greater than the second outer diameter $d_0$ and a ratio of the second outer diameter $d_0$ to the first outer diameter $D_0$ is greater than or equal to 0.2 and less than or equal to 0.9; and
  transition region integrally formed with and optically coupling the first segment and the second segment, wherein the first segment comprises a first core portion having a first annular core region optically coupled to a second core portion of the second segment, the optical fiber converting the output beam of the laser light source from the Gaussian profile to a Bessel profile One advantage of the optical fibers described herein is that these fibers can be used to convert conventional Gaussian beam into Bessel beam that is suitable for many applications, such as laser processing, laser cutting, and optical imaging.

A described above, Bessel beams is often generated using optical systems that are bulky and have low alignment tolerances and high cost. One advantage of the optical fibers and the optical systems described herein is that they enable some applications, such as remote laser processing and portable instruments. Replacing bulk optic components with optical fiber will provide more flexible and easily deployable instrumentation. For many applications, a fiber optic system for both laser delivery and beam shaping offers advantages of lower loss and better stability than what is available with conventional systems.

Additional features and advantages of the optical fibers described herein and the optical systems utilizing such fibers will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

FIG. 4A schematically depicts a side view of an optical fiber according to one or more embodiments shown and described herein;

FIG. 4B schematically depicts a side view of another optical fiber according to one or more embodiments shown and described herein;

FIG. 4C schematically depicts a side view of another optical fiber according to one or more embodiments shown and described herein;

FIG. 4D schematically depicts a side view of an another optical fiber according to one or more embodiments shown and described herein;

DETAILED DESCRIPTION

Figure 1A:
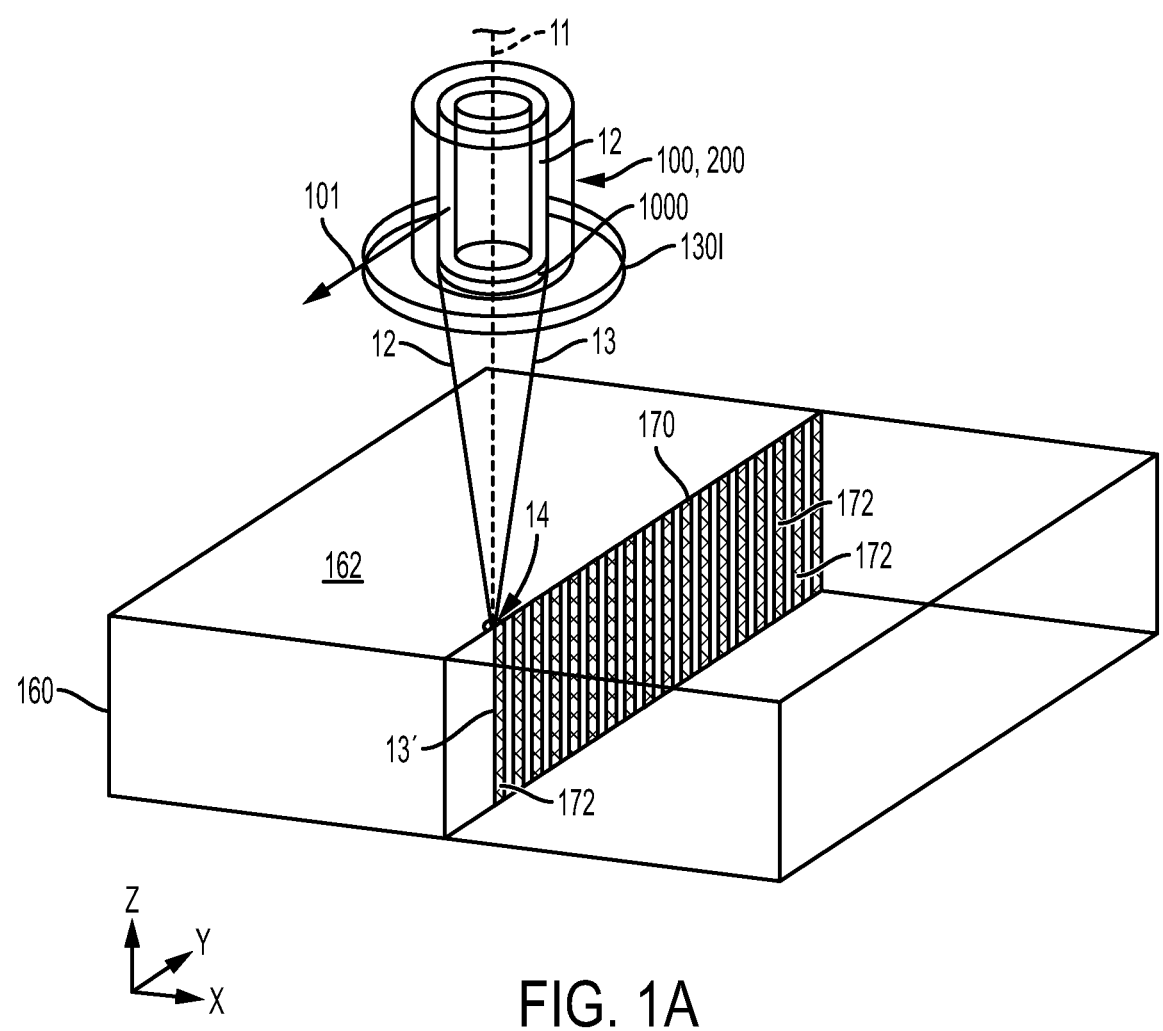
FIG. 1A schematically depicts the formation of a contour line of defects, according to one or more embodiments described herein.

The term "Gaussian laser beam," as used herein, refers to a beam of monochromatic electromagnetic radiation that has a Gaussian intensity profile (Gaussian profile) and whose transverse magnetic and electric field amplitude profiles are given by a Gaussian function. The Gaussian laser beam may be axisymmetric or non-axisymmetric, i.e., the Gaussian laser beam may have an axisymmetric beam cross section or a non-axisymmetric beam cross section that forms a non-axisymmetric beam spot with a long axis and a short axis. The term "Bessel laser beam," as used herein, refers to a beam of monochromatic electromagnetic radiation with an amplitude (profile) described by a Bessel function of the first kind. The Bessel laser beam, or the Gauss-Bessel beam may be axisymmetric or non-axisymmetric, i.e., the Bessel laser or the Gauss-Bessel beam may have an axisymmetric beam cross section or a non-axisymmetric beam cross section that forms a non-axisymmetric beam spot with a long axis and a short axis. The term hybrid Gauss-Bessel laser beam (or "hybrid" Gauss-Bessel laser beam") as used herein, refers to a beam of electromagnetic radiation that has a combination of a Gaussian profile and a Bessel profile.

The term "diffraction-free" beam, as used herein, refers to non-diffracting and quasi non-diffracting beams, such as, for example Bessel beams.

The terms "micrometers", "microns" and "μm" are used interchangeably herein.

The term "transparent workpiece," as used herein, means a workpiece formed from glass, glass-ceramic, sapphire or other material which is transparent, where the term "transparent," as used herein, means that the material has an optical absorption of less than about 20% per mm of material depth, such as less than about 10% per mm of material depth for the specified pulsed laser wavelength, or such as less than about 1% per mm of material depth for the specified pulsed laser wavelength. According to one or more embodiments, the transparent workpiece may have a thickness of from about 50 microns to about 10 mm (such as, for example, from about 100 microns to about 5 mm, or from about 0.5 mm to about 3 mm).

The following terminology will be used in conjunction with the optical fibers described herein.

The term "refractive index profile" or "relative refractive index profile," as used herein, is the relationship between the refractive index or the relative refractive index and the radius R (or r) of the fiber.

The term "relative refractive index," as used herein, is defined as:

$$\Delta(r)\% = 100 \times \frac{(n(r)^2 - n_{REF}^2)}{2n(r)^2},$$

where is n(r) is the refractive index at radius r (or R) of the optical fiber, unless otherwise specified, and r=0 corresponds to the axial centerline of the fiber. The relative refractive index is defined at 1550 nm unless otherwise specified. In the embodiments described herein, the reference index $n_{REF}$ is the refractive index of the outer cladding. As used herein, the relative refractive index is represented by $\Delta$ and its values are given in units of "%," unless otherwise specified. In cases where the refractive index of a region is less than the reference index $n_{REF}$, the relative index percent is negative and is referred to as having a depressed region, a depressed-index, or a low-index. In cases where the refractive index of a region is greater than the reference index $n_{REF}$, the relative index percent is positive and the region can be said to be raised or to have a positive index.

Unless otherwise specified, the characters 'R', 'T', and 'V' are used in reference to the radius, radial thickness and volume (described below), respectively, for the first segment of the optical fiber and the characters 'r', 't' and 'v' are used in reference to the radius, radial thickness and volume, respectively, for the second segment of the optical fiber. The subscript 'CH' refers to the 'channel' in the first segment of the optical fiber. The subscripts 'AC' and 'ac' refer to the 'annular core region' in the first segment and the second segment, respectively, of the optical fiber. The subscripts 'C' and 'c' refer to the 'core portion' in the first segment and the second segment, respectively, of the optical fiber. The subscripts 'CL' and 'cl' refer to the 'cladding portion' in the first segment and the second segment, respectively, of the optical fiber. The subscripts 'OCL' and 'ocl' refer to the 'outer cladding portion' in the first segment and the second segment, respectively, of the optical fiber. The subscripts 'ICL' and 'icl' refer to the 'inner cladding portion' in the first segment and the second segment, respectively, of the optical fiber. The subscripts 'LIT' and 'lit' refer to the 'low-index trench' in the first segment and the second segment, respectively, of the optical fiber. The subscripts 'LIC' and 'lic' refer to the 'low-index core region' in the first segment and the second segment, respectively, of the optical fiber. The subscripts 'CC' and 'cc' refer to the 'central core region' in the first segment and the second segment, respectively, of the optical fiber.

The term "trench," as used herein, refers to a region of the optical fiber that is, in radial cross section, surrounded by regions having relatively higher refractive indexes.

The term "up-dopant," as used herein, refers to a dopant which raises the refractive index of glass relative to pure, undoped silica glass ($SiO_2$). The term "down-dopant," as used herein, is a dopant which has a propensity to lower the refractive index of glass relative to pure, undoped $SiO_2$. An up-dopant may be present in a region of an optical fiber having a negative relative refractive index when accompanied by one or more other dopants which are not up-dopants (e.g., down-dopants). Likewise, one or more other dopants which are not up-dopants may be present in a region of an optical fiber having a positive relative refractive index. A down-dopant may be present in a region of an optical fiber having a positive relative refractive index when accompanied by one or more other dopants which are not down-dopants (e.g., up-dopants). Likewise, one or more other dopants which are not down-dopants may be present in a region of an optical fiber having a negative relative refractive index.

The optical fibers described herein may be utilized to convert a conventional Gaussian laser beam into a non-diffracting beam or a weakly diffracting beam, for example into a Bessel laser beam or a Gauss-Bessel beam. More specifically, a Bessel beam or a Gauss-Bessel beam is one form of a non-diffracting beam or a weakly diffracting beam (also referred to herein quasi-non-diffracting beam), i.e., a beam having low beam divergence as mathematically defined below. A focused non-diffracting beam or a quasi-non-diffracting beam forms a laser focal line. The formation of the laser focal line is described also in a greater detail below. As described herein, the resultant laser focal line may be utilize to process transparent workpieces (e.g., to make damage areas, holes, or to cut such workpieces into different or separate parts, It should be noted that measuring the asymmetry in a quasi-non-diffracting beam cannot be done as simply as measuring the asymmetry of a more traditional Gaussian beam. For instance, quasi non-diffracting beams typically have transverse profiles that are oscillatory, as compared to Gaussian beams, which decay monotonically. The diameter of a Gaussian beam is typically defined by a $1/e^2$ drop in intensity. In contrast, the intensity of a quasi-non-diffracting beam can fluctuate above and below a $1/e^2$ intensity threshold multiple times as a function of radial distance. Thus, defining the size of even a radially symmetric quasi-non-diffracting beam can be challenging.

Moreover, while asymmetric Gaussian beams are known in the art, they are most often discussed as being single spots, where the Gaussian beam may have a larger diameter in the x-direction than in the y-direction, for example. However, for quasi-non-diffracting beams, the cross section of the beam may not have a single monotonically decaying core or spot. In such a situation, the "long" or "short" cross sectional axes of the beam are not readily apparent, which makes defining how to measure the asymmetry of a non-diffracting or a quasi-non-diffracting beam even more difficult.

While not intending to be limited by theory, it is with the above motivation that the following discussion is made to define both a quasi-non-diffracting beam and methods of measuring the asymmetry of a quasi-non-diffracting beam. This discussion is broadly applicable to all forms of laser beams, whether they are simple low-order Gaussian beams with monotonic intensity profiles or more complex quasi non-diffracting beams that project multiple spots or behave in an oscillatory manner. In the case of Gaussian beams, the results will reduce to more simple forms that are familiar from the Gaussian beam literature for defining spots size and Rayleigh range.

Laser beam divergence refers to the rate of enlargement of the beam cross section in the direction of beam propagation (i.e., the Z direction). As used herein, the phrase "beam cross section" refers to the cross section of the laser beam along a plane perpendicular to the direction of propagation of the laser beam, for example, along the X-Y plane. One example of the beam cross section discussed herein is the beam spot of the focused laser beam (e.g., the non-axisymmetric beam spot) formed by the optical fiber (described below) in conjunction with at least one focusing element or focusing surface, on a surface situated in X-Y plane (the beam spot corresponding to the X-Y cross-section of the laser beam focal line). The intensity distribution of the laser beam in a cross-sectional plane may be referred to as a cross-sectional intensity distribution.

Diffraction is one factor that leads to divergence of laser beams. Other factors include focusing or defocusing caused by the optical systems through which laser beams propagate, or refraction and scattering at interfaces. Laser beams 12 provided by an optical fibers 100', 200', 300', 100, 200, 300 described herein and focused to form a laser focal line 13 may have a small, non-axisymmetric beam spots 14 (small non-axisymmetric X-Y beam cross-section) with low divergence and weak diffraction. (See, for example FIGS. 1A, 1B, and 2). The divergence of a laser beam 12 is characterized by the Rayleigh range $Z_R$, which is related to the variance $\sigma^2$ of the intensity distribution and beam propagation factor $M^2$ of the laser beam 12. In the discussion that follows, formulas will be presented using a Cartesian coordinate system. Corresponding expressions for other coordinate systems are obtainable using mathematical techniques known to those of skill in the art. Additional information on beam divergence can be found in the articles entitled "New Developments in Laser Resonators" by A. E. Siegman in SPIE Symposium Series Vol. 1224, p. 2 (1990) and "$M^2$ factor of Bessel-Gauss beams" by R. Borghi and M. Santarsiero in Optics Letters, Vol. 22(5), 262 (1997), the disclosures of which are incorporated herein by reference in their entirety. Additional information can also be found in the international standards ISO 11146-1:2005(E) entitled "Lasers and laser-related equipment—Test methods for laser beam widths, divergence angles and beam propagation ratios—Part 1: Stigmatic and simple astigmatic beams", ISO 11146-2:2005(E) entitled "Lasers and laser-related equipment—Test methods for laser beam widths, divergence angles and beam propagation ratios—Part 2: General astigmatic beams", and ISO 11146-3:2004(E) entitled "Lasers and laser-related equipment—Test methods for laser beam widths, divergence angles and beam propagation ratios—Part 3: Intrinsic and geometrical laser beam classification, propagation and details of test methods", the disclosures of which are incorporated herein by reference in their entirety.

The spatial coordinates of the centroid of the intensity profile of the laser beam 12 having a time-averaged intensity profile I(x, y, z) are given by the following expressions:

$$\bar{x}(z) = \frac{\int_{-\infty}^{\infty}\int_{-\infty}^{\infty} xI(x, y, z)dxdy}{\int_{-\infty}^{\infty}\int_{-\infty}^{\infty} I(x, y, z)dxdy} \quad (1)$$

$$\bar{y}(z) = \frac{\int_{-\infty}^{\infty}\int_{-\infty}^{\infty} y I(x, y, z) dx dy}{\int_{-\infty}^{\infty}\int_{-\infty}^{\infty} I(x, y, z) dx dy} \quad (2)$$

These are also known as the first moments of the Wigner distribution and are described in Section 3.5 of ISO 11146-2:2005(E). Their measurement is described in Section 7 of ISO 11146-2:2005(E).

Variance is a measure of the width, in the cross-sectional (X-Y) plane, of the intensity distribution of the laser beam 12 as a function of position z in the direction of beam propagation.

For an arbitrary laser beam, variance in the X-direction may differ from variance in the Y-direction. We let $\sigma_x^2(z)$ and $\sigma_y^2(z)$ represent the variances in the X-direction and Y-direction, respectively. Of particular interest are the variances in the near field and far field limits. We let $\sigma_{0x}^2(z)$ and $\sigma_{0y}^2(z)$ represent variances in the X-direction and Y-direction, respectively, in the near field limit, and we let $\sigma_{\infty x}^2(z)$ and $\sigma_{\infty y}^2(z)$ represent variances in the X-direction and Y-direction, respectively, in the far field limit. For a laser beam having a time-averaged intensity profile $I(x, y, z)$ with Fourier transform $\tilde{I}(v_x, v_y)$ (where $v_x$ and $v_y$ are spatial frequencies in the X-direction and Y-direction, respectively), the near field and far field variances in the x-direction and y-direction are given by the following expressions:

$$\sigma_{0x}^2(z) = \frac{\int_{-\infty}^{\infty}\int_{-\infty}^{\infty} x^2 I(x, y, z) dx dy}{\int_{-\infty}^{\infty}\int_{-\infty}^{\infty} I(x, y, z) dx dy} \quad (3)$$

$$\sigma_{0y}^2(z) = \frac{\int_{-\infty}^{\infty}\int_{-\infty}^{\infty} y^2 I(x, y, z) dx dy}{\int_{-\infty}^{\infty}\int_{-\infty}^{\infty} I(x, y, z) dx dy} \quad (4)$$

$$\sigma_{\infty x}^2 = \frac{\int_{-\infty}^{\infty}\int_{-\infty}^{\infty} v_x^2 \tilde{I}(v_x, v_y) dv_x dv_y}{\int_{-\infty}^{\infty}\int_{-\infty}^{\infty} \tilde{I}(v_x, v_y) dv_x dv_y} \quad (5)$$

$$\sigma_{\infty y}^2 = \frac{\int_{-\infty}^{\infty}\int_{-\infty}^{\infty} v_y^2 \tilde{I}(v_x, v_y) dv_x dv_y}{\int_{-\infty}^{\infty}\int_{-\infty}^{\infty} \tilde{I}(v_x, v_y) dv_x dv_y} \quad (6)$$

The variance quantities $\sigma_{0x}^2(z)$, $\sigma_{0y}^2(z)$, $\sigma_{\infty x}^2$, and $\sigma_{\infty y}^2$ are also known as the diagonal elements of the Wigner distribution (see ISO 11146-2:2005(E)). These variances can be quantified for an experimental laser beam using the measurement techniques described in Section 7 of ISO 11146-2:2005(E). In brief, the measurement uses a linear unsaturated pixelated detector to measure $I(x, y)$ over a finite spatial region that approximates the infinite integration area of the integral equations which define the variances and the centroid coordinates. The appropriate extent of the measurement area, background subtraction and the detector pixel resolution are determined by the convergence of an iterative measurement procedure described in Section 7 of ISO 11146-2:2005(E). The numerical values of the expressions given by equations 1-6 are calculated numerically from the array of intensity values as measured by the pixelated detector.

Through the Fourier transform relationship between the transverse amplitude profile $\tilde{u}(x, y, z)$ for an arbitrary optical beam (where $I(x, y, z) \equiv |\tilde{u}(x, y, z)|^2$) and the spatial-frequency distribution $\tilde{P}(v_x, v_y, z)$ for an arbitrary optical beam (where $\tilde{I}(v_x, v_y) \equiv |\tilde{P}(v_x, v_y, z)|^2$), it can be shown that:

$$\sigma_x^2(z) = \sigma_{0x}^2(z_{0x}) + \lambda^2 \sigma_{\infty x}^2 (z - z_{0x})^2 \quad (7)$$

$$\sigma_y^2(z) = \sigma_{0y}^2(z_{0y}) + \lambda^2 \sigma_{\infty y}^2 (z - z_{0y})^2 \quad (8)$$

In equations (7) and (8), $\sigma_{0x}^2(z_{0x})$ and $\sigma_{0y}^2(z_{0y})$ are minimum values of $\sigma_{0x}^2(z)$ and $\sigma_{0y}^2(z)$, which occur at waist positions $z_{0x}$ and $z_{0y}$ in the x-direction and y-direction, respectively, and $\lambda$ is the wavelength of the beam. Equations (7) and (8) indicate that $\sigma_x^2(z)$ and $\sigma_y^2(z)$ increase quadratically with z in either direction from the minimum values associated with the waist position of the beam. In Gaussian beam that is rotationally symmetric around the beam propagation axis Z, $\sigma_{0x}^2(z) = \sigma_{0y}^2(z)$, and the waist position $z_{0x} = z_{0y}$.

Equations (7) and (8) can be rewritten in terms of a beam propagation factor $M^2$, where separate beam propagations factors $M_x^2$ and $M_y^2$ for the x-direction and the y-direction are defined as:

$$M_x^2 = 4\pi\sigma_{0x}\sigma_{\infty x} \quad (9)$$

$$M_y^2 = 4\pi\sigma_{0y}\sigma_{\infty y} \quad (10)$$

Rearrangement of Equations (9) and (10) and substitution into Equations (7) and (8) yields:

$$\sigma_x^2(z) = \sigma_{0x}^2(z_{0x}) + \frac{\lambda^2 M_x^4}{(4\pi\sigma_{0x})^2}(z - z_{0x})^2 \quad (11)$$

$$\sigma_y^2(z) = \sigma_{0y}^2(z_{0y}) + \frac{\lambda^2 M_y^4}{(4\pi\sigma_{0y})^2}(z - z_{0y})^2 \quad (12)$$

which can be rewritten as:

$$\sigma_x^2(z) = \sigma_{0x}^2(z_{0x})\left[1 + \frac{(z - z_{0x})^2}{Z_{Rx}^2}\right] \quad (13)$$

$$\sigma_y^2(z) = \sigma_{0y}^2(z_{0y})\left[1 + \frac{(z - z_{0y})^2}{Z_{Ry}^2}\right] \quad (14)$$

where the Rayleigh ranges $Z_{Rx}$ and $Z_{Ry}$ in the x-direction and y-direction, respectively, are given by:

$$Z_{Rx} = \frac{4\pi\sigma_{0x}^2}{M_x^2 \lambda} \quad (15)$$

$$Z_{Ry} = \frac{4\pi\sigma_{0y}^2}{M_y^2 \lambda} \quad (16)$$

If the laser beam is rotationally symmetric around the beam propagation axis the Rayleigh ranges are equal—i.e., $Z_{Rx} = Z_{Ry}$. If the laser beam is not rotationally symmetric around the beam propagation axis, then the Rayleigh ranges $Z_{Rx}$ and $Z_{Ry}$ are not equal, i.e., $Z_{Rx} \neq Z_{Ry}$.

The Rayleigh range corresponds to the distance (relative to the position of the beam waist as defined in Section 3.12 of ISO 11146-1:2005(E)) over which the variance of the laser beam doubles (relative to the variance at the position of the beam waist) and is a measure of the divergence of the cross sectional area of the laser beam. The Rayleigh range can also be observed as the distance along the beam axis at which the optical intensity decays to one half of its value observed at the beam waist location (location of maximum intensity). Laser beams with large Rayleigh ranges have low divergence and expand more slowly with distance in the direction of propagation than laser beams with small Rayleigh ranges.

The formulas above can be applied to any laser beam (not just Gaussian beams) by using the intensity profile I(x, y, z) that describes the laser beam. In the case of the TEM$_{00}$ mode of a Gaussian beam, the intensity profile is given by:

$$I(x, y) = \frac{\sqrt{\pi}}{2} w_o e^{\frac{-2(x^2+y^2)}{w_o^2}} \quad (17)$$

where $w_o$ is the radius (defined as the radius at which beam intensity decreases to $1/e^2$ of the peak beam intensity of the beam at a beam waist position $z_0$. From Equation (17) and the above formulas, we obtain the following results for a TEM$_{00}$ Gaussian beam:

$$\sigma_{0x}^2 = \sigma_{0y}^2 = \frac{w_o^2}{4} \quad (18)$$

$$\sigma_{\infty x}^2 = \sigma_{\infty y}^2 = \frac{1}{4\pi^2 w_o^2} \quad (19)$$

$$M_x^2 = 4\pi \sigma_{0x} \sigma_{\infty x} = 1 \quad (20)$$

$$M_y^2 = 4\pi \sigma_{0y} \sigma_{\infty y} = 1 \quad (21)$$

$$Z_{Rx} = \frac{4\pi \sigma_{0x}^2}{M_x^2 \lambda} = \frac{\pi w_0^2}{\lambda} \quad (22)$$

$$Z_{Ry} = \frac{4\pi \sigma_{0y}^2}{M_y^2 \lambda} = \frac{\pi w_0^2}{\lambda} \quad (23)$$

$$w^2(z) = w_0^2 + \frac{\lambda^2}{(\pi w_0)^2}(z-z_0)^2 = w_0^2 \left[1 + \frac{(z-z_0)^2}{Z_R^2}\right] \quad (24)$$

As stated above, if the laser beam is rotationally symmetric around the beam propagation axis the Rayleigh range $Z_R = Z_{Rx} = Z_{Ry}$. Also, it is further noted that for typical rotationally symmetric Gaussian beams, $M^2 = M_x^2 = M_y^2 = 1$.

Beam cross section is characterized by shape and dimensions. As stated previously, it may be desired to produce a beam spot that is a non-axisymmetric beam spot 14. Example non-axisymmetric cross sections include elliptical beam cross sections. The dimensions of the beam cross section are characterized by a spot size of the beam. For example, for a Gaussian beam, spot size is frequently defined as the radial extent at which the intensity of the beam decreases to $1/e^2$ of its maximum value, denoted in Equation (17) as $w_0$. The maximum intensity of a Gaussian beam occurs at the center (x=0 and y=0 (Cartesian) or r=0 (cylindrical)) of the intensity distribution and radial extent used to determine spot size is measured relative to the center.

Beams with axisymmetric (i.e. rotationally symmetric around the beam propagation axis Z) cross sections can be characterized by a single dimension or spot size that is measured at the beam waist location as specified in Section 3.12 of ISO 11146-1:2005(E). For a Gaussian beam, Equation (17) shows that spot size is equal to $w_o$, which from Equation (18) corresponds to $2\sigma_{0x}$ or $2\sigma_{0y}$. For an axisymmetric (circularly symmetric) Gaussian beams $\sigma_{0x} = \sigma_{0y}$.

Spot size can be similarly defined for non-axisymmetric beam cross sections where, unlike an axisymmetric beam, $\sigma_{0x} \neq \sigma_{0y}$. As a result, it is necessary to characterize the cross-sectional dimensions of a non-axisymmetric beam with two spot size parameters: $w_{ox}$ and $w_{oy}$ in the x-direction and y-direction, respectively, where $$w_{ox} = 2\sigma_{0x} \quad (25)$$

$$w_{oy} = 2\sigma_{0y} \quad (26)$$

The lack of axial (i.e. arbitrary rotation angle) symmetry for a non-axisymmetric beam means that the results of a calculation of values of $\sigma_{0x}$ and $\sigma_{0y}$ will depend on the choice of orientation of the x-axis and y-axis. For example, in some embodiments, the x-axis may be the long axis 16 of the non-axisymmetric beam spot 14 and the y-axis may be the short axis 15. In other embodiments, the x-axis may be the short axis 15 and the y-axis may be the long axis 16. ISO 11146-1:2005(E) refers to these reference axes as the principal axes of the power density distribution (Section 3.3-3.5) and in the following discussion we will assume that the x and y axes are aligned with these principal axes. Further, an angle φ about which the x-axis and y-axis may be rotated in the cross-sectional plane (e.g., an angle of the x-axis and y-axis relative to reference positions for the x-axis and y-axis, respectively) may be used to define minimum ($w_{o,min}$) and maximum values ($w_{o,max}$) of the spot size parameters for a non-axisymmetric beam:

$$w_{o,min} = 2\sigma_{0,min} \quad (27)$$

$$w_{o,max} = 2\sigma_{0,max} \quad (28)$$

where $2\sigma_{0,min} = 2\sigma_{0x}(\phi_{min,x}) = 2\sigma_{0y}(\phi_{min,y})$ and $2\sigma_{0,max} = 2\sigma_{0x}(\phi_{max,x}) = 2\sigma_{0y}(\phi_{max,y})$ The magnitude of the axial asymmetry of the beam cross section can be quantified by the aspect ratio, where the aspect ratio is defined as the ratio of $w_{o,max}$ to $w_{o,min}$. An axisymmetric beam cross section has an aspect ratio of 1.0, while elliptical and other non-axisymmetric beam cross sections have aspect ratios greater than 1.0, for example, greater than 1.1, greater than 1.2, greater than 1.3, greater than 1.4, greater than 1.5, greater than 1.6, greater than 1.7, greater than 1.8, greater than 1.9, greater than 2.0, or the like.

Aspect ratio $$\frac{w_{o,max}}{w_{o,min}}$$

of the beam cross section of the pulsed laser beam 12 (e.g., aspect ratios of the non-axisymmetric beam spot 14 produced by the optical fibers 100, 200, 300, 100', 200', 300' described herein (either by the optical fiber(s) alone, or by the optical fiber(s) in conjunction with other optical components) may be greater than 1.1, greater than 1.3, greater than 1.5, greater than 2.0, greater than 2.5, greater than 3.0, greater than 3.5, greater than 4.0, greater than 5.0, greater than 7.5, greater than 10.0, in the range from 1.1 to 20.0, in the range from 1.2 to 15.0, in the range from 1.3 to 10.0, in the range from 1.3 to 7.5, in the range from 1.3 to 5.0, in the range from 1.5 to 7.5, in the range from 1.5 to 5.0, in the range from 1.5 to 3.0, in the range from 1.75 to 5.0, in the range from 2.0 to 4.0, or the like. To achieve low divergence of the laser beam, it is desirable to control or optimize the intensity distribution of the laser beam produced by the optical fiber 100, 200, 300, 100', 200', 300' so as to reduce diffraction. The laser beams produced by the optical fibers 100, 200, 300, 100', 200', 300' described herein be non-diffracting or weakly diffracting and include Bessel beams, Gauss-Bessel beams forming the focal line(s) 13', and may be focused to small spot sizes. Such spot sizes of the beam spots 14 are, for example, in the range of microns, for example with a cross-sectional distance of the focused laser beam (i.e., the spot width) being about 0.5-10 microns, 0.5-5 microns, 0.5-3 microns, 1-5 microns or about 1-10 microns).

As noted above, laser beam divergence can be characterized by the Rayleigh range. Low divergence correlates with large values of the Rayleigh range and weak diffraction of the laser beam.

For symmetric beams, Rayleigh range is the same in the X-direction and Y-direction and is expressed, for a beam with a Gaussian intensity distribution, by Equation (22) or Equation (23). For axisymmetric beams, the Rayleigh ranges $Z_{Rx}$ and $Z_{Ry}$ are equal. For non-axisymmetric beams, the Rayleigh ranges $Z_{Rx}$ and $Z_{Ry}$ are unequal. Equations (15) and (16) indicate that $Z_{Rx}$ and $Z_{Ry}$ depend on $\sigma_{0x}$ and $\sigma_{0y}$, respectively, and above we noted that the values of $\sigma_{0x}$ and $\sigma_{0y}$ depend on the orientation of the X-axis and Y-axis. For non-axisymmetric beams the values of $Z_{Rx}$ and $Z_{Ry}$ will accordingly vary, and each will have a minimum value and a maximum value that correspond to the principal axes, with the minimum value of $Z_{Rx}$ being denoted as $Z_{Rx,min}$ and the minimum value of of $Z_{Ry}$ being denoted $Z_{Ry,min}$. The formulas that characterize the Rayleigh ranges of Gaussian beam (Equation (22) or Equation (23)), for an arbitrary beam profile $Z_{Rx,min}$ and $Z_{Ry,min}$ can be shown to be given by $$Z_{Rx,min} = \frac{4\pi\sigma_{0,min}^2}{M_x^2 \lambda} \quad (29)$$

and $$Z_{Ry,min} = \frac{4\pi\sigma_{0,min}^2}{M_y^2 \lambda} \quad (30)$$

It is noted that for an axially symmetric Gaussian beams $Z_{R,min} = Z_{Rx,min} = Z_{Ry,min}$.

Since divergence of the laser beam occurs over a shorter distance in the direction having the smallest Rayleigh range, the intensity distribution of the laser is preferably controlled so that the minimum values of $Z_{Rx}$ and/or $Z_{Ry}$ are as large as possible. Since the minimum value $Z_{Rx,min}$ of $Z_{Rx}$ and the minimum value $Z_{Ry,min}$ Of $Z_{Ry}$ differ for a non-axisymmetric beam, according to the exemplary embodiments described herein a laser beam with an intensity distribution may be produced with the smaller of $Z_{Rx,min}$ and $Z_{Ry,min}$ as large as possible. In other exemplary embodiments the laser beam may have smaller of $Z_{Ry,min}$ and $Z_{Rx,min}$ as large as possible.

In different embodiments, the smaller of $Z_{Rx,min}$ and $Z_{Ry,min}$ is greater than or equal to 50 µm, greater than or equal to 100 µm, greater than or equal to 200 µm, greater than or equal to 300 µm, greater than or equal to 500 µm, greater than or equal to 1 mm, greater than or equal to 2 mm, greater than or equal to 3 mm, greater than or equal to 5 mm, in the range from 50 µm to 20 mm, in the range from 50 µm to 10 mm, in the range from 100 µm to 5 mm, in the range from 200 µm to 4 mm, in the range from 300 µm to 2 mm, or the like.

According to the embodiments described herein, the non-axisymmetric laser beam 12 forms a non-axisymmetric spot on a workpiece 160 (e.g., glass, glass-ceramic, sapphire, etc.) and creates damage regions (defects 172) within the workpiece 160. (See FIG. 1A, for example). The values and ranges for the smaller of $Z_{Rx,min}$ and $Z_{Ry,min}$ described herein are achievable for different wavelengths to which the workpiece is transparent through adjustment of the spot size parameter $w_{o,min}$ defined in Equation (27). In different embodiments, the spot size parameter $w_{o,min}$ is greater than or equal to 0.25 Gm, greater than or equal to 0.50 µm, greater than or equal to 0.75 µm, greater than or equal to 1.0 µm, greater than or equal to 2.0 jam, greater than or equal to 3.0 µm, greater than or equal to 5.0 µm, in the range from 0.25 µm to 10 µm, in the range from 0.25 µm to 5.0 µm, in the range from 0.25 µm to 2.5 µm, in the range from 0.50 µm to 10 µm, in the range from 0.50 µm to 5.0 µm, in the range from 0.50 µm to 2.5 µm, in the range from 0.75 µm to 10 µm, in the range from 0.75 µm to 5.0 µm, in the range from 0.75 µm to 2.5 µm, or the like.

The Rayleigh range of the laser beam used to form damage regions may be greater than the Rayleigh range of a Gaussian beam having the same wavelength. Accordingly, the ratio of the smaller of $Z_{Rx,min}$ and $Z_{Ry,min}$ to the Rayleigh range $Z_R$ of a Gaussian beam (as specified in either of Equations (22) or (23)), at a common wavelength λ, may be greater than or equal to 2, greater than or equal to 5, greater than or equal to 10, greater than or equal to 25, greater than or equal to 50, greater than or equal to 100, greater than or equal to 250, greater than or equal to 500, greater than or equal to 1000, in the range from 2 to 1500, in the range from 5 to 1250, in the range from 10 to 1000, in the range from 25 to 1000, in the range from 100 to 1000, or the like.

Non-diffracting or quasi non-diffracting beams generally have complicated intensity profiles, such as those that decrease non-monotonically vs. radius. By analogy to a Gaussian beam, an effective spot size $W_{o,eff}$ can be defined for non-axisymmetric beams as the shortest radial distance, in any direction, from the radial position of the maximum intensity (r=0) at which the intensity decreases to $1/e^2$ of the maximum intensity. A criterion for Rayleigh range based on the effective spot size $w_{o,eff}$ can be specified non-diffracting or quasi non-diffracting beams for forming damage regions, as follows:

$$\text{Smaller of } Z_{Rx,min}, Z_{Ry,min} > F_D \frac{\pi w_{0,eff}^2}{\lambda} \quad (31)$$

where $F_D$ is a dimensionless divergence factor having a value of at least 10, at least 50, at least 100, at least 250, at least 500, at least 1000, in the range from 10 to 2000, in the range from 50 to 1500, in the range from 100 to 1000. By comparing Equation (31) to Equation (22) or (23), one can see that for a non-diffracting or quasi non-diffracting beam the distance, Smaller of $Z_{Rx,min}$, $Z_{Ry,min}$ in Equation (31), over which the effective beam size doubles, is $F_D$ times the distance expected if a typical Gaussian beam profile were used.

The dimensionless divergence factor $F_D$ provides a criterion for determining whether or not a laser beam is quasi-non-diffracting. As used herein, a laser beam is considered quasi-non-diffracting if the characteristics of the laser beam satisfy Equation (31) with a value of $F_D \geq 10$. As the value of $F_D$ increases, the laser beam approaches a more nearly perfectly non-diffracting state. According to some embodiments $F_D \geq 10$, for example $F_D \geq 20$, $F_D \geq 50$, $F_D \geq 100$, $F_D \geq 200$, $F_D \geq 300$, $F_D \geq 400$, $F_D \geq 500$ or $F_D \geq 1000$. For example, in some embodiments $10000 \geq F_D \geq 10$, or $1500 \geq F_D \geq 50$.

Beams with Gaussian intensity profiles when focused to small enough spot sizes (such as spot sizes in the range of microns, such as about 1-5 microns or about 1-10 microns are highly diffracting and diverge significantly over short propagation distances. To achieve low divergence, it is desirable to control or optimize the intensity distribution of the laser beam to reduce diffraction. Laser beams may be non-diffracting or quasi non-diffracting such as, for example Bessel beams or Gauss-Bessel beams.

Reference will now be made in detail to embodiments of optical fibers and laser delivery systems comprising the same, examples of which are illustrated in the accompanying drawings.

According to one or more embodiments, the present disclosure provides methods for processing workpieces. As used herein, "laser processing" may include forming contour lines in workpieces, separating workpieces, or combinations thereof. Transparent workpieces 160 may comprise glass workpieces formed from glass compositions, such as borosilicate glass, soda-lime glass, aluminosilicate glass, alkali aluminosilicate, alkaline earth aluminosilicate glass, alkaline earth boro-aluminosilicate glass, fused silica, or crystalline materials such as sapphire, silicon, gallium arsenide, or combinations thereof. In some embodiments, the glass may be ion-exchangeable, such that the glass composition can undergo ion-exchange for mechanical strengthening before or after laser processing the transparent workpiece. For example, the transparent workpiece may comprise ion exchanged and ion exchangeable glass, such as Corning Gorilla® Glass available from Corning Incorporated of Corning, N.Y. (e.g., code 2318, code 2319, and code 2320). Further, these ion exchanged glasses may have coefficients of thermal expansion (CTE) of from about 6 ppm/° C. to about 10 ppm/° C. In some embodiments, the glass composition of the transparent workpiece may include greater than about 1.0 mol. % boron and/or compounds containing boron, including, without limitation, $B_2O_3$. In another embodiment, the glass compositions from which the transparent workpieces are formed include less than or equal to about 1.0 mol. % of oxides of boron and/or compounds containing boron. Moreover, the transparent workpiece may comprise other components which are transparent to the wavelength of the laser, for example, crystals such as sapphire or zinc selenide.

Some transparent workpieces may be utilized as display and/or TFT (thin film transistor) substrates. Some examples of such glasses or glass compositions suitable for display or TFT use are EAGLE XG®, CONTEGO, and CORNING LOTUS™ available from Corning Incorporated of Corning, N.Y. The alkaline earth boro-aluminosilicate glass compositions may be formulated to be suitable for use as substrates for electronic applications including, without limitation, substrates for TFTs. The glass compositions used in conjunction with TFTs typically have CTEs similar to that of silicon (such as less than $5 \times 10^{-6}$/K, or even less than $4 \times 10^{-6}$/K, for example, approximately $3 \times 10^{-6}$/K, or about $2.5 \times 10^{-6}$/K to about $3.5 \times 10^{-6}$/K), and have low levels of alkali within the glass. Low levels of alkali (e.g., trace amounts of about 0 wt. % to 2 wt. %, such as less than 1 wt. %, for example, less than 0.5 wt. %) may be used in TFT applications because alkali dopants, under some conditions, leach out of glass and contaminate or "poison" the TFTs, possibly rendering the TFTs inoperable. According to embodiments, the laser cutting processes described herein may be used to separate transparent workpieces in a controlled fashion with negligible debris, minimum defects, and low subsurface damage to the edges, preserving workpiece integrity and strength.

The phrase "contour line," as used herein, denotes a line (e.g., a line, a curve, etc.) formed along a desired line of separation on the surface of a transparent workpiece along which a transparent workpiece will be separated into multiple portions upon exposure to the appropriate processing conditions. The contour line generally consists of one or more defects introduced into the transparent workpiece using various techniques. As used herein, a "defect" may include an area of modified material (relative to the bulk material), void space, scratch, flaw, hole, or other deformities in the transparent workpiece which enables separation by additional processing, such as by infrared laser processing, mechanical stress, or other separation processes. Moreover, each defect may comprise a central defect region and one or more radial arms extending outward from the central defect region along an imaging surface of the transparent workpiece. As used herein the "imaging surface" of the transparent workpiece is the surface of the transparent workpiece at which the pulsed laser beam initially contacts the transparent workpiece. As described in more detail below, the radial length of the one or more radial arms may be controlled by the shape of a beam spot projected onto the transparent workpiece by a pulsed laser beam. As one example, a pulsed laser beam comprising a non-axisymmetric beam spot generally comprising a long axis and a short axis may irradiate the imaging plane of the transparent workpiece to generate defects that comprise a central defect region formed at the intersection of the long axis and the short axis of the non-axisymmetric beam spot and one or more radial arms formed in the direction of the long axis of the non-axisymmetric beam spot.

A transparent workpiece, such as a glass substrate or the like, may be separated into multiple portions by first forming a contour line on the surface of the workpiece and, thereafter, heating, for example, using an infrared laser, the surface of the workpiece on the contour line to create stresses in the workpiece, such as thermal stresses. The stresses ultimately lead to the spontaneous separation of the workpiece along the contour line. Further, when each defect is formed using a pulsed laser beam having a non-axisymmetric beam spot oriented such that the long axis of the beam axis extends along the desired line of separation, crack propagation caused by stressing defects in the transparent workpiece along the contour line may extend in the desired line of separation. Forming defects having radial arms that extend in the direction of the desired line of separation may allow the defects to be spaced apart at larger spacing distances than defects having randomly extending radial arms or no radial arms, without damage to the edges of the separated transparent workpieces where the contour line existed prior to separation. Moreover, forming defects having radial arms that extend in the direction of the desired line of separation allows crack propagation to be generated by less stress, e.g., less energy, such as thermal energy, applied to the workpiece, limiting damage to the edges of the separated transparent workpieces where the contour line existed prior to separation. In contrast, when defects include randomly extending radial arms or no radial arms, cracks may propagate from the separated edge in a direction generally perpendicular to the edge of the separated transparent workpiece (i.e., generally perpendicular to the intended line of separation denoted by the contour line) which weaken the edges of separated transparent workpiece.

Figure 1B:
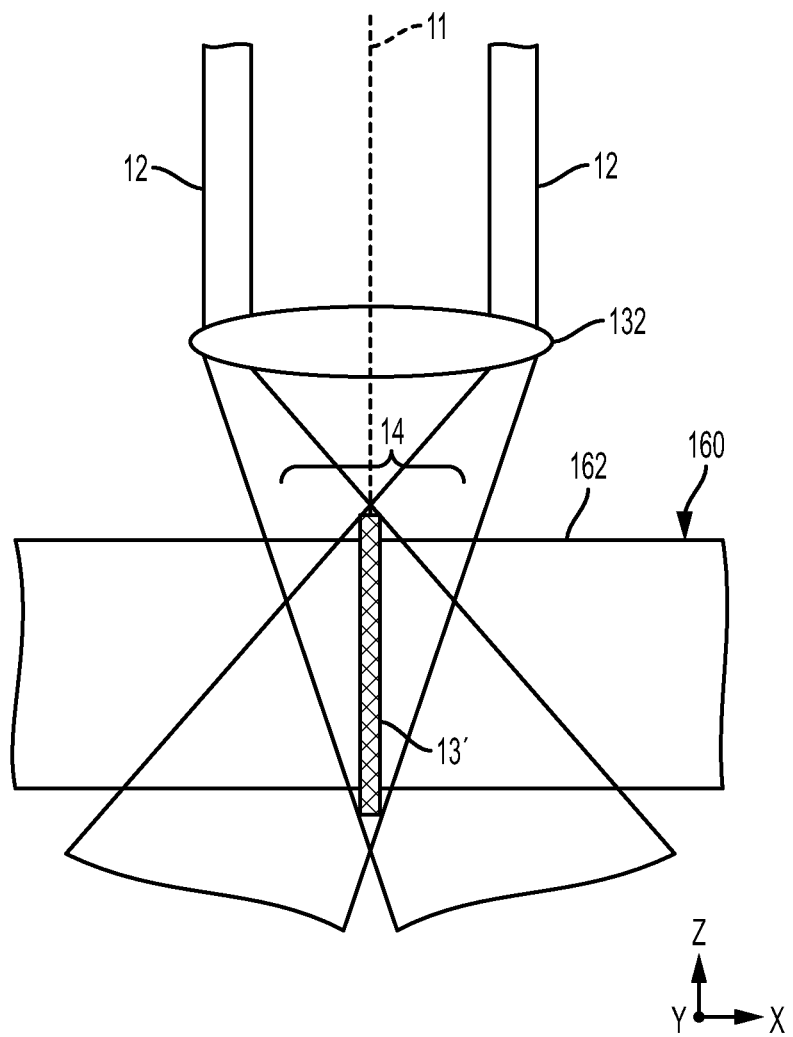
FIG. 1B schematically depicts an example pulsed laser beam focal line during processing of a transparent workpiece, according to one or more embodiments described herein.

Referring now to FIGS. 1A and 1B byway of example, a transparent workpiece 160, such as a glass workpiece or a glass-ceramic workpiece, is schematically depicted undergoing processing according to the methods described herein. FIGS. 1A and 1B depict the formation of a contour line 170 in the transparent workpiece 160, which may be formed by translating a pulsed laser beam 12 relative to the transparent workpiece in a translation direction 101. FIGS. 1A and 1B depict the pulsed laser beam 12 (provided by the optical fiber 100, 200, 300 in conjunction with the end-cap, or by the optical fibers 100', 200', 300', as described below) along a beam direction/pathway 11 and oriented such that the pulsed laser beam 12 may be focused into a focused pulsed laser beam 13 that forms a focal line focal line 13' within the transparent workpiece 160, for example by a lens (e.g., lens component 1301 as described below). Further, the pulsed laser beam focal line 13' is a portion of a quasi non-diffracting beam, as defined in more detail below. FIGS. 1A and 1B depict that the pulsed laser beam 12 forms a non-axisymmetric beam spot 14 projected onto an imaging surface 162 of the transparent workpiece 160. Further, the pulsed laser beam focal line 13' is non-axisymmetric at cross sections of the pulsed laser beam focal line 13' normal to the propagation axis of the pulsed laser beam 12 (e.g., normal to the beam pathway 11). As used herein, axisymmetric refers to a shape that is symmetric, or appears the same, for any arbitrary rotation angle made about a central axis, and "non-axisymmetric" refers to a shape that is not symmetric for any arbitrary rotation angle made about a central axis. The rotation axis (e.g., the central axis) is most often taken as being the propagation axis of the laser beam. As also used herein "beam spot" refers to a cross section of a laser beam (e.g., the pulsed laser beam 12) at a point of first contact with a workpiece (e.g., the transparent workpiece 160).

Figure 2:
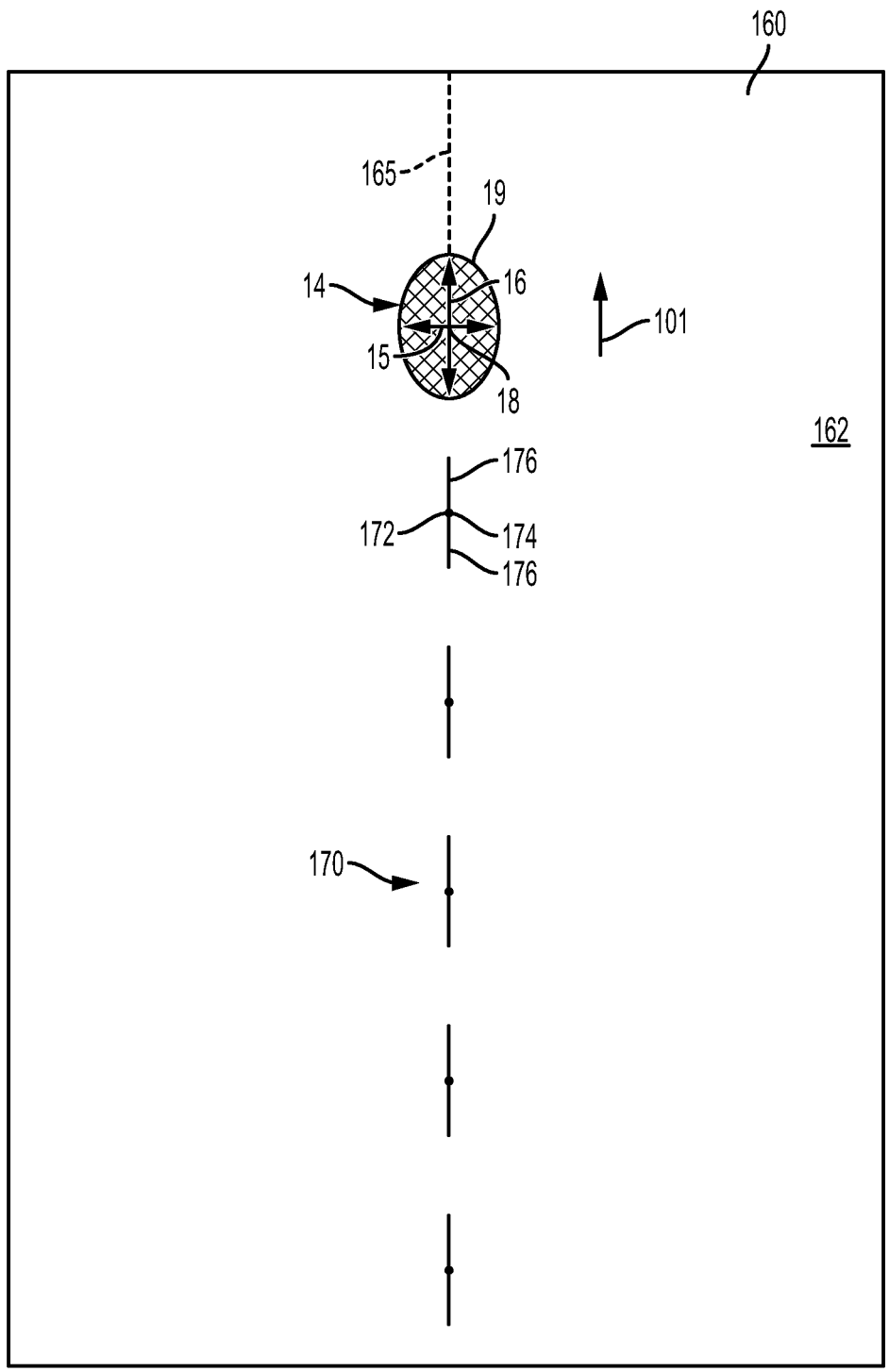
FIG. 2 schematically depicts a non-axisymmetric beam spot traversing a line of desired separation to form a contour line in a transparent workpiece, according to one or more embodiments described herein.
Figure 2:
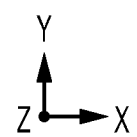

Referring also to FIG. 2, the contour line 170 extends along the desired line of separation 165 and delineates a line of intended separation about which the transparent workpiece 160 may be separated into two or more portions. The contour line 170 comprises a plurality of defects 172 that extend into the surface of the transparent workpiece 160 and establish a path for crack propagation for separation of the transparent workpiece 160 into separate portions along the contour line 170. While the contour line 170 is depicted in FIG. 1A and FIG. 2 as being substantially linear, it should be understood that other configurations are contemplated and possible including, without limitation, curves, patterns, regular geometric shapes, irregular shapes, and the like. Referring again to FIGS. 1A-2, the pulsed laser beam 12 used to form the defects 172 further has an intensity distribution I(X, Y, Z), where Z is the direction of propagation of the pulsed laser beam 12, and X and Y are directions orthogonal to the direction of propagation, as depicted in the figures. The X-direction and Y-direction may also be referred to as cross-sectional directions and the X-Y plane may be referred to as a cross-sectional plane. The intensity distribution of the pulsed laser beam 12 in a cross-sectional plane may be referred to as a cross-sectional intensity distribution.

Referring still to FIG. 2, the non-axisymmetric beam spot 14 comprises a cross-sectional intensity distribution that is non-axisymmetric. For example, the non-axisymmetric beam spot 14 may have a greater intensity and thereby a greater distribution of cumulated energy from the pulsed laser beam 12 in areas along the long axis 16 of the non-axisymmetric beam spot 14 than along the short axis 15 of the non-axisymmetric beam spot 14. That is, when the long axis 16 of the non-axisymmetric beam spot 14 is aligned with the desired line of separation 165, the pulsed laser beam 12 may transfer more energy along the desired line of separation 165 than onto areas adjacent the desired line of separation 165, forming defects 172 comprising longer radial arms 176 extending along the desired line of separation 165 than radial arms 176 extending in directions not along the desired line of separation 165. As used herein, "cumulated energy" refers to all energy transferred onto a particular area of the transparent workpiece 160 by the pulsed laser beam 12 as the pulsed laser beam 12 irradiates the transparent workpiece 160.

As depicted in FIG. 2, in this embodiment, each defect 172 includes a central defect region 174 and one or more radial arms 176 extending outward in a direction substantially perpendicular to the beam propagation direction or pathway 11 (e.g., in the X and/or Y directions as shown in FIGS. 1A, 1B, and 2). In operation, after the defects 172 of the contour line 170 are formed, for example, using the methods and systems described herein, the defects 172 may be further acted upon in a subsequent separating step to induce spontaneous separation of the transparent workpiece 160 along the contour line 170. The subsequent separating step may include using mechanical force, thermal stress induced force, or a spontaneous break occurring due to stress present in the transparent workpiece, depending on the type, thickness, and structure of the transparent workpiece 160. For example, stress may be present in the transparent workpiece 160 which may cause spontaneous separation without further heating or mechanical separation steps.

Referring to FIGS. 1A, 1B, and 2, in the embodiments described herein, a pulsed laser beam 12 (with a non-axisymmetric beam spot 14 projected onto the transparent workpiece 160) may be directed onto the transparent workpiece 160 (e.g., condensed into a high aspect ratio line focus that penetrates through at least a portion of the thickness of the transparent workpiece 160). This forms the pulsed laser beam focal line 13' having non-axisymmetric cross sections correlated with the non-axisymmetric beam spot 14. In particular, the non-axisymmetric beam spot 14 is an example cross section of the pulsed laser beam focal line 13' and the pulsed laser beam focal line 13' remains non-axisymmetric as the pulsed laser beam focal line 13' penetrates at least a portion of the transparent workpiece 160. Further, the pulsed laser beam 12 may be translated relative to the transparent workpiece 160 (e.g., in the translation direction 101) to form the plurality of defects 172 of the contour line 170. Directing the pulsed laser beam 12 into the transparent workpiece 160 causes portions of the transparent workpiece 160 to fracture, for example, depositing enough energy to break chemical bonds in the transparent workpiece 160 at spaced locations along the desired line of separation 165 to form the defects 172. According to one or more embodiments, the pulsed laser beam may be translated across the transparent workpiece 160 by motion of the transparent workpiece 160 (e.g., motion of a translation stage 190 coupled to the transparent workpiece 160), motion of the pulsed laser beam (e.g., motion of the pulsed laser beam focal line 13'), or motion of both the transparent workpiece 160 and the pulsed laser beam focal line 13'. By translating the pulsed laser beam focal line 13' relative to the transparent workpiece 160, the plurality of defects 172 may be formed in the transparent workpiece 160.

As depicted in FIG. 2, the non-axisymmetric beam spot 14 comprises a long axis 16, a short axis 15, an axis intersection 18, which may be positioned at the center of the non-axisymmetric beam spot 14, and a beam spot perimeter 19. According to embodiments, the long axis 16 is defined as the axis of the non-axisymmetric beam spot 14 having the longest distance from center within the non-axisymmetric beam spot 14 and the short axis 15 is defined as the axis of the non-axisymmetric beam spot 14 having the shortest distance from center within the non-axisymmetric beam spot 14. While the non-axisymmetric beam spot 14 is depicted in FIG. 2 as an ellipse, it should be understood that any non-axisymmetric shape is contemplated, such as a non-elliptical shape. Further, the non-axisymmetric beam spot 14 may comprise a collection of multiple beam spots. Moreover, it should be understood that while the non-axisymmetric beam spot 14 is substantially discussed herein, other cross sections of the pulsed laser beam focal line 13' within the transparent workpiece 160 are also non-axisymmetric and also comprise a short axis and a long axis, as described above with respect to the non-axisymmetric beam spot 14.

As examples, the distance from center of the non-axisymmetric beam spot 14 along the long axis may comprise from about 0.25 µm to about 20 am, such as from about 1 µm to about 10 am, from about 2 µm to about 8 am, or from about 3 µm to about 6 µm. Further, the distance from center of the non-axisymmetric beam spot 14 along the short axis may comprises from about 0.01 µm to about 10 µm, from about 0.1 µm to about 10 µm, or from about 0.7 µm to about 3 µm. For example, the distance from center of the non-axisymmetric beam spot 14 along the short axis may be from about 5% to about 95% of the distance from center of the non-axisymmetric beam spot 14 along the long axis, such as from about 10% to about 50%, from about 20% to about 45%, or from about 30% to about 40% of the distance from center of the non-axisymmetric beam spot 14 along the long axis. Methods for determining beam spot size are disclosed hereinbelow.

FIGS. 3A-3F illustrate schematically embodiments of optical assembly 10 for producing a pulsed laser beam 12 that is quasi non-diffracting. More specifically, the embodiments of FIGS. 3A-3F produce a non-axisymmetric (non-circularly symmetric) Gauss-Bessel beam. The optical assembly includes a light source (also referred herein as beam source) 10A, optical fiber 100, 200, 300, 100', 200', 300' and one or more optical components. In these embodiments the optical assemblies produce a non-axisymmetric beam spot 14 at the transparent workpiece 160.

Figure 3A:
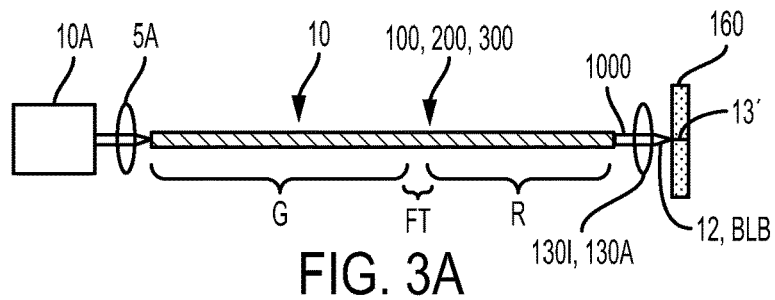
FIG. 3A-3F illustrate different embodiments of optical assemblies 10 that produce non-axisymmetric (non-circularly symmetric) Bessel or Gauss-Bessel beams.

For example, FIG. 3A depicts an optical assembly 10 for pulsed laser processing that creates producing a pulsed laser beam 12 that is quasi-non-diffracting via an optical fiber 100, 200, 300. The optical assembly 10 of FIG. 3A comprises beam source 10A optically coupled to the optical fiber 100, 200, 300, via an optical component, for example a lens 5A. Further, the transparent workpiece 160 may be positioned such that the pulsed laser beam 12 irradiates the transparent workpiece 160, for example, after output by the light beam from the beam source 10A traverses the optical fiber 100, 200, 300 and the end-cap 1000 (the end-cap converts ring shaped beam propagating through the fiber 100, 200, 300 into a non-axisymmetric laser beam (i.e., into a laser beam that does not have circular symmetry) and is focused to produce a focal line 13' that forms a small non-axisymmetric beam cross-section 14 at the transparent workpiece 160. Fiber 100, 200, 300, has at least two fiber segments: a fiber segment G (also referred to as a G-segment herein) that supports propagation of a Gaussian beam, and another segment R (R-segment) that supports propagation of a non-Gaussian beam, for example of a ring-shaped laser beam prior to its conversion into a non-axisymmetric beam by the end-cap 1000.

Figure 3B:
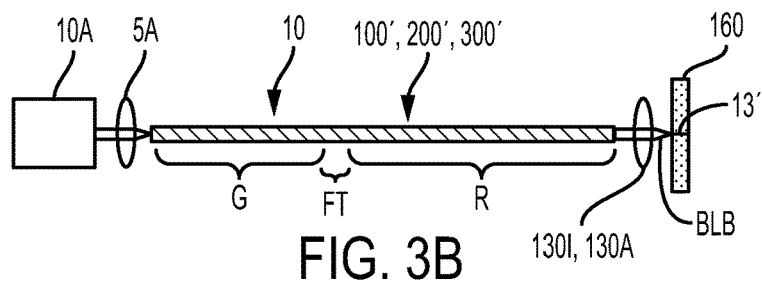

FIG. 3B depicts an optical assembly 10 for pulsed laser processing by producing via an optical fiber 100', 200', 300' a pulsed laser beam 12 that is quasi-non-diffracting beam. The optical assembly 10 of FIG. 3B comprises beam source 10A optically coupled to the optical fiber 100', 200', 300', via an optical component, for example a lens 5A. Further, the transparent workpiece 160 may be positioned such that the pulsed laser beam 12 irradiates the transparent workpiece 160, for example, after output by the light beam from the beam source 10A traverses the optical fiber 100', 200', 300', and is focused to produce a focal line 13' that forms a small non-axisymmetric beam cross-section 14 at the transparent workpiece 160. Fiber 100', 200', 300' has at least two fiber segments: a fiber segment G (G-segment) that supports propagation of a Gaussian beam, and another segment R (R-segment) that supports propagation of a non-axisymmetric non-Gaussian beam, for example of a non-axisymmetric laser beam.

The light source 10A is coupled to the G-segment of the fiber 100, 200, 300, 100', 200', 300', and is converted by the fiber 100, 200, 300, 100', 200', 300' to a non-Gaussian beam. The non-Gaussian laser beam (e.g., "split or broken ring" shaped beam) exiting either the end-cap 1000 situated at the end face of the R--segment of the fiber 100, 200, 300, or the R-segment of the fiber 100', 200', 300' is focused by an optical system comprising one or more optical components 1301 (for example lens 130A shown in FIGS. 3A-3D) to produce a focused non-axisymmetric Bessel beam and to form a non-axisymmetric beam spot 14 on the transparent workpiece 160. Alternatively, as shown in FIG. 3E, according to some embodiments optical component 130B may be directly formed at the output end of the end-cap 1000 or may be attached to the output end of the end-cap 1000. As shown in FIG. 3F, optical component 130C may be directly formed at the output end of the R-segment of the optical fiber 100', 200', 300', or may be attached to the output end of the R-segment of the optical fiber 100', 200', 300'.

As described above and shown in FIGS. 3A and 3B, in some embodiments the light (laser beam) from the light source (beam source 10A) may be coupled into the core of the G-segment of the optical fiber 100, 200, 300, 100', 200', 300') via an optical component, for example a lens 5A. In other embodiments, the light source (beam source 10A) may be butt-coupled (not shown) into the optical fiber 100, 200, 300, 100', 200', 300', to provide the light to the core of the G-segment of the optical fiber 100, 200, 300, 100', 200', 300'. In yet other embodiments, as shown in FIGS. 3C-3F the light from the light source 10A may be coupled into the G-segment of the optical fiber 100, 200, 300, 100', 200', 300' through a fiber coupler 6 connected to another (bridge) fiber 10A'. According to at least some of the embodiments described herein, the Gaussian beam provided by the beam source 100A propagates through the G-segment of the optical fiber 100, 200, 300, 100', 200', 300', and a majority of that that beam (e.g., a portion having greater than 60%, greater than 70%, greater than 80%, greater than 85%, greater than 90% of its intensity, greater than 95% or even greater than 98% of its intensity) is then converted to a non-Gaussian beam by the R-segment of the fiber. According to at least some of the embodiments described herein, the Gaussian beam provided by the beam source 10A propagates through the G-segment of the optical fiber 100, 200, 300, 100', 200', 300', and is converted to a non-Gaussian beam by the R-segment of the fiber.

Figure 3C:
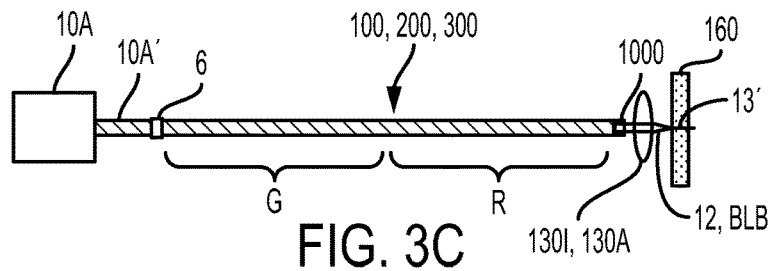
Figure 3D:
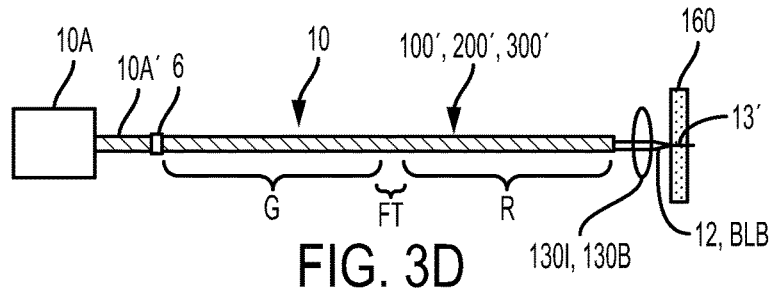
Figure 3E:
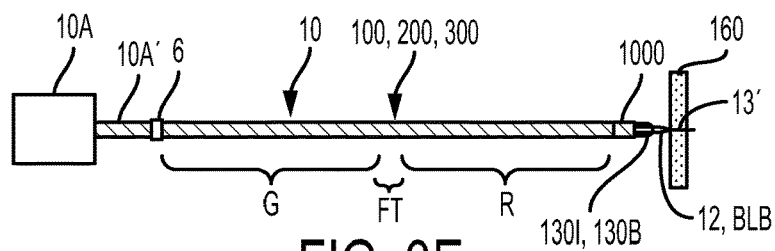
Figure 3F:
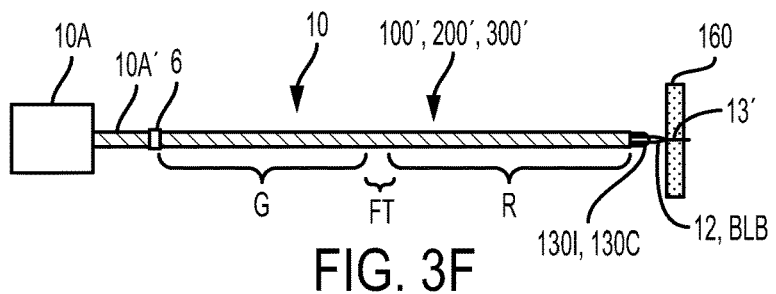

According to some embodiments, as shown for example in FIGS. 3A, 3C and 3E, the optical fiber 100, 200, 300, may convert the Gaussian beam propagating through the fiber core of the G-segment of the optical fiber into an axisymmetric ring shaped beam propagating through the R-segment of the fiber, and fiber end-cap 1000 may shape the ring shaped beam into a non-axisymmetric beam shape, which when focused by will produce a focal line 13' that forms a small non-axisymmetric beam cross-section 14 at the transparent workpiece 160. The fiber end-cap 1000 is described later in the specification. According to other exemplary embodiments the optical fiber 100', 200', 300', may convert the Gaussian beam propagating through the fiber core of the G-segment of the optical fiber directly into a non axisymmetric ring shaped beam propagating through the R-segment of the fiber, by disrupting the cross-sectional symmetry of the R-section of the optical fiber 100', 200', 300', as described below. In such exemplary embodiments (as shown in FIGS. 3B, 3D and 3F) the end-cap is no longer necessary.

For example, FIGS. 4A, 4B, schematically depict a side view of the fiber 100, 200, 100', 200' that includes one segment (G-segment, G) that supports Gaussian beam shape (Gaussian laser beam, GLB) and another segment (R-segment, R) that supports a non Gaussian beam shape NGBS (either axisymmetric (RSB), in which case an end-cap should be utilized therewith, as shown in FIG. 4A), or the non-axisymmetric RSB corresponding to the embodiments of FIG. 4B. The non-axisymmetric non-Gaussian shaped beam NGBS (e.g., laser beam propagating through fibers 100', 200', 300') may have "a broken ring" shape (also referred herein as a split ring shape or a a partial ring shape PRS)—i.e., does not form a circularly symmetric continuous ring shape) in which case the end-cap is no longer necessary.

As shown in in FIG. 4A embodiment, the laser beam of Gaussian beam shape is coupled to the fiber core of the G-section, is converted to a ring shape beam in the fiber taper section FT and then propagates as a ring shaped beam RSB in the R-section of the fiber 100, 200. The beam intensity profile is then further reshaped with a short length of fiber called end-cap 1000 shown in FIG. 4A. The end-cap 1000 does not have a circularly symmetric geometry. The end-cap 1000 breaks the symmetry of the ring-shaped beam, for example by converting the ring-shaped beam into a "a partial" ring shape (for example half a ring, ¾ of a ring, a ring with a blocked section therein, or two separated half rings) beams so that the exiting laser beam can form an elliptical Bessel beam when focused with one or more optical components. The end-cap' length ranges, for example, from several microns to tens of millimeters. The end-cap 1000 can be attached to the segment R of the optical fiber 100, 200, 300 by either a conventional fusion splicing technique or other means. The coupling of light to the G-section of the optical fiber 100, 200 is provided, for example, through a lens 5A and the ring shaped beam from the R-section is focused by a one or more optical components on the transparent workpiece 160 for laser processing, as illustrated for example, in FIGS. 3A, 3C and 3D. Alternatively, If a fiber laser is utilized as the beam source 10A, the laser 10A can be coupled into the G-section of the fiber by direct butt-coupling or by fusion splicing as shown in FIG. 3C. The structure of the end cap 1000 is discussed in more detail further down in specification.

FIG. 4B illustrates an alternative embodiment that does not utilize an end cap 1000. More specifically FIG. 4B schematically depicts a side view of the fiber 100', 200' that includes one segment (G-segment, G) that supports a Gaussian beam shape (Gaussian laser beam, GLB) and another segment (R-segment, R) that supports a non Gaussian beam shape which is non-axisymmetric. The optical fiber, 100', 200' of FIG. 4B embodiment is similar to the fiber of FIG. 4A, but the wave-guiding ring section of the fiber core in the R-segment of the fiber 100', 200' is disrupted, as described below (i.e., it is not continuous), which supports propagation of an non-axisymmetric laser beam NGBS (e.g., a non-Gaussian laser beam, for example a laser beam that has a broken ring" shape, or a "partial" ring shape). This can be achieved, for example, by making a fiber preform for the optical fiber 100, 200 described above, drilling or cutting away a portion of the preform corresponding to the ring part of the core, and (i) either filling the disrupted sections of the ring with a material having an index of refraction similar to that of the cladding (or pure silica) and drawing the R-segment of the optical fiber 100' therefrom to make the ring part of the core of the R-segment non-axisymmetric, or (ii) drawing the drilled fiber preform into an optical fiber that has one or more air holes that make the ring portion of the fiber non-axisymmetric. Alternately, the optical preform for the optical fiber 100, 200, can be cut in half along the axis to make two half-cylinder parts (both having D-shaped cross-sections), inserting a pure silica glass therebetween, overcladding the two cylinder portions separated by the pure silica glass to form a preform assembly, and then drawing the optical fiber 100', 200' therefrom. In another embodiment, the optical preform for the optical fiber 100, 200, can be cut in half along the axis to make two half-cylinder parts (both having D-shaped cross-sections), situating one of the halves of the preform adjacent to the pure silica rod having a D-shaped cross-section within a silica-based glass tube to form a fiber preform assembly that is made of two halves (see FIG. 21F), and drawing the optical fiber 200' therefrom. In another embodiment, the optical preform for the optical fiber 100, 200, can be cut in half along the axis to make two-cylinder parts (both having D-shaped cross-sections) to form final preforms with D-shaped cross-sections, and drawing substantially D-shaped optical fiber 100', 200', from the final preforms.

FIG. 4C schematically depicts a side view of another embodiment of an optical fiber for converting a conventional Gaussian laser beam into a Bessel laser beam. The optical fibers 300 generally comprise one segment coupled to another segment with a transition region. As shown in in FIG. 4C embodiment, the laser beam of Gaussian beam shape is coupled to the fiber core of the G-section, is converted to a ring shape beam in the fiber taper section FT and then propagates as a ring shaped beam RSB in the R-section of the fiber 300. The beam intensity profile is then further reshaped with a short length of fiber called an end-cap 1000, as illustrated in FIG. 4C. The end-cap 1000 does not have a circularly symmetric geometry. The end-cap 1000 breaks the symmetry of the ring-shaped beam, for example by converting the ring-shaped beam into a split or a "partial" ring shape (for example half a ring, ¾ of a ring, a ring with a blocked section therein, or two separated half rings) beams, so that the exiting laser beam can form an non-axisymmetric Bessel beam (e.g. Bessel beam with an elliptical cross-section) when focused with an optical system. The G-section supports propagation of a Gaussian laser beam and the R segment supports propagation of a Bessel laser beam. A Gaussian laser beam propagating through the G segment is converted into a Bessel laser beam as it passes through the transition region and into the R segment of the fiber, and the end-cap 1000 breaks the symmetry of the laser beam, making it non-axisymmetric. The structure and composition of various embodiments of optical fibers that convert a Gaussian laser beam into a Bessel laser beam will be described in more detail herein with specific reference to the appended drawings.

FIG. 4D illustrates an alternative embodiment that does not utilize an end-cap 1000. More specifically FIG. 4D schematically depicts a side view of the fiber 300' that includes one segment (G-segment, G) that supports Gaussian beam shape (Gaussian laser beam, GLB) and another segment (R-segment, R) that supports a non Gaussian beam shape (Bessel beam) which is non-axisymmetric. The optical fiber, 300' of FIG. 4D embodiment is similar to the fiber of FIG. 4C, but the wave-guiding ring section of the fiber core in the R-segment of the fiber 300' is disrupted, as described below (i.e., it is not continuous), which supports propagation of an non-axisymmetric laser beam NGBS (e.g., a non-Gaussian laser beam that, for example a laser beam that has a broken ring" shape, or a "a partial" ring shape).

Referring still to FIGS. 3A-3F, the beam source 10A may comprise any known or yet to be developed beam source 10A configured to output laser beams, for example pulsed laser beams. In operation, the defects 172 of the contour line 170 are produced by interaction of the transparent workpiece 160 with the pulsed laser beam output by the beam source 10A after the light from the laser beam propagated through segments G and R of the optical fiber 100, 200, 300, 100', 200', 300' and was focused by the optical component 131 (e.g., 130A, 130B, or 130C). In some embodiments, the beam source 10A may output a pulsed laser beam comprising a wavelength of for example, 1064 nm, 1030 nm, 532 nm, 530 nm, 355 nm, 343 nm, or 266 nm, or 215 nm. Further, the pulsed laser beam 12 used to form defects 172 in the transparent workpiece 160 may be well suited for materials that are transparent to the selected pulsed laser wavelength.

Suitable laser wavelengths for forming defects 172 are wavelengths at which the combined losses of absorption and scattering by the transparent workpiece 160 are sufficiently low. In embodiments, the combined losses due to absorption and scattering by the transparent workpiece 160 at the wavelength are less than 20%/mm, or less than 15%/mm, or less than 10%/mm, or less than 5%/mm, or less than 1%/mm, where the dimension "/mm" means per millimeter of distance within the transparent workpiece 160 in the direction of propagation of the pulsed laser beam 12 (e.g., the Z direction). Representative wavelengths for many glass workpieces include fundamental and harmonic wavelengths of $Nd^{3+}$ (e.g. $Nd^{3+}$:YAG or $Nd^{3+}$:YVO$_4$ having fundamental wavelength near 1064 nm and higher order harmonic wavelengths near 532 nm, 355 nm, and 266 nm). Other wavelengths in the ultraviolet, visible, and infrared portions of the spectrum that satisfy the combined absorption and scattering loss requirement for a given substrate material can also be used.

In operation, the focused pulsed laser beam 12 may create multi-photon absorption (MPA) in the transparent workpiece 160. MPA is the simultaneous absorption of two or more photons of identical or different frequencies that excites a molecule from one state (usually the ground state) to a higher energy electronic state (i.e., ionization). The energy difference between the involved lower and upper states of the molecule is equal to the sum of the energies of the involved photons. MPA, also called induced absorption, can be a second-order or third-order process (or higher order), for example, that is several orders of magnitude weaker than linear absorption. It differs from linear absorption in that the strength of second-order induced absorption may be proportional to the square of the light intensity, for example, and thus it is a nonlinear optical process.

The perforation step that creates the contour line 170 may utilize the beam source 10A (e.g., an ultra-short pulse laser) in combination with the fiber and optics depicted and described below with respect to FIGS. 3A-3F and 17A-20 to project the non-axisymmetric beam spot 14 on the transparent workpiece 160 and generate the pulsed laser beam focal line 13' of FIG. 1B. The pulsed laser beam focal line 13' comprises a quasi non-diffracting beam, such as a non-axisymmetric Gauss-Bessel beam, as defined above, to fully perforate the transparent workpiece 160 to form the series of defects 172 in the transparent workpiece 160. In some embodiments, the pulse duration of the individual laser pulses is in a range of from about 1 picosecond to about 100 picoseconds, such as from about 5 picoseconds to about 20 picoseconds, and the repetition rate of the individual pulses may be in a range from about 1 kHz to 4 MHz, such as in a range from about 10 kHz to about 3 MHz, or from about 10 kHz to about 650 kHz.

Referring again to FIG. 4A, FIG. 4A schematically depicts a side view of one embodiment of an optical fiber 100, 200. The optical fiber described herein may be used to convert a conventional Gaussian laser beam into a Bessel laser beam. The optical fibers generally comprise a first segment (R) coupled to a second segment (G) with a transition region. In this embodiment, the first segment (R) has a larger diameter $D_o$ than the second segment (G). In embodiments, the first segment includes a first core portion with a first annular core region centered on an axial centerline of the optical fiber and a first cladding portion extending around the first core portion. The first annular core region has a greater relative refractive index relative to the first cladding portion. The second segment (G) has a second core portion and a second cladding region extending around the second core portion. At least a portion of the second core portion of the second segment is optically coupled to the first annular portion and has a greater relative refractive index relative to the second cladding portion. The second segment (G) supports propagation of a Gaussian laser beam and the first segment (R) supports propagation of a Bessel (or Gauss-Bessel) laser beam. A Gaussian laser beam propagating through the second segment is converted into a Bessel laser beam (or Gauss-Bessel) as it passes through the transition region and into the first segment (R) of the fiber. For example, a laser light source emitting an output beam with a Gaussian profile may be optically coupled to the second segment of the optical fiber and the Gaussian profile of the output beam is converted into a Bessel profile as the output beam propagates through the transition region and the first segment. The structure and composition of various embodiments of optical fibers that convert a Gaussian laser beam into a Bessel laser beam will be described in more detail herein with specific reference to the appended drawings.

Figure 5A:
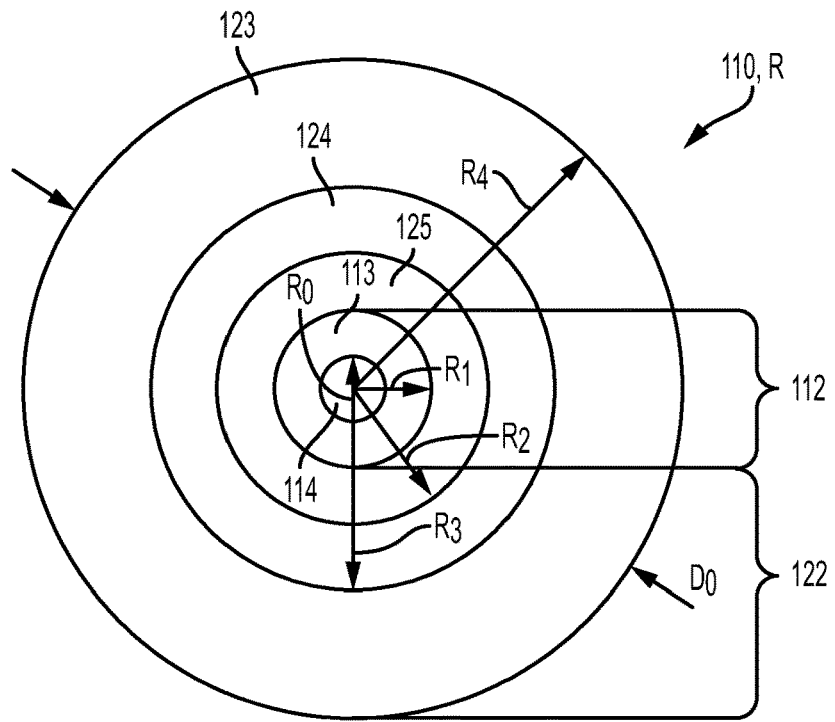
FIG. 5A schematically depicts a radial cross section of a first segment of the optical fiber of FIG. 4A according to one or more embodiments shown and described herein.
Figure 6A:
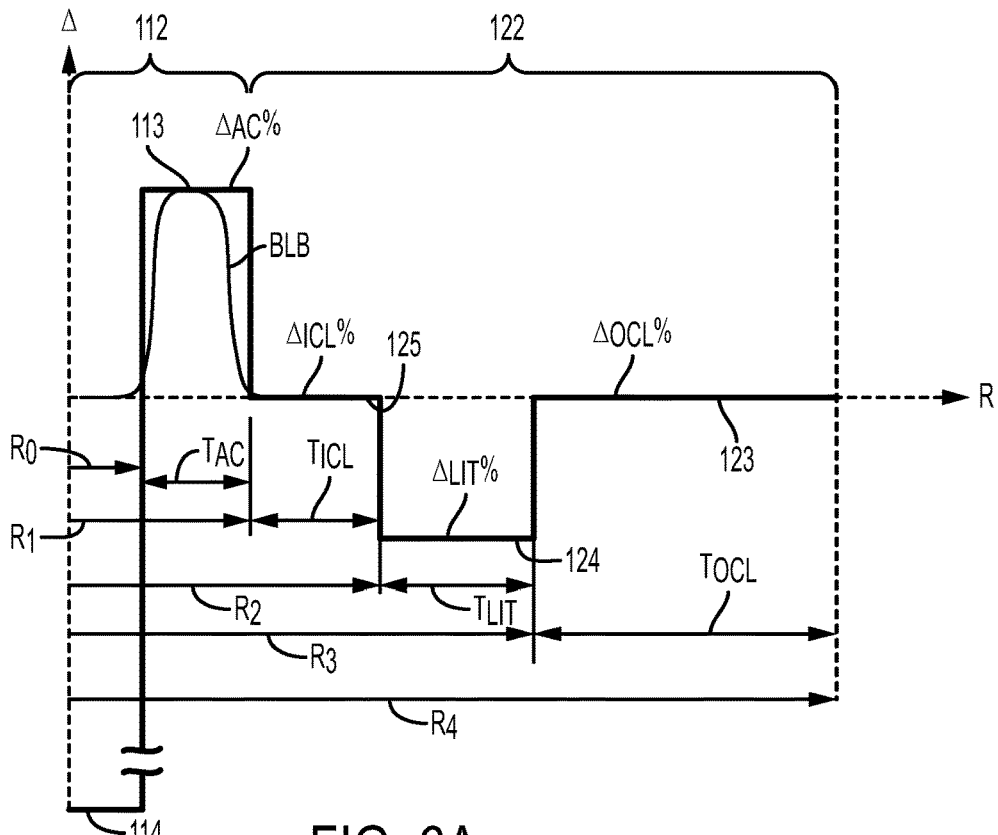
FIG. 6A graphically depicts the relative refractive index profile of the first segment of the optical fiber of FIG. 5A as a function of the radius R of the glass portion of the optical fiber according to one or more embodiments shown and described herein.
Figure 6B:
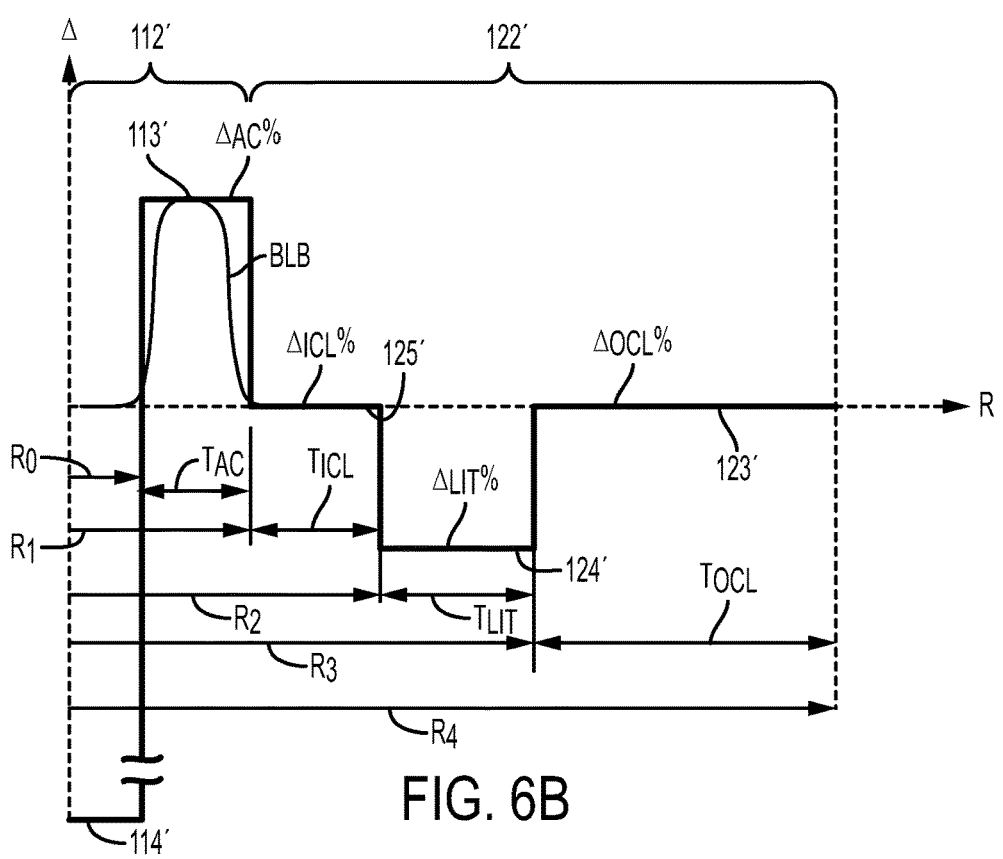
FIG. 6B graphically depicts the relative refractive index profile (in A-A cross-section), of the first segment of the optical fiber of FIG. 5B as a function of the radius R of the glass portion of the optical fiber according to one or more embodiments shown and described herein.
Figure 6C:
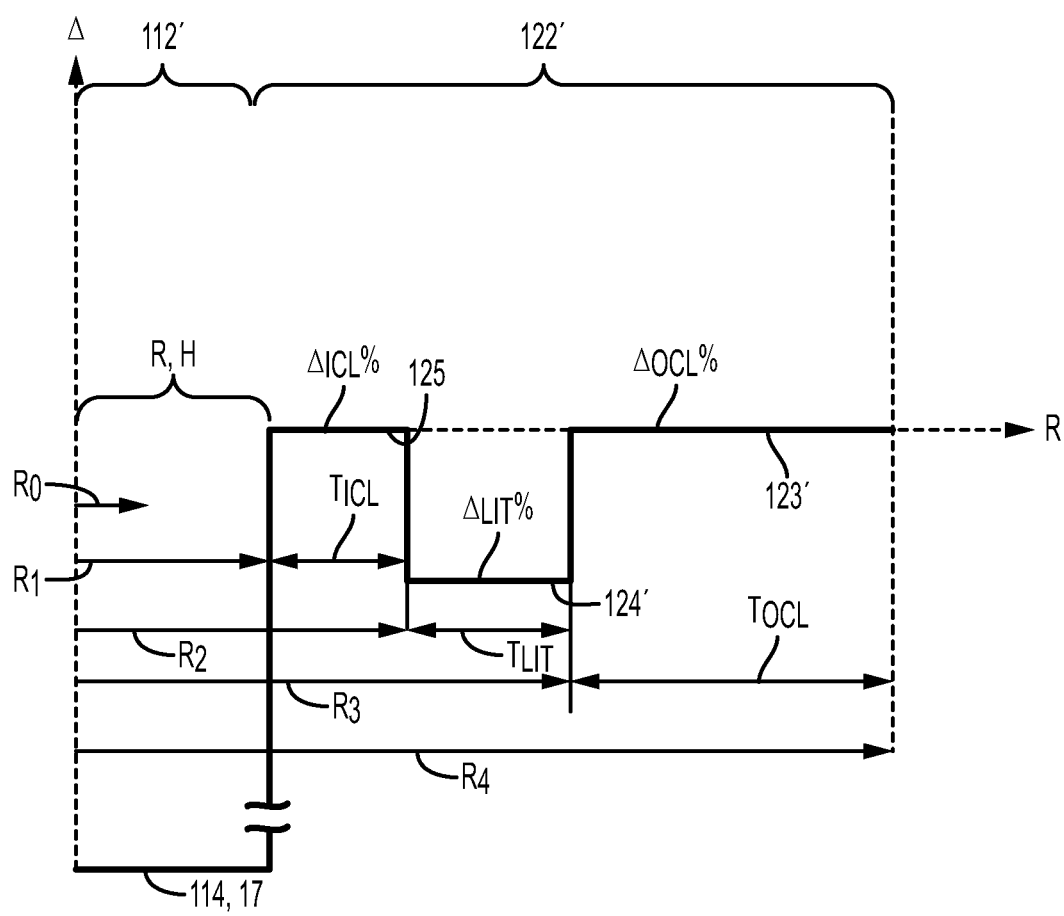
FIG. 6C graphically depicts the relative refractive index profile (in B-B cross-section), of the first segment of the optical fiber of FIG. 5B as a function of the radius R of the glass portion of the optical fiber according to one or more embodiments shown and described herein.
Figure 7A:
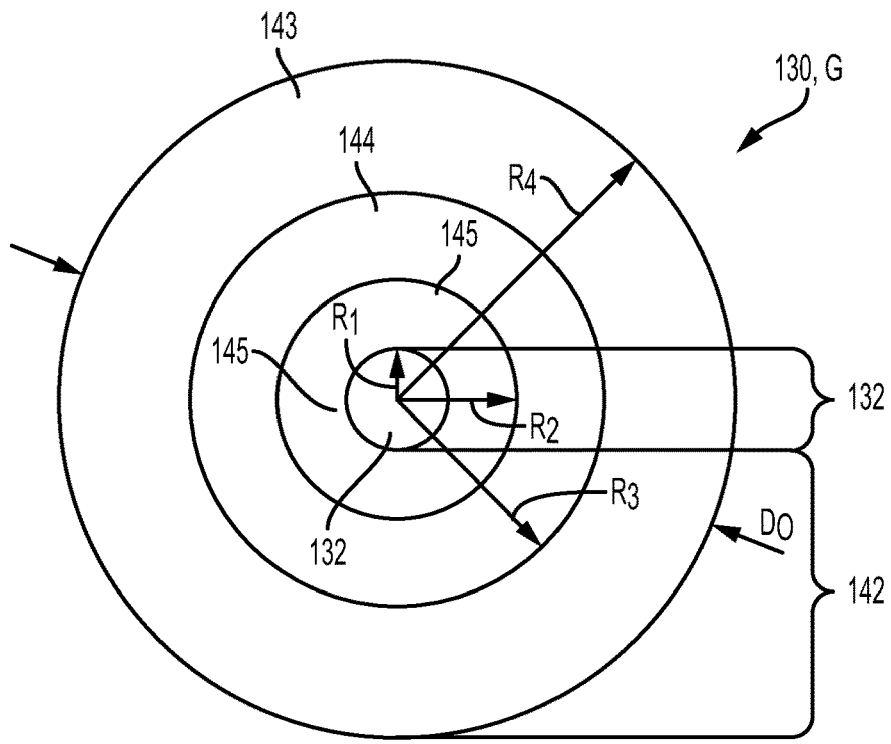
FIG. 7A schematically depicts a radial cross section of a second segment of the optical fiber of FIG. 4A according to one or more embodiments shown and described herein.
Figure 7B:
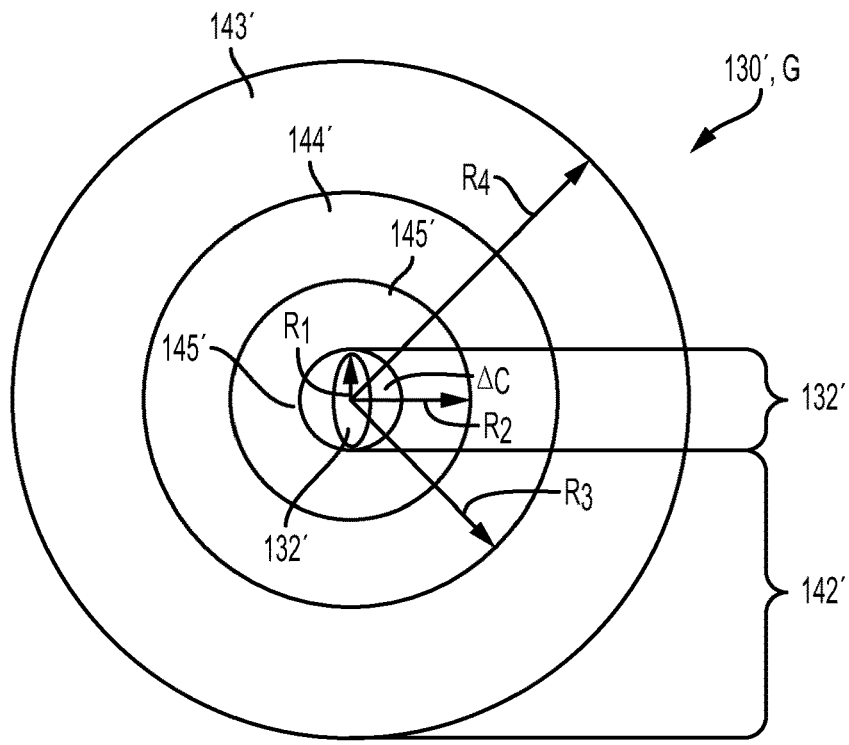
FIG. 7B schematically depicts a radial cross section of a second segment of the optical fiber of FIG. 4B according to one or more embodiments shown and described herein.
Figure 8A:
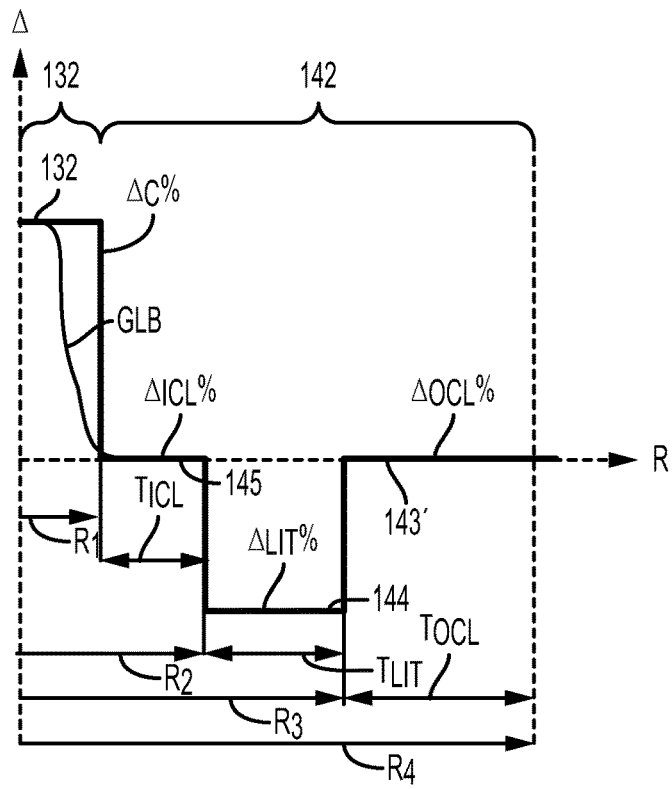
FIG. 8A graphically depicts the relative refractive index profile of the second segment of the optical fiber of FIG. 7A as a function of the radius r of the glass portion of the optical fiber according to one or more embodiments shown and described herein.

Referring to FIGS. 4A and 5A-8A, one embodiment of an optical fiber 100 with a first segment 110 (R-segment, R) optically coupled to a second segment 130 (G-segment, G) with a transition region 150 is shown. A side view of at least a portion of the optical fiber 100 is shown in FIG. 4A, radial cross sections of the first segment 110 and the second segment 130 of the optical fiber 100 are shown in FIGS. 5A and 7A, respectively, and corresponding relative refractive index profiles for the first segment 110 and second segment 130 are shown in FIGS. 6A and 8A, respectively. The first segment 110 (R-segment) has a first outer diameter '$D_0$' and the second segment 130 (G-segment) has a second outer diameter '$d_0$' (FIG. 4A). (The diameters $D_0$ and $d_0$ are are the outer diameters of the fiber's cladding). The first outer diameter $D_0$ is greater than the second outer diameter $d_0$. In exemplary embodiments, the first outer diameter $D_0$ may be from about 0.2 millimeters (mm) to about 5.0 mm, the second outer diameter $d_0$ may be from about 0.1 to about 4.5 mm, and the length of the transition region 150 may be from about 0.5 mm to about 20 mm. In embodiments, the first outer diameter $D_0$ is from about 0.4 mm to about 1.0 mm, the second outer diameter $d_0$ is from about 0.2 mm to about 0.9 mm, and the length of the transition region 150 is from about 1 mm to about 10 mm. In other embodiments, the first outer diameter $D_0$ is from about 150 μm to about 250 μm, the second outer diameter $d_0$ is from about 75 μm to about 225 m, and the length of the transition region 150 is greater than 10 mm. A Gaussian laser beam 'GLB' coupled into and propagating through the second segment 130 is converted into a ring shaped beam RSB (or the near-field version of the Bessel beam) propagating through the first segment 110, which when modified into a non-axysymmetric shape by end-cap 1000 (also referred to herein as an end-cap portion herein) and is then focused to form a non-axisymmetric Bessel laser beam 'BLB' that provides an non-axisymmetric beam spot 14. (According to the embodiments described herein, the ring shaped beam is situated in what is optically as the "near field", and hence is a near-field version of a Bessel beam. The focusing lens(es) transform this modified ring shaped beam into the optical "far field", which creates the Bessel profile, or the Bessel laser beam 'BLB'). In embodiments, the first segment 110 (R-segment), second segment 130 (G-segment) and transition region 150 are integrally formed with one another and the taper ratio ($d_0/D_0$) of the optical fiber 100 is greater than or equal to about 0.2 and less than or equal to about 0.9. In other embodiments, the taper ratio of the optical fiber 100 is greater than or equal to about 0.3 and less than or equal to 0.9. In still other embodiments, the taper ratio of the optical fiber 100 is greater than or equal to 0.3 and less than or equal to 0.8 (for example, 0.3, 0.4, 0.5, 0.6, 0.7, 0.8, or therebetween). According to some embodiments, transition region 150 has a length, for example, 1 mm to 10 mm, or 1-5 mm, (e.g., 1 mm, 2 mm, 3 mm, 4 mm, 5 mm, 6 mm, 7 mm, 8 mm, 9 mm, 10 mm or therebetween. If the taper is created during fiber draw the tapered region 150 can be longer, for example 10 mm-5 m in length). In some embodiments the tapered region 150 is has an adiabatic shape. More specifically, the tapered region 150 has an adiabatic transition (geometry) so that coupling loss from the G segment to the R-segment is minimized. For example, the coupling loss due to transition is less than 1 dB, less than 0.5 dB, less than 0.25 dB, or even less than 0.1 dB. The R-segment (first segment 110, FIGS. 5A and 6A) of the optical fiber 100 has a first core portion 112 centered on an axial centerline 2 of the optical fiber 100. The first core portion 112 may include a first annular core region 113. A first cladding portion 122 may extend around the first core portion 112. The second segment 130 (G-segment, (FIGS. 7A and 8A) of the optical fiber 100 may have a second core portion 132 and at least a portion of the second core portion 132 is optically coupled to the first core portion 112. A second cladding portion 142 may extend around the second core portion 132.

Referring to FIGS. 4A, 5A and 6A, a radial cross section of the first segment 110 of the optical fiber 100 of FIG. 4A is schematically depicted in FIG. 5A and the relative refractive index profile of the radial cross section relative to the centerline of the cross section is graphically depicted in FIG. 6A. The first segment 110 (R-segment) generally includes a first core portion 112 and a first cladding portion 122. The first core portion 112 is positioned within the first cladding portion 122 with the first cladding portion 122 extending around the first core portion 112. The first core portion 112 and the first cladding portion 122 may be generally concentric such that a cross section of the first segment 110 of the optical fiber 100 is generally circular symmetric with respect to the center of the first core portion 112 of the optical fiber 100. Also, the first core portion 112 and the first cladding portion 122 may be generally axisymmetric with respect to the center of the first core portion 112 of the optical fiber 100. In the embodiment depicted in FIGS. 4A, 5A and 6A, the first core portion 112 may include a first annular core region 113 and a channel 114. The channel 114 may be, for example an air hole. The channel 114 is positioned within the first annular core region 113 and the channel 114 is directly adjacent to and in direct contact with the first annular core region 113.

In some embodiments, the first cladding portion 122 may optionally include a first low-index trench 124 and a first outer cladding portion 123. The optional first low-index trench 124 is positioned within the first outer cladding 123 and the first low-index trench 124 may be directly adjacent to and in direct contact with the first outer cladding 123. The first low-index trench 124, when included, improves the bend performance of the optical fiber 100. That is, the first low-index trench 124 reduces attenuation of light propagating in the optical fiber 100 when the optical fiber 100 is coiled, thereby permitting the optical fiber 100 to be coiled to a tighter (i.e., smaller) radius without increasing the attenuation of light propagating in the optical fiber 100 relative to an optical fiber having a similar structure without the first low-index trench 124.

In some embodiments (not depicted), the first low-index trench 124 may be directly adjacent to and in direct contact with the first core portion 112. In some other embodiments, such as the embodiment depicted in FIGS. 5A and 6A, the first low-index trench 124 may be spaced apart from the first core portion 112 by a first inner cladding portion 125, i.e., the first inner cladding portion 125 is positioned within the first low-index trench 124 between the first low-index trench 124 and the first core portion 112. In embodiments, the first inner cladding portion 125 is directly adjacent to and in direct contact with the first low-index trench 124 and the first annular core region 113.

The first segment 110 has a radius $R_4$ from the axial centerline 2 of the optical fiber 100. The first core portion 112 has a radius $R_1$ that is less than the radius $R_4$. The channel 114 of the first core portion 112 has a radius $R_0$ that is less than the radius $R_1$. The first annular core region 113 has an inner radius $R_0$, an outer radius $R_1$ and a radial thickness $T_{AC}=R_1-R_0$. The radii $R_0$ and $R_1$ of the first core portion 112 and first annular core region 113, respectively, are defined at the points at which the lines tangent to the maximum slopes of the relative refractive index profile (FIG. 6A) of the first core portion 112 and first annular core region 113, respectively, cross the reference relative refractive index line $\Delta_{OCL}\%$ discussed in greater detail below. The first cladding portion 122 has an inner radius $R_1$, an outer radius $R_4$ and a radial thickness $T_{CL}=R_4-R_1$. In embodiments where the first cladding portion 122 includes the first low-index trench 124 and the first outer cladding portion 123, the first low-index trench 124 has an inner radius $R_2$, an outer radius $R_3$ and a radial thickness $T_{LIT}=R_3-R_2$. The first outer cladding portion 123 has an inner radius $R_3$, an outer radius $R_4$ and a radial thickness $T_{OCL}=R_4-R_3$. In embodiments (not depicted) where the first low-index trench 124 is directly adjacent to and in direct contact with the first core portion 112, the inner radius $R_2$ of the first low-index trench 124 may be equal to the radius $R_1$ of the first core portion 112. In embodiments where the first low-index trench 124 is spaced apart from the first core portion 112 by the first inner cladding portion 125, the first inner cladding portion 125 has an inner radius $R_1$, an outer radius $R_2$ and a radial thickness $T_{ICL}=R_2-R_1$.

The radius $R_4$ of the cladding of first segment 110 (R segment) is from about 50 μm to about 250 μm. In some embodiments, the radius $R_4$ of the first segment 110 is from about 60 μm to about 150 μm. The radius $R_1$ of the first core portion 112 is from about 5 μm to about 55 μm. In some embodiments, the radius $R_1$ is from about 10 μm to about 50 μm. The radius $R_0$ of the channel 114 is from about 2 μm to about 40 μm. In some embodiments, the radius $R_0$ of the channel 114 is from about 5 μm to about 35 μm. The radial thickness $T_{AC}$ ($R_1-R_0$) of the first annular core region 113 is from about 1 μm to about 20 μm. In some embodiments the radial thickness $T_{AC}$ is from about 2 μm to about 15 μm. The radial thickness $T_{CL}$ ($R_4-R_1$) of the first cladding portion 122 is from about 20 μm to about 150 μm. In some embodiments the radial thickness $T_{CL}$ is from about 25 μm to about 125 μm. In embodiments where the first cladding portion 122 includes the first low-index trench 124 and the first outer cladding portion 123, the inner radius $R_2$ of the first low-index trench 124 is from about 10 μm to about 60 μm, the outer radius $R_3$ is from about 20 μm to about 75 μm and the radial thickness $T_{LIT}$ ($R_3-R_2$) is from about 1.0 μm to about 15 μm. In embodiments, the inner radius $R_2$ is from about 15 μm to about 55 μm, the outer radius $R_3$ is from about 25 μm to about 65 μm and the radial thickness $T_{LIT}$ is from about 1.0 μm to about 10 μm. The inner radius $R_3$ of the first outer cladding portion 123 is from about 20 μm to about 75 μm, the outer radius $R_4$ is from about 50 μm to about 250 μm and the radial thickness $T_{OCL}$ ($R_4-R_3$) is from about 25 μm to about 150 μm. In embodiments, the inner radius $R_3$ is from about 25 μm to about 55 μm, the outer radius $R_4$ is from about 60 μm to about 150 μm and the radial thickness $T_{OCL}$ is from about 30 μm to about 125 μm. In embodiments where the first low-index trench 124 is spaced apart from the first core portion 112 by the first inner cladding portion 125, the inner radius $R_1$ of the first inner cladding portion 125 is from about 5 μm to about 55 μm, the outer radius $R_2$ is from about 10 μm to about 60 μm and the radial thickness $T_{ICL}$ ($R_2-R_1$) is from about 1.0 μm to about 20 μm. In embodiments, the inner radius $R_1$ is from about 10 μm to about 50 μm, the outer radius $R_2$ is from about 15 μm to about 55 μm and the radial thickness $T_{ICL}$ is from about 1.0 μm to about 15 μm.

Referring to FIGS. 4A, 7A and 8A, a radial cross section of the second segment 130 (G-segment) of the optical fiber 100 of FIG. 4A is schematically depicted in FIG. 7A and the relative refractive index profile of the radial cross section relative to the centerline of the cross section is graphically depicted in FIG. 8A. The second segment 130 generally includes a second core portion 132 and a second cladding portion 142. The second core portion 132 is positioned within the second cladding portion 142 with the second cladding portion 142 extending around the second core portion 132. The second core portion 132 and the second cladding portion 142 may be generally concentric such that a cross section of the second segment 130 of the optical fiber 100 is generally circular symmetric with respect to the center of the second core portion 132 of the optical fiber 100. The second core portion 132 and the second cladding portion 142 may be generally axisymmetric with respect to the center of the second core portion 132 of the optical fiber 100.

In some embodiments, the second cladding portion 142 may optionally include a second low-index trench 144 and a second outer cladding portion 143. The second low-index trench 144 is positioned within the second outer cladding 143 and the second low-index trench 144 may be directly adjacent to and in direct contact with the second outer cladding 143. The second low-index trench 144, when included, improves the bend performance of the optical fiber 100. That is, the second low-index trench 144 reduces attenuation of light propagating in the optical fiber 100 when the optical fiber 100 is coiled, thereby permitting the optical fiber 100 to be coiled to a tighter (i.e., smaller) radius without increasing the attenuation of light propagating in the optical fiber 100 relative to an optical fiber having a similar structure without the second low-index trench 144. It should be understood that, when the first segment 110 of the optical fiber 100 includes the first low-index trench 124, the second segment 130 of the optical fiber 100 will include a second low-index trench 144 and vice-versa.

In some embodiments (not depicted), the second low-index trench 144 may be directly adjacent to and in direct contact with the second core portion 132. In some other embodiments, the second low-index trench 144 may be spaced apart from the second core portion 132 by a second inner cladding portion 145 as depicted in FIGS. A7A and 8A. That is, the second inner cladding portion 145 is positioned within the second low-index trench 144 and is positioned between the second low-index trench 144 and the second core portion 132. In embodiments, the second inner cladding portion 145 is directly adjacent to and in direct contact with the second low-index trench 144 and the second core portion 132.

The second segment 130 has a radius $r_4$ from the axial centerline 2 of the optical fiber 100. The second core portion 132 has a radius $r_1$ that is less than the radius $r_4$. The radius $r_1$ of the second core portion 132 is defined at the point at which the line tangent to the maximum slope of the relative refractive index profile (FIG. 8A) of the second core portion 132 crosses the reference relative refractive index line $\Delta_{ocl}\%$. The second cladding portion 142 has an inner radius $r_1$, an outer radius $r_4$ and a radial thickness $t_{cl}=r_4-r_1$. In embodiments where the second cladding portion 142 includes the second low-index trench 144 and the second outer cladding portion 143, the second low-index trench 144 has an inner radius $r_2$, an outer radius $r_3$ and a radial thickness $t_{lit}=r_3-r_2$. The second outer cladding portion 143 has an inner radius $r_3$, an outer radius $r_4$ and a radial thickness $t_{ocl}=r_4-r_3$. In embodiments (not depicted) where the second low-index trench 144 is directly adjacent to and in direct contact with the second core portion 132, the inner radius $r_2$ of the second low-index trench 144 may be equal to the radius $r_1$ of the second core portion 132. In embodiments where the second low-index trench 144 is spaced apart from the second core portion 132 by the second inner cladding portion 145, the second inner cladding portion 145 has an inner radius $r_1$, an outer radius $r_2$ and a radial thickness $t_{icl}=r_2-r_1$.

The radius $r_4$ of the second segment 130 is from about 25 μm to about 80 μm. In some embodiments, the radius $r_4$ of the second segment 130 is from about 35 μm to about 70 μm. The radius $r_1$ of the second core portion 132 is from about 2 μm to about 35 μm. In some embodiments, the radius $r_1$ is from about 4 μm to about 30 μm. The radial thickness $t_{cl}$ ($r_4-r_1$) of the second cladding portion 142 is from about 20 μm to about 75 μm. In some embodiments the radial thickness $t_{cl}$ is from about 25 μm to about 65 μm. In embodiments where the second cladding portion 142 includes the second low-index trench 144 and the second outer cladding portion 143, the inner radius $r_2$ of the second low-index trench 133 is from about 4 μm to about 35 μm, the outer radius $r_3$ is from about 5 μm to about 40 μm and the radial thickness $t_{lit}$ ($r_3-r_2$) is from about 1.0 μm to about 15 μm. In embodiments, the inner radius $r_2$ is from about 5 μm to about 30 μm, the outer radius $r_3$ is from about 10 μm to about 35 μm and the radial thickness $t_{lit}$ is from about 1.0 μm to about 12.5 μm. The inner radius $r_3$ of the second outer cladding portion 143 is from about 5 µm to about 40 µm, the outer radius $r_4$ is from about 25 µm to about 80 µm and the radial thickness $t_{ocl}$ ($r_4$–$r_3$) is from about 15 µm to about 75 µm. In embodiments, the inner radius $r_3$ is from about 10 µm to about 35 µm, the outer radius $r_4$ is from about 35 µm to about 70 µm and the radial thickness $t_{ocl}$ is from about 20 µm to about 60 µm. In embodiments where the second low-index trench 144 is spaced apart from the second core portion 132 by the second inner cladding portion 145, the inner radius $r_1$ of the second inner cladding portion 145 is from about 2 µm to about 35 µm, the outer radius $r_2$ is from about 4 µm to about 35 µm and the radial thickness $t_{icl}$ ($r_2$–$r_1$) is from about 1.0 µm to about 20 µm. In embodiments, the inner radius $r_1$ is from about 4 µm to about 30 µm, the outer radius $r_2$ is from about 5 µm to about 30 µm and the radial thickness $t_{icl}$ is from about 1.0 µm to about 15 µm.

Referring to FIGS. 4A and 5A-8A although the first segment 110 and the second segment 130 both have a core portion and a cladding portion, it should be appreciated that the first core portion 112 of the first segment 110 includes a first annular core region 113 with a channel 114 positioned within the first annular core region 113, whereas as the second core portion 132 does not include a channel or an annular core region. It should also be appreciated that the first core portion 112 is optically coupled with the second core portion 132 and the first cladding portion 122 is optically coupled to the second cladding portion 142 through the transition region 150. Particularly, the first annular core region 113 is optically coupled to the second core portion 132, the first outer cladding portion 123 is optically coupled to the second outer cladding portion 143, the first low-index trench 124 is optically coupled to the second low-index trench 144, and the first inner cladding portion 125 is optically coupled to the second inner cladding portion 145 through the transition region 150.

The channel 114 of the first segment 110 may be a void space extending along the axial centerline 2 of the first segment 110. In embodiments, the channel 114 may be filled with a gas, such as, for example, air or another gas. The channel 114 has a much lower relative refractive index than other portions and regions of the optical fiber 100. Specifically, the channel 114 has a refractive index $n_{CH}$ and relative refractive index $\Delta_{CH}\%$ relative to the first outer cladding portion 123. The refractive index $n_{CH}$ is about 1.0 and the relative refractive index $\Delta_{CH}\%$ is about –26%. The first annular core region 113 has a refractive index $n_{AC}$ and a relative refractive index $\Delta_{AC}\%$, and the second core portion 132 has a refractive index $n_c$ and a relative refractive index $\Delta_c\%$. In embodiments, the first annular core region 113 and the second core portion 132 are made from the same material and the relative refractive index $\Delta_{AC}\%$ is substantially equal to the relative refractive index $\Delta_c\%$ (i.e., $\Delta_{AC}\%=\Delta_c\%$). The relative refractive index $\Delta_{AC}\%$ and the relative refractive index $\Delta_c\%$ are much greater than the relative refractive index $\Delta_{CH}\%$ (i.e., $\Delta_{AC}\%>>\Delta_{CH}\%$, $\Delta_c\%>>\Delta_{CH}\%$). The relative refractive index $\Delta_{AC}\%$ and the relative refractive index $\Delta_c\%$ are from about 0.2% to about 1.0%. In embodiments, the relative refractive index $\Delta_{AC}\%$ and the relative refractive index $\Delta_c\%$ are from about 0.3% to about 0.75%.

The first cladding portion 122 has a refractive index $n_{CL}$ and a relative refractive index $\Delta_{CL}\%$ relative to pure silica glass. The refractive index $n_{CL}$ of the first cladding portion 122 is used as the reference for the relative refractive indices of the other glass portions of the first segment 110 of the optical fiber 100. In embodiments where the first cladding portion 122 includes a first outer cladding portion 123, a first low-index trench 124, and (optionally) a first inner cladding portion 125, the relative refractive indices of the other glass portions of the first segment 110 of the optical fiber 100 are determined relative to the first outer cladding portion 123, as described in further detail herein.

In embodiments where the first cladding portion 122 includes the first inner cladding portion 125 and the first low-index trench 124, the first inner cladding portion 125 has a refractive index $n_{ICL}$ and a relative refractive index $\Delta_{ICL}\%$, and the first low-index trench 124 has a refractive index $n_{LIT}$ and a relative refractive index $\Delta_{LIT}\%$. The relative refractive index $\Delta_{ICL}\%$ is generally greater than the relative refractive index $\Delta_{LIT}\%$ and generally less than the relative refractive index $\Delta_{AC}\%$ (i.e., $\Delta_{AC}\%>\Delta_{ICL}\%>\Delta_{LIT}\%$) as generally depicted in FIG. 6A. The relative refractive index $\Delta_{ICL}\%$ is from about –0.1% to about 0.1% and the relative refractive index $\Delta_{LIT}\%$ is from about –0.1% to about –1.0%. In embodiments, the relative refractive index $\Delta_{ICL}\%$ is from about –0.05% to about 0.05% and the relative refractive index $\Delta_{LIT}\%$ is from about –0.3% to about –0.5%.

The second cladding portion 142 has a refractive index $n_{cl}$ and a relative refractive index $\Delta_{cl}\%$ relative to pure silica glass. The refractive index $n_{cl}$ of the second cladding portion 142 may be used as the reference for the relative refractive indices of the other glass portions of the second segment 130 of the optical fiber 100 and thus is determined relative to itself. In embodiments where the second cladding portion 142 includes a second outer cladding portion 143, a second low-index trench 144, and (optionally) a second inner cladding portion 145, the relative refractive indices of the other glass portions of the second segment 130 of the optical fiber 100 are determined relative to the second outer cladding portion 143, as described in further detail herein.

In embodiments where the second cladding portion 142 includes the second inner cladding portion 145 and the second low-index trench 144, the second inner cladding portion 145 has a refractive index $n_{icl}$ and a relative refractive index $\Delta_{icl}\%$, and the second low-index trench 144 has a refractive index $n_{lit}$ and a relative refractive index $\Delta_{lit}\%$. The relative refractive index $\Delta_{icl}\%$ is generally greater than the relative refractive index $\Delta_{lit}\%$ and less than the relative refractive index $\Delta_c\%$ (i.e., $\Delta_c\%>\Delta_{icl}\%>\Delta_{lit}\%$) as generally depicted in FIG. 8A. In embodiments, the second inner cladding portion 145 is made from the same material as the first inner cladding portion 125 and the second low-index trench 144 is made from the same material as the first low-index trench 124. Accordingly, the refractive indices $n_{icl}$ and $n_{lit}$ may be substantially equal to the refractive indices, $n_{ICL}$ and $n_{LIT}$, respectively (i.e., $n_{icl}=n_{ICL}$; $n_{lit}=n_{LIT}$), and the relative refractive indices $\Delta_{icl}\%$ and $\Delta_{lit}\%$ may be substantially equal to the relative refractive indices $\Delta_{ICL}\%$ and $\Delta_{LIT}\%$, respectively (i.e., $\Delta_{icl}\%=\Delta_{ICL}\%$; $\Delta_{lit}\%=\Delta_{LIT}\%$). For example, the relative refractive index $\Delta_{icl}\%$ may be from about –0.1% to about 0.1% and the relative refractive index $\Delta_{lit}\%$ may be from about –0.1% to about –1.0%. In embodiments, the relative refractive index $\Delta_{icl}\%$ may be from about –0.05% to about 0.05% and the relative refractive index $\Delta_{lit}\%$ may be from about –0.3% to about –0.5%.

In embodiments where the first cladding portion 122 includes the first outer cladding portion 123, the first outer cladding portion 123 has a refractive index $n_{OCL}$ and a relative refractive index $\Delta_{OCL}\%$. In these embodiments, the relative refractive index $\Delta_{OCL}\%$ may be used as the reference for determining the relative refractive indices of the other glass portions of the first segment 110 of the optical fiber 100. In the embodiments described herein, the relative refractive index $\Delta_{OCL}\%$ of the first outer cladding portion 123 is greater than the relative refractive index $\Delta_{LIT}\%$ of the first low-index trench 124 (i.e., $\Delta_{OCL}\%>\Delta_{LIT}\%$). In some embodiments, the relative refractive index $\Delta_{OCL}\%$ of the first outer cladding portion 123 may be greater than the relative refractive index $\Delta_{ICL}\%$ of the first inner cladding portion 125, such as when the first inner cladding portion 125 comprises silica glass down-doped with one or more down-dopants which decrease the index of refraction $n_{ICL}$ of the first inner cladding portion 125 relative to the index of refraction $n_{OCL}$ of the first outer cladding portion 123. In other embodiments, the relative refractive index $\Delta_{OCL}\%$ of the first outer cladding portion 123 may be substantially equal to the relative refractive index $\Delta_{ICL}\%$ of the first inner cladding portion 125. In such embodiments, the composition of the first outer cladding portion 123 may be the same as the composition of the first inner cladding portion 125 or different than the composition of the first inner cladding portion 125, so long as $\Delta_{OCL}\%=\Delta_{ICL}\%$. Based on the foregoing, it should be understood that the relative refractive index $\Delta_{OCL}\%$ of the first outer cladding portion 123 is greater than or substantially equal to the relative refractive index $\Delta_{ICL}\%$ of the first inner cladding portion 125.

In embodiments where the second cladding portion 142 includes the second outer cladding portion 143, the second outer cladding portion 143 has a refractive index $n_{ocl}$ and a relative refractive index $\Delta_{ocl}\%$. Accordingly, the relative refractive index $\Delta_{ocl}\%$ may be used as the reference for the relative refractive indices of the other glass portions of the second segment 130 of the optical fiber 100. In the embodiments described herein, the relative refractive index $\Delta_{ocl}\%$ of the second outer cladding portion 143 is greater than the relative refractive index $\Delta_{lit}\%$ of the second low-index trench 144 (i.e., $\Delta_{ocl}\%>\Delta_{lit}\%$). In some embodiments, the relative refractive index $\Delta_{ocl}\%$ of the second outer cladding portion 143 may be greater than the relative refractive index $\Delta_{icl}\%$ of the second inner cladding portion 145, such as when the second inner cladding portion 145 comprises silica glass down-doped with one or more down-dopants which decrease the index of refraction $n_{icl}$ of the second inner cladding portion 145 relative to the index of refraction $n_{ocl}$ of the second outer cladding portion 143. In other embodiments, the relative refractive index $\Delta_{ocl}\%$ of the second outer cladding portion 143 may be substantially equal to the relative refractive index $\Delta_{icl}\%$ of the second inner cladding portion 145. In such embodiments, the composition of the second outer cladding portion 143 may be the same as the composition of the second inner cladding portion 145 or different than the composition of the second inner cladding portion 145, so long as $\Delta_{ocl}\%=\Delta_{icl}\%$. Based on the foregoing, it should be understood that the relative refractive index $\Delta_{ocl}\%$ of the second outer cladding portion 143 is greater than or substantially equal to the relative refractive index $\Delta_{icl}\%$ of the second inner cladding portion 145. In embodiments, the second outer cladding portion 143 is made from the same material as the first outer cladding portion 123, and as such, the refractive index $n_{ocl}$ of the second outer cladding portion 143 may be substantially equal to the refractive index $n_{OCL}$ of the first outer cladding portion 123 (i.e., $n_{ocl}=n_{OCL}$) and the relative refractive index $\Delta_{ocl}\%$ of the second outer cladding portion 143 may be substantially equal to the relative refractive index $\Delta_{OCL}\%$ of the first outer cladding portion 123, (i.e., $\Delta_{ocl}\%=\Delta_{OCL}\%=0$).

The first annular core region 113 of the first segment 110 and the second core portion 132 of the second segment 130 comprise silica glass with one or more up-dopants which increase the index of refraction of silica glass. Suitable up-dopants include, for example and without limitation, germanium (Ge), titanium (Ti), aluminum (Al), chlorine (Cl), phosphorous (P), germanium oxide (e.g., $GeO_2$), titanium oxide (e.g., $TiO_2$), phosphorous oxide (e.g., $P_2O_5$), and various combinations thereof. In embodiments, at least one of the first annular core region 113 and the second core portion 132 contain between about 3 wt. % to about 17 wt. % $GeO_2$. In some other embodiments, at least one of the first annular core region 113 and the second core portion 132 contain between about 5 wt. % to about 13 wt. % $GeO_2$. In embodiments, the first annular core region 113 and the second core portion 132 are made from the same materials and the dopant concentration in the first annular core region 113 is substantially equal to the dopant concentration in the second core portion 132.

The first inner cladding portion 125 of the first segment 110 and the second inner cladding portion 145 of the second segment 130 may comprise pure silica glass, silica glass with one or more up-dopants which increase the index of refraction of silica glass, or silica glass with one or more down-dopants that decrease the index of refraction of silica glass. Non-limiting examples of suitable up-dopants include Ge, Ti, Al, Cl, P, $GeO_2$, $TiO_2$, $P_2O_5$, combinations thereof or the like. In embodiments, at least one of the first inner cladding portion 125 and the second inner cladding portion 145 contain Cl as an up-dopant. Non-limiting examples of suitable down-dopants include fluorine (F), boron (B), or the like. In embodiments, at least one of the first inner cladding portion 125 and the second inner cladding portion 145 contain F as a down-dopant. As used herein, the phrase "pure silica glass" means that the silica glass comprises $SiO_2$ with less than 1000 ppm by weight of other elements.

The radial thickness of a particular glass portion of an optical fiber may be interrelated with a relative refractive index of the particular glass portion. Specifically, a glass portion 'i' with a relative refractive index $\Delta_i\%$, an inner radius $R_{in}$ and an outer radius $R_{out}$ may have a trench volume $V_i$ defined as:

$$V_i = 2\int_{R_{in}}^{R_{out}} \Delta_i\%(R)dR \qquad (32)$$

which may be rewritten as:

$$V_i = \Delta_i\%(R_{out}^2 - R_{in}^2). \qquad (33)$$

Accordingly, the first low-index trench 124 may have a trench volume $V_{LIT}$ of:

$$V_{LIT} = \Delta_{LIT}\%(R_3^2 - R_2^2) \qquad (34)$$

and the second low-index trench 144 may have a trench volume $v_{lit}$ of:

$$v_{lit} = \Delta_{lit}\%(r_3^2 - r_2^2) \qquad (35)$$

In the embodiments described herein, the trench volume $V_{LIT}$ of the first low-index trench 124 may be greater than or equal to about 80%-$\mu m^2$, such as greater than or equal to about 100%-$\mu m^2$. In some embodiments, the trench volume $V_{LIT}$ may be greater than or equal to about 110%-$\mu m^2$ or even greater than or equal to about 120%-$\mu m^2$. In some embodiments, the trench volume $V_{LIT}$ may be greater than or equal to about 80%-$\mu m^2$ and less than or equal to about 220%-$\mu m^2$. In some embodiments, the trench volume $V_{LIT}$ may be greater than or equal to about 100%-$\mu m^2$ and less than or equal to about 200%-$\mu m^2$. In still other embodiments, the trench volume profile $V_{LIT}$ may be greater than or equal to about 110%-$\mu m^2$ and less than or equal to about 180%-$\mu m^2$.

In the embodiments described herein, the trench volume $v_{lit}$ of the second low-index trench 144 may be greater than or equal to about 40%-μm², such as greater than or equal to about 50%-μm². In some embodiments, the trench volume $v_{lit}$ may be greater than or equal to about 55%-μm² or even greater than or equal to about 60%-μm². In some embodiments, the trench volume $v_{lit}$ may be greater than or equal to about 40%-μm² and less than or equal to about 110%-μm². In some embodiments, the trench volume $v_{lit}$ may be greater than or equal to about 50%-μm² and less than or equal to about 100%-μm². In still other embodiments, the trench volume profile $v_{lit}$ may be greater than or equal to about 55%-μm² and less than or equal to about 90%-μm².

In the embodiments of the optical fibers described herein, the first low-index trench 124, the second low-index trench 144, or both the first low-index trench 124 and the second low-index trench 144 comprise silica glass with one or more down-dopants which decrease the index of refraction of silica glass. Non-limiting examples of down-dopants include F, B, or the like. The first low-index trench 124, the second low-index trench 144, or both the first low-index trench 124 and the second low-index trench 144, may comprise F in a concentration between about 0.1 wt. % to about 2.5 wt. %. In embodiments, at least one of the first low-index trench 124 and the second low-index trench 144 comprise F in a concentration between about 0.1 wt. % to about 1.8 wt. %. In some embodiments, at least one of the first low-index trench 124 and the second low-index trench 144 comprise F in a concentration between about 0.1 wt. % to about 1.5 wt. %. In still other embodiments, at least one of the first low-index trench 124 and the second low-index trench 144 comprise F in a concentration between about 0.5 wt. % to about 1.8 wt. %. In still yet other embodiments, at least one of the first low-index trench 124 and the second low-index trench 144 comprise F in a concentration between about 0.7 wt. % to about 1.8 wt. %.

In some embodiments, at least one of the relative refractive index $\Delta_{LIT}\%$ of the first low-index trench 124 and the relative refractive index $\Delta_{lit}\%$ of the second low-index trench 144 is achieved by forming the silica glass of at least one of the first low-index trench 124 and the second low-index trench 144, respectively, with voids which are either non-periodically disposed, or periodically disposed, or both, throughout the silica glass. The phrase "non-periodically disposed" or "non-periodic distribution", as used herein, means that for a cross section of the optical fiber 100 (such as a cross section perpendicular to the longitudinal axis), the non-periodically disposed voids are randomly or non-periodically distributed across the silica glass. Similar cross sections taken at different points along the length of the fiber will have different cross-sectional void patterns. That is, various cross sections will have different void patterns, wherein the distribution of voids and the sizes of voids do not match when the cross sections are compared to one another. As such, the voids are non-periodically disposed within the fiber structure. These voids are stretched (elongated) along the length (i.e. parallel to the longitudinal axis) of the optical fiber 100, but do not extend the entire length of the entire fiber. While not wishing to be bound by theory, it is believed that the voids extend less than a few meters, and in many cases less than 1 meter along the length of the fiber. Optical fiber disclosed herein can be made by methods which utilize preform consolidation conditions which are effective to result in a significant amount of gases being trapped in the consolidated glass blank, thereby causing the formation of voids in the consolidated glass optical fiber preform. Rather than taking steps to remove these voids, the resultant preform is used to form an optical fiber with voids therein. In some embodiments, these voids may contain one or more gases, such as argon, krypton, $CO_2$, $SO_2$, $O_2$, or mixtures thereof. In some other embodiments, the voids are substantially free of gas. Regardless of the presence or absence of gas, the refractive index $n_{LIT}$ of the first low-index trench 124, the refractive index $n_{lit}$ of the second low-index trench 144, or both of the refractive indices $n_{LIT}$ and $n_{lit}$, are decreased due to the presence of the voids. Alternatively or additionally, the refractive index $n_{LIT}$ of the first low-index trench 124, the refractive index $n_{lit}$ of the second low-index trench 144, or both of the refractive indices $n_{LIT}$ and $n_{lit}$, are decreased by forming a down-doped silica glass with a non-periodic, periodic, or both a non-periodic and periodic distribution of voids, as described herein.

The relative refractive index $\Delta_{LIT}\%$ of the first low-index trench 124 is less than the relative refractive index $\Delta_{ICL}\%$ of the first inner cladding portion 125 (i.e., $\Delta_{LIT}\%<\Delta_{ICL}\%$) and less than the relative refractive index $\Delta_{OCL}\%$ of the first outer cladding portion 123 (i.e., $\Delta_{LIT}\%<\Delta_{OCL}\%$). In some embodiments, the relative refractive index $\Delta_{ICL}\%$ is substantially equal to the relative refractive index $\Delta_{OCL}\%$ and $\Delta_{LIT}\%<\Delta_{ICL}\%=\Delta_{OCL}\%$. In other embodiments, the relative refractive index $\Delta_{ICL}\%$ is less than the relative refractive index $\Delta_{OCL}\%$ and $\Delta_{LIT}\%<\Delta_{ICL}\%<\Delta_{OCL}\%$.

The relative refractive index $\Delta_{lit}\%$ of the second low-index trench 144 is less than the relative refractive index $\Delta_{icl}\%$ of the second inner cladding portion 145 (i.e., $\Delta_{lit}\%<\Delta_{icl}\%$) and less than the relative refractive index $\Delta_{ocl}\%$ of the second outer cladding portion 143 (i.e., $\Delta_{lit}\%<\Delta_{ocl}\%$). In some embodiments, the relative refractive index $\Delta_{icl}\%$ is substantially equal to the relative refractive index $\Delta_{ocl}\%$ and $\Delta_{lit}\%<\Delta_{icl}\%=\Delta_{ocl}\%$. In other embodiments, the relative refractive index $\Delta_{icl}\%$ is less than the relative refractive index $\Delta_{ocl}\%$ and $\Delta_{lit}\%<\Delta_{icl}\%<\Delta_{ocl}\%$. In embodiments where the second low-index trench 144, the second inner cladding portion 145 and the second outer cladding portion 143 are made from the same materials as the first low-index trench 124, the first inner cladding portion 125 and the first outer cladding portion 123, respectively, it should be appreciated that the relative refractive index $\Delta_{lit}\%$ may be substantially equal to the relative refractive index $\Delta_{LIT}\%$ (i.e., $\Delta_{lit}\%=\Delta_{LIT}\%$), the relative refractive index $\Delta_{icl}\%$ may be substantially equal to the relative refractive index $\Delta_{ICL}\%$ (i.e., $\Delta_{icl}\%=\Delta_{ICL}\%$) and the relative refractive index $\Delta_{ocl}\%$ may be substantially equal to the relative refractive index $\Delta_{OCL}\%$ (i.e., $\Delta_{ocl}\%=\Delta_{OCL}\%$). Also, in embodiments where the relative refractive index $\Delta_{ICL}\%$ is substantially equal to the relative refractive index $\Delta_{OCL}\%$, $\Delta_{lit}\%<\Delta_{ICL}\%=\Delta_{OCL}\%$ and $\Delta_{LIT}\%<\Delta_{icl}\%=\Delta_{ocl}\%$. In embodiments where the relative refractive index $\Delta_{ICL}\%$ is less than the relative refractive index $\Delta_{OCL}\%$, $\Delta_{lit}\%<\Delta_{ICL}\%<\Delta_{OCL}\%$ and $\Delta_{LIT}\%<\Delta_{icl}\%<\Delta_{ocl}\%$.

The first outer cladding 123 of the first segment 110 and the second outer cladding 143 of the second segment 130 may comprise pure silica glass, silica glass with one or more up-dopants which increase the index of refraction of silica glass, or silica glass with one or more down-dopants that decrease the index of refraction of silica glass. Non-limiting examples of suitable up-dopants include Ge, Ti, Al, Cl, P, $GeO_2$, $TiO_2$, $P_2O_5$, combinations thereof or the like. In embodiments, at least one of first outer cladding 123 and the second outer cladding 143 contain Cl as an up-dopant. Non-limiting examples of suitable down-dopants include F, B, combinations thereof, or the like. In embodiments, at least one of the first outer cladding 123 and the second outer cladding 143 contain F as a down-dopant.

The various embodiments of the optical fiber 100 described herein have improved bend performance due to the incorporation of the first low-index trench 124 within the first cladding portion 122 and the second low-index trench 144 within the second cladding portion 142. Macrobend performance of the optical fiber 100 may be determined according to FOTP-62 (JEC-60793-1-47) by wrapping 2 turns of optical fiber around a 15 mm and/or a 30 mm diameter mandrel and measuring the increase in attenuation due to the bending.

In the embodiments described herein, the optical fiber 100 is manufactured using a conventional fiber manufacturing process to make a fiber preform having a desired structure and composition. Non-limiting examples of processes used to make the fiber preform include outside vapor deposition (OVD), modified chemical vapor deposition (MCVD), physical chemical vapor deposition (PCVD), or the like. Once formed, the fiber preform is drawn into a fiber having the dimensions of the first segment 110. The fiber having the dimensions of the first segment 110 is clamped and a portion of the fiber is further drawn down to the dimensions of the second segment 130 with the transition region 150 positioned between the first segment 110 and the second segment 130.

For example, in one embodiment, the optical fiber 100 may be initially formed such that the optical fiber 100 initially has the channel 114, first annular core region 113, first inner cladding portion 125, first low-index trench 124 and first outer cladding portion 123. The optical fiber 100 may then be clamped and a portion of the fiber heated and further drawn to create an optical fiber having the first segment 110 with the channel 114, first annular core region 113, first inner cladding portion 125, first low-index trench 124 and first outer cladding portion 123, and a second segment 130 having the second core portion 132, the second inner cladding portion 145, second low-index trench 144 and second outer cladding portion 143. In this procedure, further drawing the optical fiber collapses the channel 114 thereby forming the second core portion 132 (without a channel) of the second segment 130 of the optical fiber 100 while simultaneously reducing the dimensions of the second segment 130 of the optical fiber 100 relative to the first segment 110. In another embodiment, the optical fiber 100 may be formed by splicing the first segment 110 and the second segment 130 together. In such an embodiment, it is understood that the outer diameter $D_O$ of the first segment 110 and the outer diameter $d_O$ of the second segment 130 may be generally equal to each other so long as the first core portion 112, second core portion 132, first cladding portion 122 and second cladding portion 142 have the attributes and properties discussed above.

Referring to FIGS. 4A, 6A and 8A the optical fiber 100 may be used to transform a Gaussian laser beam into a Bessel laser beam. Specifically, a Gaussian laser beam GLB may be optically coupled to an inlet end 131 of the optical fiber 100 and propagates through the second segment 130 of the optical fiber 100 towards the first segment 110. The Gaussian laser beam GLB is generally confined within the second core portion 132 while propagating through the second segment 130. As the second segment 130 transitions into the first segment 110, the second core portion 132 transitions into the first annular core region 113, i.e., the second core portion 132 transitions into the first annular core region 113 positioned around the channel 114 along the length of the first segment 110 of the optical fiber 100. The Gaussian laser beam GLB propagating through the second segment 130 seeks to propagate through the high-index core portion and thereby propagates or "follows" the second core portion 132 as it transitions into the first annular core region 113. Accordingly, the Gaussian laser beam GLB is converted into a ring-shaped beam RSB propagating through the first segment 110 and generally confined within the first annular core region 113 due to the relative geometries and relative refractive indices of the first core portion 112 and the second core portion 132. When focused, the ring shaped beam RSB forms the Bessel laser beam BLB. If the outlet end 111 is planar (no focusing power), the ring shaped beam laser beam exits the optical fiber 100 at an outlet end 111 having undergone the transformation from the Gaussian laser beam to a ring shaped laser beam (RSB). The end-cap 1000 (because it is not axi-symmetric) disrupts the circular symmetry of the ring shaped laser beam (RSB) and transforms the ring shaped laser beam (RSB) into a broken or a partial ring shaped beam. If the outlet end of the end-cap is curved, and/or forms a focusing lens surface, the laser beam forms a non-axisymmetric (non circularly symmetric) Bessel laser beam BLB and the Bessel laser beam BLB exits the end-cap 1000 having undergone the transformation from a Gaussian laser beam to an non-axisymmetric Bessel laser beam. In embodiments, the Gaussian laser beam GLB can be coupled to the inlet end 131 of the optical fiber 100 through a lens system, direct butt-coupling or fusion splicing. The ring shaped beam provided to the outlet end 111 of the optical fiber 100 and modified by the end-cap 1000 can be focused, for example, with free space bulk optics (see FIG. 3A, 3C) or an end-cap lens directly formed on the outlet end of the end-cap 1000 (not shown), or attached to the outlet end of the end-cap (FIG. 3E).

Referring to FIGS. 4B, 5B, 6B, 6C, 7B, and 8B one embodiment of an optical fiber 100' with a first segment 110' (R-segment) optically coupled to a second segment 130' (G-segment) with a transition region 150' is shown. Fiber 100' similar to the fiber 100, but the core of the optical fiber 100' includes region(s) R described in more detail below.

Figure 5B:
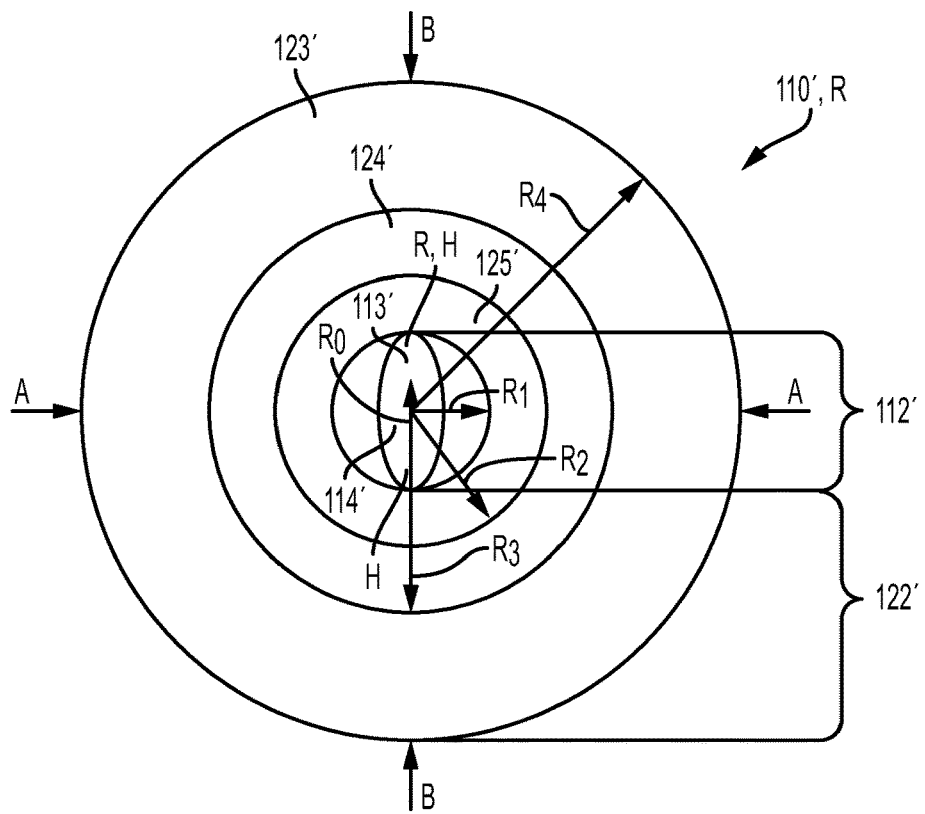
FIG. 5B schematically depicts a radial cross section of a first segment of the optical fiber of FIG. 4B according to one or more embodiments shown and described herein.

The exemplary R-segment of the optical fiber 100' (segment 110') of this embodiment is shown in FIGS. 5B, 6B, and 6C and is similar to that of the R-segment (segment 110) of the optical fiber 100. However, the first core region 113' of the core 112' of the fiber 100' is not fully annular (i.e., not continuous, but includes one or more regions R that have lower index of refraction than that of the adjacent region 113' (e.g., pure silica, down doped silica, or in the embodiments depicted in FIGS. 5B, 6B the air hole(s) H). The core region 113' is in shape of a broken or split ring. More specifically, in one cross-section (A-A) the fiber segment 110' (i.e., the R-segment) has a refractive index profile shown in FIG. 6B (with the first (dis-continuous) core region 113' having a high relative refractive index $\Delta_{AC}\%$ relative to the cladding, and in another cross-section (B-B) a refractive index profile shown in FIG. 6C. The regions R (e.g., air hole(s) H, as shown in FIG. 5B) interrupt the symmetry of the core region 113' and thus disrupt the symmetry of the laser beam propagating through the core.

Figure 8B:
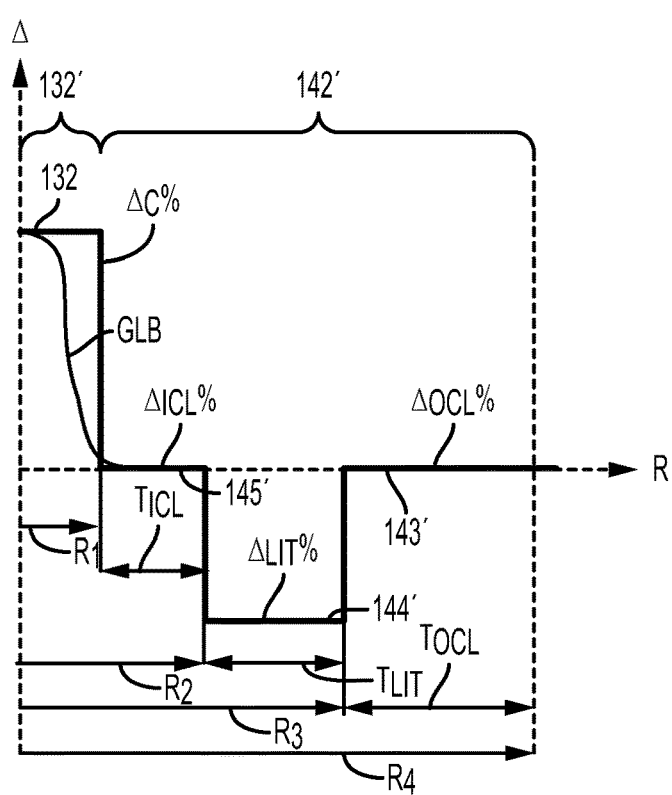
FIG. 8B graphically depicts the relative refractive index profile (A-A cross-section) of the second segment of the optical fiber of FIG. 7B as a function of the radius r of the glass portion of the optical fiber according to one or more embodiments shown and described herein.
Figure 8C:
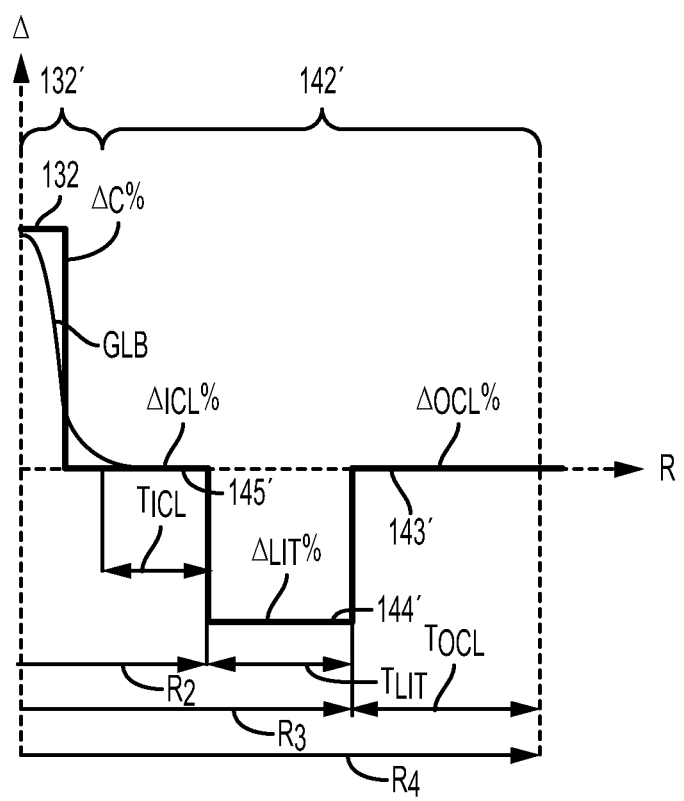
FIG. 8C graphically depicts the relative refractive index profile (B-B cross-section) of the second segment of the optical fiber of FIG. 7B as a function of the radius r of the glass portion of the optical fiber according to one or more embodiments shown and described herein.

The exemplary G-segment of the optical fiber 100' (second segment 130') of the embodiment shown in FIGS. 7B, 8B, 8C makes the Gaussian beam propagating through the G-section (second segment 130') of the fiber non-circularly symmetric. The core portion 132' of this embodiment become elliptical, after collapsing the central channel 114'. The Gaussian laser beam GLB propagating through the second segment 130' seeks to propagate through a high-index core portion and thereby propagates or "follows" the second higher index portion of the core portion 132' as it transitions into the first annular core region 113', and does not significantly propagate through the regions of lower index material R or through the air hole(s) H of the fiber section 110'.

As discussed above, the low index region(s) R (e.g., air hole(s) H) in the core of the fiber segment 110' disrupts the symmetry of the ring-shaped laser beam (RSB) and thus the beam shape propagating through segment 110' is a "broken" or a "partial ring" shaped beam. If the outlet end 111' of the optical fiber 100' is curved, and/or forms a focusing lens surface, then optical fiber 100' forms an non-axisymmetric (non-circularly symmetric) Bessel laser beam BLB and the Bessel laser beam BLB exits the optical fiber 100' having undergone the transformation from the Gaussian laser beam to an non-axisymmetric Bessel laser beam. The non axisymmetric laser beam provided to the outlet end 111 of the optical fiber 100', can be focused with free space bulk optics (see FIG. 3B, 3D) or a lens may be directly formed on the outlet end 111' of the optical fiber (not shown), or attached to the outlet end 111' of the optical fiber (FIG. 3F).

It is noted that if the optical fiber 100 is utilized instead of an optical fiber 100', a small fiber segment with the geometry and the refractive index profiles shown in FIGS. 5B 6B, 6C can be attached (e.g., spliced) to the end face of the segment 110 (R-segment) of the optical fiber 100 and utilized as the end-cap 1000, for converting an axi-symmetrical ring shaped laser beam propagating through the segment 110 (R-segment) of the optical fiber 100 into a laser beam that is non-axisymmetric. Other end-caps 1000 disclosed herein may also be utilized.

When focused, the non-axisymmetric beam propagating through either the end-cap 1000, or through the fiber 100' forms a non-axisymmetric laser beam which results in a non-axisymmetric spot 14.

Figure 9A:
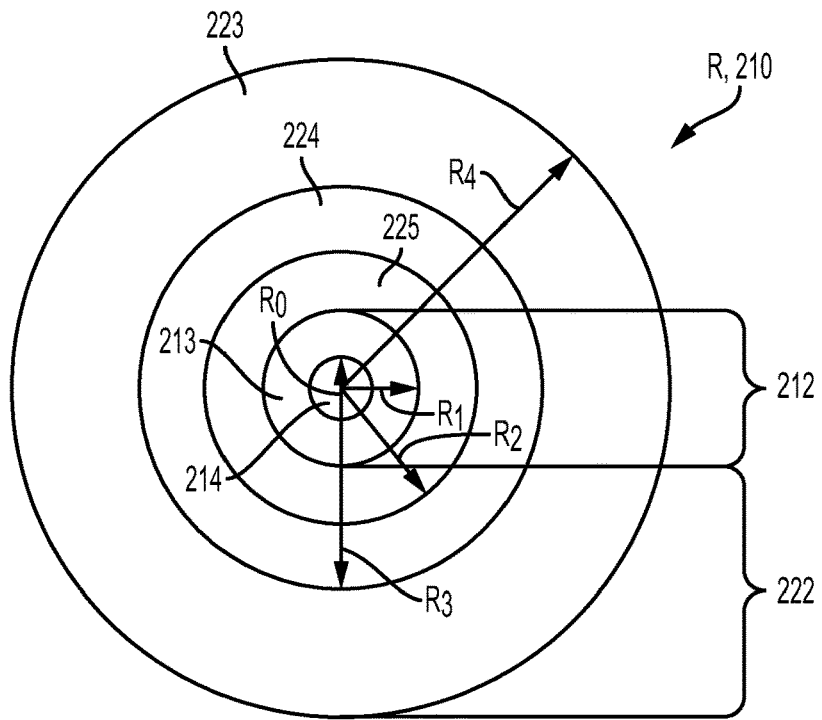
FIG. 9A schematically depicts a radial cross section of a first segment of the optical fiber of FIG. 4A to one or more embodiments shown and described herein.
Figure 10A:
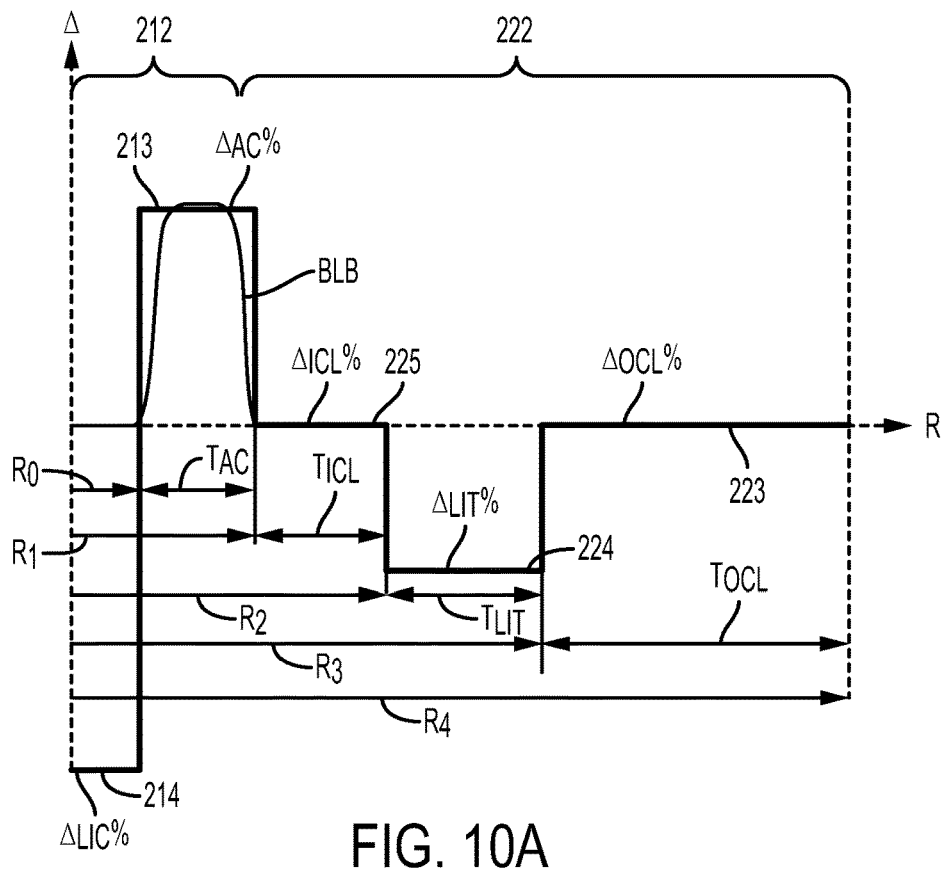
FIG. 10A graphically depicts the relative refractive index profile of the first segment of the optical fiber of FIG. 9A as a function of the radius R of the glass portion of the optical fiber according to one or more embodiments shown and described herein.
Figure 10B:
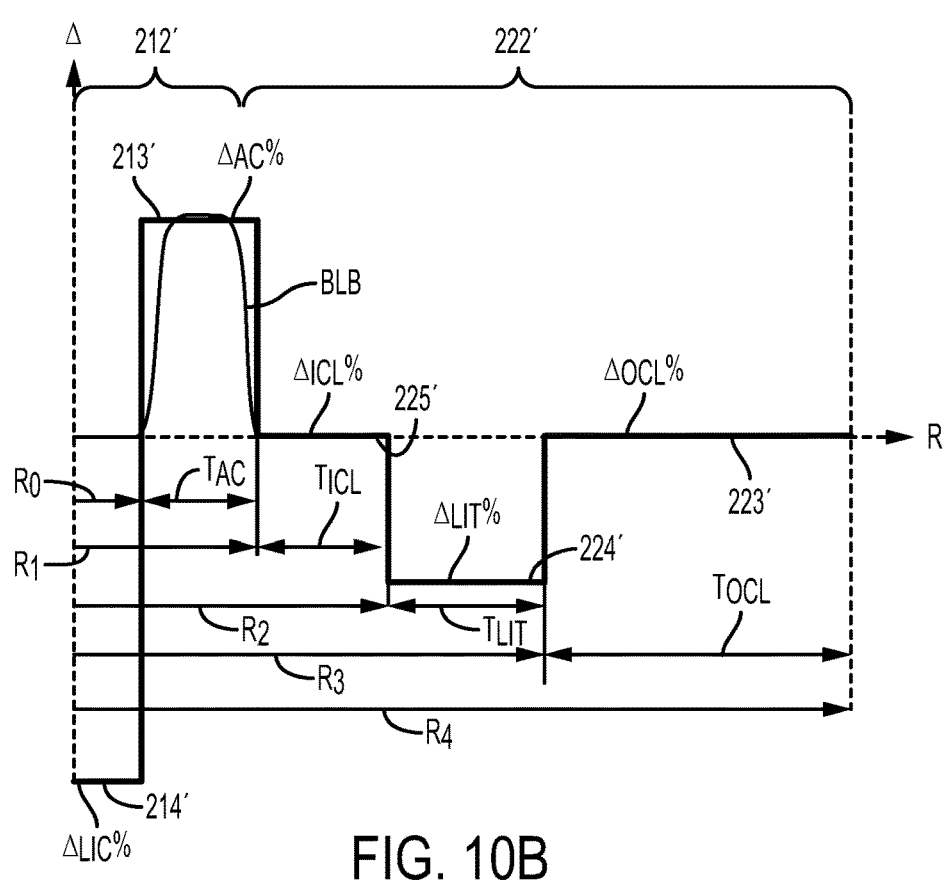
FIG. 10B graphically depicts the relative refractive index profile of the first segment of the optical fiber of FIG. 9B (in A-A cross-section) as a function of the radius R of the glass portion of the optical fiber according to one or more embodiments shown and described herein.
Figure 10C:
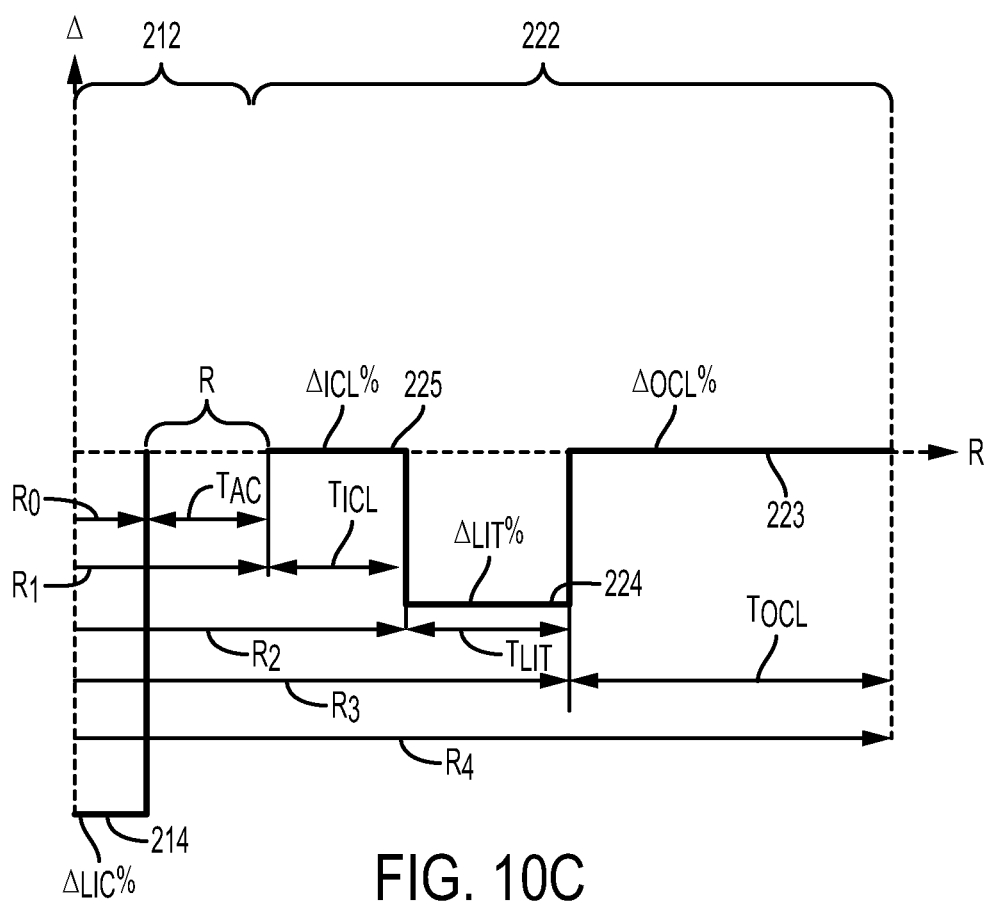
FIG. 10C graphically depicts the relative refractive index profile of the first segment of the optical fiber of FIG. 9B (in B-B cross-section) as a function of the radius R of the glass portion of the optical fiber according to one or more embodiments shown and described herein.
Figure 11A:
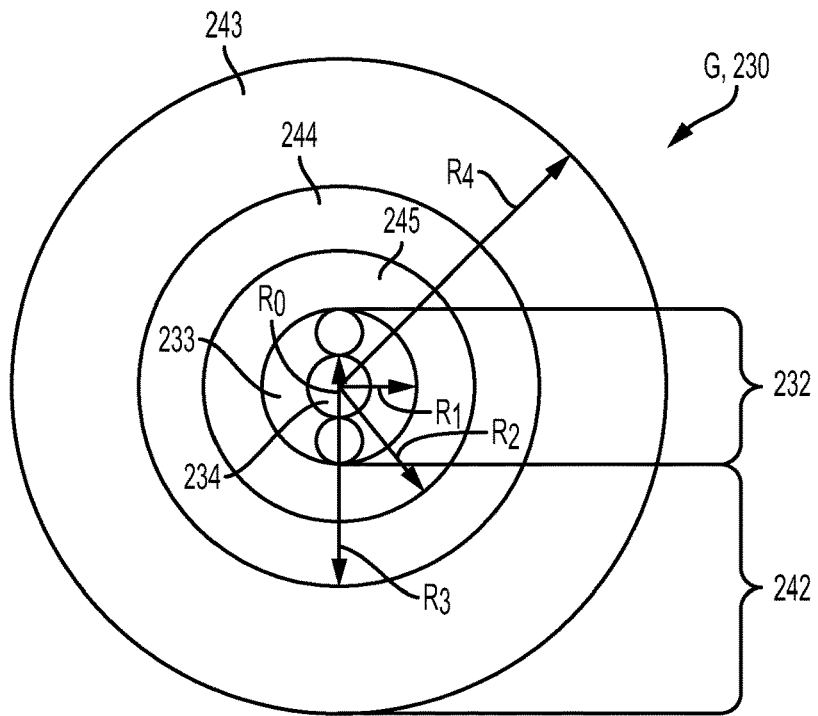
FIG. 11A schematically depicts a radial cross section of a second segment of the optical fiber of FIG. 4A according to one or more embodiments shown and described herein.
Figure 11B:
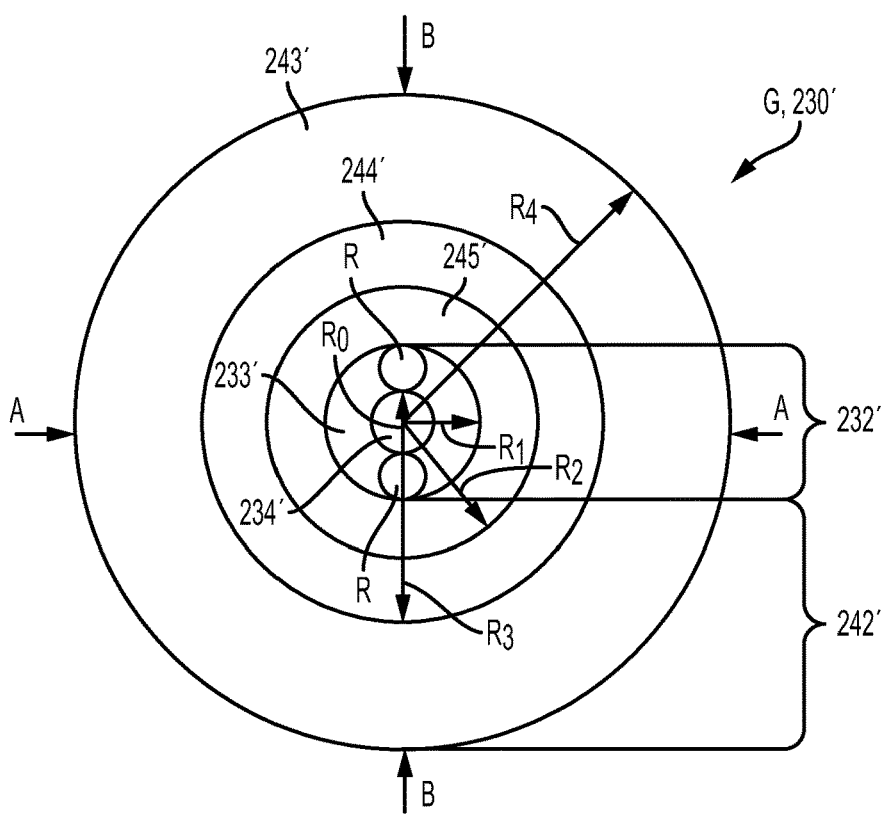
FIG. 11B schematically depicts a radial cross section of a second segment of the optical fiber of FIG. 4A according to one or more embodiments shown and described herein.
Figure 12A:
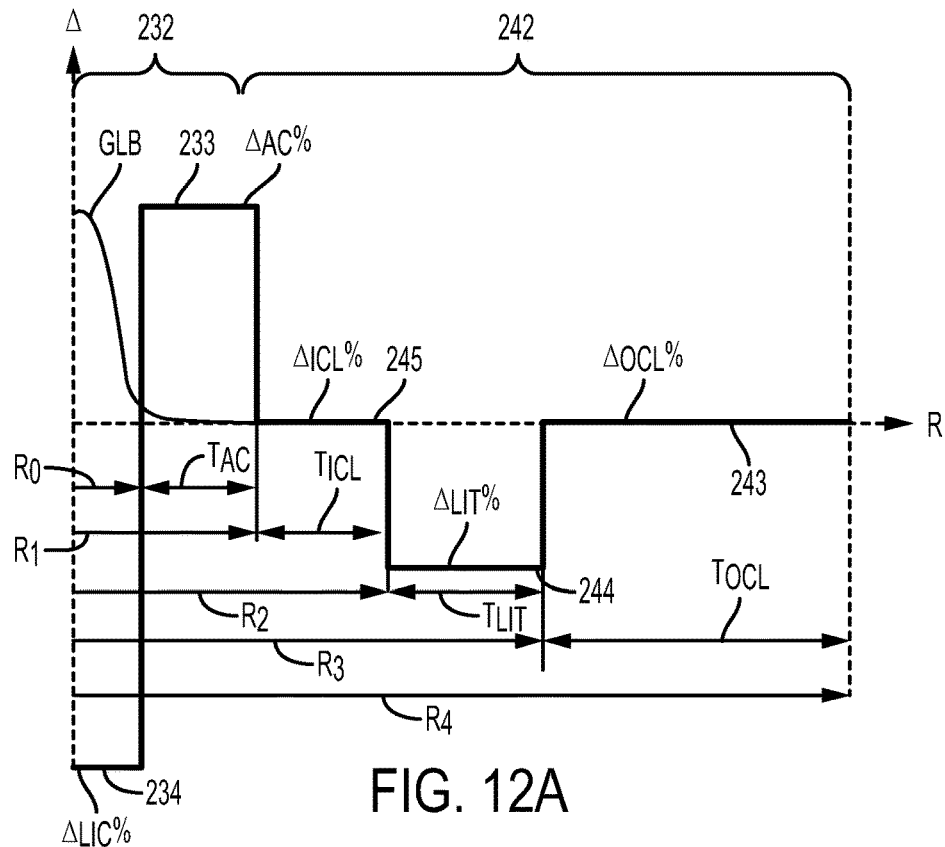
FIG. 12A graphically depicts the relative refractive index profile of the second segment of the optical fiber of FIG. 11A as a function of the radius r of the glass portion of the optical fiber according to one or more embodiments shown and described herein.

Referring to FIG. 4A and FIGS. 9A-12A, an embodiment of an optical fiber 200 with a first segment 210 optically coupled to a second segment 230 with a transition region 250 is shown. The optical fiber 200 may be similar to the optical fiber 100 except the first segment 210 (R-segment) may include a first core portion 212 with a first low-index core region 214, instead of an air channel, positioned within a first annular core region 213, and the second segment 230 (G-segment) may include a second core portion with a second low-index core region 234 positioned within a second annular core region 233. The first low-index core region 214 may a refractive index equal or less than the refractive index of the first inner cladding portion 225. For example, the core region 214 may be made of pure silica glass, an F-doped silica glass, or a boron-doped silica glass. A side view of at least a portion of the optical fiber 200 is shown in FIG. 4A, radial cross sections of the first segment 210 and the second segment 230 of the optical fiber 200 are shown in FIGS. 9A and 11A, respectively, and corresponding relative refractive index profiles for the first segment 210 and second segment 230 are shown in FIGS. 10A and 12A, respectively. The first segment 210 has a first outer diameter '$D_0$' and the second segment 230 has a second outer diameter '$d_0$' (FIG. 4A). The first outer diameter $D_0$ is greater than the second outer diameter $d_0$. In embodiments, the first outer diameter $D_0$ may be from about 0.2 millimeters (mm) to about 5.0 mm, the second outer diameter $d_0$ may be from about 0.1 to about 4.5 mm, and the length of the transition region 250 may be from about 0.5 mm to about 20 mm. In embodiments, the first outer diameter $D_0$ is from about 0.4 mm to about 1.0 mm, the second outer diameter $d_0$ is from about 0.2 mm to about 0.9 mm, and the length of the transition region 250 is from about 1 mm to about 10 mm. In other embodiments, the first outer diameter $D_0$ is from about 150 µm to about 250 µm, the second outer diameter $d_0$ is from about 75 µm to about 225 m, and the length of the transition region 250 is greater than 10 mm. A Gaussian laser beam GLB propagating through the second segment 230 is converted into ring-shaped beam propagating through the first segment 210. In embodiments, the first segment 210, second segment 230 and transition region 250 are integrally formed with one another and the taper ratio (do/Do) of the optical fiber 200 is greater than or equal to about 0.2 and less than or equal to about 0.9 (e.g., 0.2, 0.3, 0.4, 0.5, 0.5, 0.7, 0.8 0.9, or in therebetween). For example, in some embodiments, the taper ratio of the optical fiber 200 is greater than or equal to about 0.3 and less than or equal to 0.9. In still other embodiments, the taper ratio of the optical fiber 200 is greater than or equal to 0.3 and less than or equal to 0.8. The first segment 210 (FIGS. 9A and 10A) of the optical fiber 200 has a first core portion 212 centered on the axial centerline 2 of the optical fiber 200. The first core portion 212 may include a first annular core region 213. A first cladding portion 222 may extend around the first core portion 212. The second segment 230 (FIGS. 11A and 12A) of the optical fiber 200 may have a second core portion 232 and at least a portion of the second core portion 232 is optically coupled to the first core portion 212. A second cladding portion 242 may extend around the second core portion 232.

Referring to FIGS. 4A, 9A and 10A, a radial cross section of the first segment 210 of the optical fiber 200 of FIG. 4A is schematically depicted in FIG. 9A and the relative refractive index of the radial cross section relative to the centerline of the cross section is graphically depicted in FIG. 10A. The first segment 210 generally includes a first core portion 212 and a first cladding portion 222. The first core portion 212 is positioned within the first cladding portion 222 with the first cladding portion 222 extending around the first core portion 212. The first core portion 212 and the first cladding portion 222 may be generally concentric such that a cross section of the first segment 210 of the optical fiber 200 is generally circular symmetric with respect to the center of the first core portion 212 of the optical fiber 200. Also, the first core portion 212 and the first cladding portion 222 may be generally axisymmetric with respect to the center of the first core portion 212 of the optical fiber 200. In embodiments, the first core portion 212 may include a first annular core region 213 and a first low-index core region 214. The first low-index core region 214 is positioned within the first annular core region 213 and the first low-index core region 214 is directly adjacent to and in direct contact with the first annular core region 213.

In some embodiments, the first cladding portion 222 may optionally include a first low-index trench 224 and a first outer cladding portion 223. The first low-index trench 224 is positioned within the first outer cladding 223 and the first low-index trench 224 may be directly adjacent to and in direct contact with the first outer cladding 223. The first low-index trench 224, when included, improves the bend performance of the optical fiber 200. That is, the first low-index trench 224 reduces attenuation of light propagating in the optical fiber 200 when the optical fiber 200 is coiled, thereby permitting the optical fiber 200 to be coiled to a tighter (i.e., smaller) radius without increasing the attenuation of light propagating in the optical fiber 200 relative to an optical fiber having a similar structure without the first low-index trench 224.

In some embodiments (not depicted), the first low-index trench 224 may be directly adjacent to and in direct contact with the first core portion 212. In some other embodiments, such as the embodiment depicted in FIGS. 9A and 10A, the first low-index trench 224 may be spaced apart from the first core portion 212 by a first inner cladding portion 225, i.e., the first inner cladding portion 225 is positioned within the first low-index trench 224 between the first low-index trench 224 and the first core portion 212. In embodiments, the first inner cladding portion 225 is directly adjacent to and in direct contact with the first low-index trench 224 and the first annular core region 213.

The first segment 210 has a radius $R_4$ from the axial centerline 2 of the optical fiber 200. The first core portion 212 has a radius $R_1$ that is less than the radius $R_4$. The first low-index core region 214 of the first core portion 212 has a radius $R_0$ that is less than the radius $R_1$. The first annular core region 213 has an inner radius $R_0$, an outer radius $R_1$ and a radial thickness $T_{AC}=R_1-R_0$. The radii $R_0$ and $R_1$ of the first low-index core region 214 and first annular core region 213, respectively, are defined at the points at which the lines tangent to the maximum slopes of the relative refractive index profile (FIG. 10A) of the first low-index core region 214 and first annular core region 213, respectively, cross the reference relative refractive index line $\Delta_{OCL}$%. The first cladding portion 222 has an inner radius $R_1$, an outer radius $R_4$ and a radial thickness $T_{CL}=R_4-R_1$. In embodiments where the first cladding portion 222 includes the first low-index trench 224 and the first outer cladding portion 223, the first low-index trench 224 has an inner radius $R_2$, an outer radius $R_3$ and a radial thickness $T_{LIT}=R_3-R_2$. The first outer cladding portion 223 has an inner radius $R_3$, an outer radius $R_4$ and a radial thickness $T_{OCL}=R_4-R_3$. In embodiments (not depicted) where the first low-index trench 224 is directly adjacent to and in direct contact with the first core portion 212, the inner radius $R_2$ of the first low-index trench 224 may be equal to the radius $R_1$ of the first core portion 212. In embodiments where the first low-index trench 224 is spaced apart from the first core portion 212 by the first inner cladding portion 225, the first inner cladding portion 225 has an inner radius $R_1$, an outer radius $R_2$ and a radial thickness $T_{ICL}=R_2-R_1$.

The radius $R_4$ of the first segment 210 is from about 50 µm to about 250 µm. In some embodiments, the radius $R_4$ of the first segment 210 is from about 100 µm to about 150 µm. The radius $R_1$ of the first core portion 212 is from about 5 µm to about 25 µm. In some embodiments, the radius $R_1$ is from about 7.5 µm to about 15 µm. The radius $R_0$ of the first low-index core region 214 is from about 1 µm to about 10 µm. In some embodiments, the radius $R_0$ of the first low-index core region 214 is from about 2 µm to about 7 µm. The radial thickness $T_{AC}$ ($R_1-R_0$) of the first annular core region 213 is from about 2 µm to about 15 µm. In some embodiments the radial thickness $T_{AC}$ is from about 5 µm to about 10 µm. The radial thickness $T_{CL}$ ($R_4-R_1$) of the first cladding portion 222 is from about 75 µm to about 175 µm. In some embodiments the radial thickness $T_{CL}$ is from about 90 µm to about 125 µm. In embodiments where the first cladding portion 222 includes the first low-index trench 224 and the first outer cladding portion 223, the inner radius $R_2$ of the first low-index trench 224 is from about 5 µm to about 50 µm, the outer radius $R_3$ is from about 7 µm to about 50 µm and the radial thickness $T_{LIT}$ ($R_3-R_2$) is from about 1 µm to about 20 µm. In embodiments, the inner radius $R_2$ is from about 10 µm to about 30 µm, the outer radius $R_3$ is from about 10 µm to about 40 µm and the radial thickness $T_{LIT}$ is from about 1 µm to about 15 µm. The inner radius $R_3$ of the first outer cladding portion 223 is from about 7 µm to about 50 µm, the outer radius $R_4$ is from about 50 µm to about 250 µm and the radial thickness $T_{OCL}$ ($R_4-R_3$) is from about 75 µm to about 150 µm. In embodiments, the inner radius $R_3$ is from about 10 µm to about 40 µm, the outer radius $R_4$ is from about 100 µm to about 150 µm and the radial thickness $T_{OCL}$ is from about 85 µm to about 125 µm. In embodiments where the first low-index trench 224 is spaced apart from the first core portion 212 by the first inner cladding portion 225, the inner radius $R_1$ of the first inner cladding portion 225 is from about 5 µm to about 25 µm, the outer radius $R_2$ is from about 5 µm to about 50 µm and the radial thickness $T_{ICL}$ ($R_2-R_1$) is from about 1 µm to about 15.0 µm. In embodiments, the inner radius $R_1$ is from about 7.5 µm to about 15 µm, the outer radius $R_2$ is from about 10 µm to about 30 µm and the radial thickness $T_{ICL}$ is from about 1 µm to about 10 µm.

Referring to FIGS. 4A, 11A and 12A, a radial cross section of the second segment 230 of the optical fiber 200 of FIG. 4A is schematically depicted in FIG. 11A and the relative refractive index of the radial cross section relative to the centerline of the cross section is graphically depicted in FIG. 12A. The second segment 230 generally includes a second core portion 232 and a second cladding portion 242. The second core portion 232 is positioned within the second cladding portion 242 with the second cladding portion 242 extending around the second core portion 232. The second core portion 232 and the second cladding portion 242 may be generally concentric such that a cross section of the second segment 230 of the optical fiber 200 is generally circular symmetric with respect to the center of the second core portion 232 of the optical fiber 200. Also, the second core portion 232 and the second cladding portion 242 may be generally axisymmetric with respect to the center of the second core portion 232 of the optical fiber 200. In embodiments, the second core portion 232 may include a second annular core region 233 and a second low-index core region 234. The second low-index core region 234 is positioned within the second annular core region 233 and the second low-index core region 234 is directly adjacent to and in direct contact with the second annular core region 233.

In some embodiments, the second cladding portion 242 may optionally include a second low-index trench 244 and a second outer cladding portion 243. The second low-index trench 244 is positioned within the second outer cladding 243 and the second low-index trench 244 may be directly adjacent to and in direct contact with the second outer cladding 243. The second low-index trench 244, when included, improves the bend performance of the optical fiber 200. That is, the second low-index trench 244 reduces attenuation of light propagating in the optical fiber 200 when the optical fiber 200 is coiled, thereby permitting the optical fiber 200 to be coiled to a tighter (i.e., smaller) radius without increasing the attenuation of light propagating in the optical fiber 200 relative to an optical fiber having a similar structure without the second low-index trench 244. It should be understood that, when the first segment 210 of the optical fiber 200 includes the first low-index trench 224, the second segment 230 of the optical fiber 200 will include a second low-index trench 244 and vice-versa.

In some embodiments (not depicted), the second low-index trench 244 may be directly adjacent to and in direct contact with the second core portion 232. In some other embodiments, the second low-index trench 244 may be spaced apart from the second core portion 232 by a second inner cladding portion 245 as depicted in FIGS. 11A and 12A. That is, the second inner cladding portion 245 is positioned within the second low-index trench 244 and is positioned between the second low-index trench 244 and the second core portion 232. In embodiments, the second inner cladding portion 245 is directly adjacent to and in direct contact with the second low-index trench 244 and the second annular core region 233.

Referring to FIGS. 4A and 9A-12A, it should be appreciated that the first core portion 212 is optically coupled with the second core portion 232 and the first cladding portion 222 is optically coupled to the second cladding portion 242 through the transition region 250. Particularly, the first low-index core region 214 is optically coupled to the second low-index core region 234, the first annular core region 213 is optically coupled to the second annular core region 233, the first outer cladding portion 223 is optically coupled to the second outer cladding portion 243, the first low-index trench 224 is optically coupled to the second low-index trench 244, and the first inner cladding portion 225 is optically coupled to the second inner cladding portion 245 through the transition region 250.

The second segment 230 has a radius $r_4$ from the axial centerline 2 of the optical fiber 200. The second core portion 232 has a radius $r_1$ that is less than the radius $r_4$. The second low-index core region 234 of the second core portion 232 has a radius $r_0$ that is less than the radius $r_1$. The second annular core region 233 has an inner radius $r_0$, an outer radius $r_1$ and a radial thickness $t_{ac}=r_1-r_0$. The radii $r_0$ and $r_1$ of the second low-index core region 234 and second annular core region 233 are defined at the points at which the lines tangent to the maximum slope of the relative refractive index profile (FIG. 12A) of the second low-index core region 234 and second annular core region 233, respectively, cross the reference relative refractive index line $\Delta_{ocl}\%$. The second cladding portion 242 has an inner radius $r_1$, an outer radius $r_4$ and a radial thickness $t_{cl}=r_4-r_1$. In embodiments where the second cladding portion 242 includes the second low-index trench 244 and the second outer cladding portion 243, the second low-index trench 244 has an inner radius $r_2$, an outer radius $r_3$ and a radial thickness $t_{lit}=r_3-r_2$. The second outer cladding portion 243 has an inner radius $r_3$, an outer radius $r_4$ and a radial thickness $t_{ocl}=r_4-r_3$. In embodiments (not depicted) where the second low-index trench 244 is directly adjacent to and in direct contact with the second core portion 232, the inner radius $r_2$ of the second low-index trench 244 may be equal to the radius $r_1$ of the second core portion 232. In embodiments where the second low-index trench 244 is spaced apart from the second core portion 232 by the second inner cladding portion 245, the second inner cladding portion 245 has an inner radius $r_1$, an outer radius $r_2$ and a radial thickness $t_{icl}=r_2-r_1$.

The radius $r_4$ of the second segment 230 is from about 20 μm to about 100 μm. In some embodiments, the radius $r_4$ of the second segment 230 is from about 30 μm to about 70 μm. The radius $r_1$ of the second core portion 232 is from about 1 μm to about 10 μm. In some embodiments, the radius $r_1$ is from about 2.5 μm to about 7.5 μm. The radial thickness $t_{cl}$ ($r_4-r_1$) of the second cladding portion 242 is from about 20 μm to about 80 μm. In some embodiments the radial thickness $t_{cl}$ is from about 35 μm to about 60 μm. In embodiments where the second cladding portion 242 includes the second low-index trench 244 and the second outer cladding portion 243, the inner radius $r_2$ of the second low-index trench 244 is from about 2 μm to about 15 μm, the outer radius $r_3$ is from about 2 μm to about 25 μm and the radial thickness $t_{lit}$ ($r_3-r_2$) is from about 1 μm to about 10 μm. In embodiments, the inner radius $r_2$ is from about 3 μm to about 10 μm, the outer radius $r_3$ is from about 3 μm to about 20 μm and the radial thickness $t_{lit}$ is from about 1 μm to about 8 μm. The inner radius $r_3$ of the second outer cladding portion 243 is from about 2 μm to about 25 μm, the outer radius $r_4$ is from about 20 μm to about 100 μm and the radial thickness $t_{ocl}$ ($r_4-r_3$) is from about 25 μm to about 75 μm. In embodiments, the inner radius $r_3$ is from about 3 μm to about 20 μm, the outer radius $r_4$ is from about 30 μm to about 70 μm and the radial thickness $t_{ocl}$ is from about 30 μm to about 50 μm. In embodiments where the second low-index trench 244 is spaced apart from the second core portion 232 by the second inner cladding portion 245, the inner radius $r_1$ of the second inner cladding portion 245 is from about 1 μm to about 10 μm, the outer radius $r_2$ is from about 2 μm to about 15 μm and the radial thickness $t_{icl}$ ($r_2-r_1$) is from about 1 μm to about 8 μm. In embodiments, the inner radius $r_1$ is from about 2.5 μm to about 7.5 μm, the outer radius $r_2$ is from about 3 μm to about 10 μm and the radial thickness $t_{icl}$ is from about 1 μm to about 4 μm.

The first low-index core region 214 of the first segment 210 has a refractive index $n_{LIC}$ and a relative refractive index $\Delta_{LIC}\%$, and the second low-index core region 234 of the second segment 230 has a refractive index $n_{lic}$ and a relative refractive index $\Delta_{lic}\%$. In embodiments, the first low-index core region 214 and the second low-index core region 234 are made from the same material and the relative refractive index $\Delta_{LIC}\%$ is substantially equal to the relative refractive index $\Delta_{lic}\%$ (i.e., $\Delta_{LIC}\%=\Delta_{lic}\%$). The relative refractive index $\Delta_{LIC}\%$ and the relative refractive index $\Delta_{lic}\%$ are from about 0.2% to about −1.0%. In embodiments, the relative refractive index $\Delta_{LIC}\%$ and the relative refractive index $\Delta_{lic}\%$ are from about 0.1% to about −0.5%.

The first annular core region 213 has a refractive index $n_{AC}$ and a relative refractive index $\Delta_{AC}\%$, and the second annular core region 233 has a refractive index $n_{ac}$ and a relative refractive index $\Delta_{ac}\%$. In embodiments, the first annular core region 213 and the second annular core region 233 are made from the same material and the relative refractive index $\Delta_{AC}\%$ is substantially equal to the relative refractive index $\Delta_{ac}\%$ (i.e., $\Delta_{AC}\%=\Delta_{ac}\%$). The relative refractive index $\Delta_{AC}\%$ and the relative refractive index $\Delta_{ac}\%$ are greater than the relative refractive index $\Delta_{LIC}\%$ and the relative refractive index $\Delta_{lic}\%$, respectively (i.e., $\Delta_{AC}\%>\Delta_{LIC}\%$; $\Delta_{ac}\%>\Delta_{lic}\%$). In embodiments where the first low-index core region 214 and the second low-index core region 234 are made from the same material, and the first annular core region 213 and the second annular core region 233 are made from the same material, $\Delta_{AC}\%>\Delta_{lic}\%$ and $\Delta_{ac}\%>\Delta_{LIC}\%$. The relative refractive index $\Delta_{AC}\%$ and the relative refractive index $\Delta_{ac}\%$ are from about 0.2% to about 1.0%. In embodiments, the relative refractive index $\Delta_{AC}\%$ and the relative refractive index $\Delta_{ac}\%$ are from about 0.3% to about 0.75%.

The first cladding portion 222 has a refractive index $n_{CL}$ and a relative refractive index $\Delta_{CL}\%$ relative to pure silica glass. The refractive index $n_{CL}$ of the first cladding portion 222 may be used as the reference for the relative refractive indices of the other glass portions of the first segment 210 of the optical fiber 200. In embodiments where the first cladding portion 222 includes a first outer cladding portion 223, a first low-index trench 224, and (optionally) a first inner cladding portion 225, the relative refractive indices of the other glass portions of the first segment 210 of the optical fiber 200 are determined relative to the first outer cladding portion 223, as described in further detail herein.

In embodiments where the first cladding portion 222 includes the first inner cladding portion 225 and the first low-index trench 224, the first inner cladding portion 225 has a refractive index $n_{ICL}$ and a relative refractive index $\Delta_{ICL}\%$, and the first low-index trench 224 has a refractive index $n_{LIT}$ and a relative refractive index $\Delta_{LIT}\%$. The relative refractive index $\Delta_{ICL}\%$ is generally greater than the relative refractive index $\Delta_{LIT}\%$ and generally less than the relative refractive index $\Delta_{AC}\%$ (i.e., $\Delta_{AC}\%>\Delta_{ICL}\%>\Delta_{LIT}\%$) as generally depicted in FIG. 10A. The relative refractive index $\Delta_{ICL}\%$ is from about −0.1% to about 0.1% and the relative refractive index $\Delta_{LIT}\%$ is from about −0.1% to about −1.0%. In embodiments, the relative refractive index $\Delta_{ICL}\%$ is from about −0.05% to about 0.05% and the relative refractive index $\Delta_{LIT}\%$ is from about −0.3% to about −0.5%.

The second cladding portion 242 has a refractive index $n_{cl}$ and a relative refractive index $\Delta_{cl}\%$ relative to pure silica glass. The refractive index $n_{cl}$ of the second cladding portion 242 may be used as the reference for the relative refractive indices of the other glass portions of the second segment 230 of the optical fiber 200. In embodiments where the second cladding portion 242 includes a second outer cladding portion 243, a second low-index trench 244, and (optionally) a second inner cladding portion 245, the relative refractive indices of the other glass portions of the second segment 230 of the optical fiber 200 are determined relative to the second outer cladding portion 243, as described in further detail herein.

In embodiments where the second cladding portion 242 includes the second inner cladding portion 245 and the second low-index trench 244, the second inner cladding portion 245 has a refractive index $n_{icl}$ and a relative refractive index $\Delta_{icl}\%$, and the second low-index trench 244 has a refractive index $n_{lit}$ and a relative refractive index $\Delta_{lit}\%$. The relative refractive index $\Delta_{icl}\%$ is generally greater than the relative refractive index $\Delta_{lit}\%$ and generally less than the relative refractive index $\Delta_{ac}\%$ (i.e., $\Delta_{ac}\%>\Delta_{icl}\%>\Delta_{lit}\%$) as generally depicted in FIG. 12A. In embodiments, the second inner cladding portion 245 is made from the same material as the first inner cladding 225 and the second low-index trench 244 is made from the same material as the first low-index trench 224. Accordingly, the refractive indices $n_{icl}$ and $n_{lit}$ may be substantially equal to the refractive indices, $n_{ICL}$ and $n_{LIT}$, respectively (i.e., $n_{icl}=n_{ICL}$; $n_{lit}=n_{LIT}$), and the relative refractive indices $\Delta_{icl}\%$ and $\Delta_{lit}\%$ may be substantially equal to the relative refractive indices $\Delta_{ICL}\%$ and $\Delta_{LIT}\%$, respectively (i.e., $\Delta_{icl}\%=\Delta_{ICL}\%$; $\Delta_{lit}\%=\Delta_{LIT}\%$). For example, the relative refractive index $\Delta_{icl}\%$ may be from about −0.1% to about 0.1% and the relative refractive index $\Delta_{lit}\%$ may be from about 0.1% to about −1.0%. In embodiments, the relative refractive index $\Delta_{icl}\%$ may be from about −0.05% to about 0.05% and the relative refractive index $\Delta_{lit}\%$ may be from about −0.3% to about −0.5%.

In embodiments where the first cladding portion 222 includes the first outer cladding portion 223, the first outer cladding portion 223 has a refractive index $n_{OCL}$ and a relative refractive index $\Delta_{OCL}\%$. In these embodiments, the relative refractive index $\Delta_{OCL}\%$ may be used as the reference for determining the relative refractive indices of the other glass portions of the first segment 210 of the optical fiber 200. In the embodiments described herein, the relative refractive index $\Delta_{OCL}\%$ of the first outer cladding portion 223 is greater than the relative refractive index $\Delta_{LIT}\%$ of the first low-index trench 224 (i.e., $\Delta_{OCL}\%>\Delta_{LIT}\%$). In some embodiments, the relative refractive index $\Delta_{OCL}\%$ of the first outer cladding portion 223 may be greater than the relative refractive index $\Delta_{ICL}\%$ of the first inner cladding portion 225, such as when the first inner cladding portion 225 comprises silica glass down-doped with one or more down-dopants which decrease the index of refraction $n_{ICL}$ of the first inner cladding portion 225 relative to the index of refraction $n_{OCL}$ of the first outer cladding portion 223. In other embodiments, the relative refractive index $\Delta_{OCL}\%$ of the first outer cladding portion 223 may be substantially equal to the relative refractive index $\Delta_{ICL}\%$ of the first inner cladding portion 225. In such embodiments, the composition of the first outer cladding portion 223 may be the same as the composition of the first inner cladding portion 225 or different than the composition of the first inner cladding portion 225, so long as $\Delta_{OCL}\%=\Delta_{ICL}\%$. Based on the foregoing, it should be understood that the relative refractive index $\Delta_{OCL}\%$ of the first outer cladding portion 223 is greater than or substantially equal to the relative refractive index $\Delta_{ICL}\%$ of the first inner cladding portion 225.

In embodiments where the second cladding portion 242 includes the second outer cladding portion 243, the second outer cladding portion 243 has a refractive index $n_{ocl}$ and a relative refractive index $\Delta_{ocl}\%$. Accordingly, the relative refractive index $\Delta_{ocl}\%$ may be used as the reference for the relative refractive indices of the other glass portions of the second segment 230 of the optical fiber 200. In the embodiments described herein, the relative refractive index $\Delta_{ocl}\%$ of the second outer cladding portion 243 is greater than the relative refractive index $\Delta_{lit}\%$ of the second low-index trench 244 (i.e., $\Delta_{ocl}\%>\Delta_{lit}\%$). In some embodiments, the relative refractive index $\Delta_{ocl}\%$ of the second outer cladding portion 243 may be greater than the relative refractive index $\Delta_{icl}\%$ of the second inner cladding portion 245, such as when the second inner cladding portion 245 comprises silica glass down-doped with one or more down-dopants which decrease the index of refraction $n_{icl}$ of the second inner cladding portion 245 relative to the index of refraction $n_{ocl}$ of the second outer cladding portion 243. In other embodiments, the relative refractive index $\Delta_{ocl}\%$ of the second outer cladding portion 243 may be substantially equal to the relative refractive index $\Delta_{icl}\%$ of the second inner cladding portion 245. In such embodiments, the composition of the second outer cladding portion 243 may be the same as the composition of the second inner cladding portion 245 or different than the composition of the second inner cladding portion 245, so long as $\Delta_{ocl}\%=\Delta_{icl}\%$. Based on the foregoing, it should be understood that the relative refractive index $\Delta_{ocl}\%$ of the second outer cladding portion 243 is greater than or substantially equal to the relative refractive index $\Delta_{icl}\%$ of the second inner cladding portion 245. In embodiments, the second outer cladding portion 243 is made from the same material as the first outer cladding portion 223, and as such, the refractive index $n_{ocl}$ of the second outer cladding portion 243 may be substantially equal to the refractive index $n_{OCL}$ of the first outer cladding portion 223 (i.e., $n_{ocl}=n_{OCL}$) and the relative refractive index $\Delta_{ocl}\%$ of the second outer cladding portion 243 may be substantially equal to the relative refractive index $\Delta_{OCL}\%$ of the first outer cladding portion 223, (i.e., $\Delta_{ocl}\%=\Delta_{OCL}\%=0$).

The first low-index core region 214 of the first segment 210 and the second low-index core region 234 of the second segment 230 comprise silica glass with one or more down-dopants which decrease the index of refraction of silica glass, for example and without limitation, F, B, combinations thereof, or the like. In embodiments, at least one of the first low-index core region 214 and the second low-index core region 234 may comprise F in a concentration between about 0.1 wt. % to about 2.5 wt. %. In some embodiments, at least one of the first low-index core region 214 and the second low-index core region 234 comprise F in a concentration between about 0.1 wt. % to about 1.8 wt. %. In some other embodiments, at least one of the first low-index core region 214 and the second low-index core region 234 comprise F in a concentration between about 0.1 wt. % to about 1.5 wt. %. In still other embodiments, at least one of the first low-index core region 214 and the second low-index core region 234 comprise F in a concentration between about 0.5 wt. % to about 1.8 wt. %. In still yet other embodiments, at least one of the first low-index core region 214 and the second low-index core region 234 comprise F in a concentration between about 0.7 wt. % to about 1.8 wt. %.

The first annular core region 213 of the first segment 210 and the second annular core region 233 of the second segment 230 comprise silica glass with one or more up-dopants which increase the index of refraction of silica glass. Suitable up-dopants include, for example and without limitation, Ge, Ti, Al, Cl, P, $GeO_2$, $TiO_2$, $P_2O_5$, and various combinations thereof. In embodiments, at least one of the first annular core region 213 and the second annular core region 233 contain between about 3 wt. % to about 17 wt. % $GeO_2$. In some other embodiments, at least one of the first annular core region 213 and the second annular core region 233 contain between about 5 wt. % to about 13 wt. % $GeO_2$. In embodiments, the first annular core region 213 and the second annular core region 233 are made from the same materials and the dopant concentration in the first annular core region 213 is substantially equal to the dopant concentration in the second annular core region 233.

The first inner cladding 225 of the first segment 210 and the second inner cladding portion 245 of the second segment 230 may comprise pure silica glass, silica glass with one or more up-dopants which increase the index of refraction of silica glass, or silica glass with one or more down-dopants that decrease the index of refraction of silica glass. Non-limiting examples of suitable up-dopants include Ge, Ti, Al, Cl, P, $GeO_2$, $TiO_2$, $P_2O_5$, combinations thereof or the like. In embodiments, at least one of the first inner cladding 225 and the second inner cladding 245 contain Cl as an up-dopant. Non-limiting examples of suitable down-dopants include F, B, combinations thereof, or the like. In embodiments, at least one of the first inner cladding 225 and the second inner cladding 245 contain F as a down-dopant.

As discussed in relation to expressions (32) and (33) above, the radial thickness of a particular glass portion of an optical fiber may be interrelated with a relative refractive index of the particular glass portion. In the embodiments described herein, the trench volume $V_{LIT}$ of the first low-index trench 224 may be greater than or equal to about 80%-$\mu m^2$, such as greater than or equal to about 100%-$\mu m^2$. In some embodiments, the trench volume $V_{LIT}$ may be greater than or equal to about 110%-$\mu m^2$ or even greater than or equal to about 120%-$\mu m^2$. In some embodiments, the trench volume $V_{LIT}$ may be greater than or equal to about 80%-$\mu m^2$ and less than or equal to about 220%-$\mu m^2$. In some embodiments, the trench volume $V_{LIT}$ may be greater than or equal to about 100%-$\mu m^2$ and less than or equal to about 200%-$\mu m^2$. In still other embodiments, the trench volume profile $V_{LIT}$ may be greater than or equal to about 110%-$\mu m^2$ and less than or equal to about 180%-$\mu m^2$.

In the embodiments described herein, the trench volume $v_{lit}$ of the second low-index trench 244 may be greater than or equal to about 40%-$\mu m^2$, such as greater than or equal to about 50%-$\mu m^2$. In some embodiments, the trench volume $v_{lit}$ may be greater than or equal to about 55%-$\mu m^2$ or even greater than or equal to about 60%-$\mu m^2$. In some embodiments, the trench volume $v_{lit}$ may be greater than or equal to about 40%-$\mu m^2$ and less than or equal to about 110%-$\mu m^2$. In some embodiments, the trench volume $v_{lit}$ may be greater than or equal to about 50%-$m^2$ and less than or equal to about 100%-$\mu m^2$. In still other embodiments, the trench volume profile $v_{lit}$ may be greater than or equal to about 55%-$\mu m^2$ and less than or equal to about 90%-$\mu m^2$.

In the embodiments of the optical fibers described herein, the first low-index trench 224, the second low-index trench 244, or both the first low-index trench 224 and the second low-index trench 244, comprise silica glass with one or more down-dopants which decrease the index of refraction of silica glass. Non-limiting examples of down-dopants include F, B, combinations thereof, or the like. In embodiments, at least one of the first low-index trench 224 and the second low-index trench 244 comprise F in a concentration between about 0.1 wt. % to about 2.5 wt. %. In some embodiments, at least one of the first low-index trench 224 and the second low-index trench 244 comprise F in a concentration between about 0.1 wt. % to about 1.8 wt. %. In other embodiments, at least one of the first low-index trench 224 and the second low-index trench 244 comprise F in a concentration between about 0.1 wt. % to about 1.5 wt. %. In still other embodiments, at least one of the first low-index trench 224 and the second low-index trench 244 comprise F in a concentration between about 0.5 wt. % to about 1.8 wt. %. In still yet other embodiments, at least one of the first low-index trench 224 and the second low-index trench 244 comprise F in a concentration between about 0.7 wt. % to about 1.8 wt. %.

In some embodiments, at least one of the relative refractive index $\Delta_{LIC}\%$ of the first low-index core region 214, the relative refractive index $\Delta_{LIT}\%$ of the first low-index trench 224, the relative refractive index $\Delta_{lic}\%$ of the second low-index core region 234 and the relative refractive index $\Delta_{lit}\%$ of the second low-index trench 244 is achieved by forming the silica glass of at least one of the first low-index core region 214, the first low-index trench 224, the second low-index core region 234 and the second low-index trench 244, respectively, with voids which are either non-periodically disposed, or periodically disposed, or both, throughout the silica glass. The voids are stretched (elongated) along the length (i.e. parallel to the longitudinal axis) of the optical fiber 200, but do not extend the entire length of the entire fiber. While not wishing to be bound by theory, it is believed that the voids extend less than a few meters, and in many cases less than 1 meter along the length of the fiber. Optical fiber disclosed herein can be made by methods which utilize preform consolidation conditions which are effective to result in a significant amount of gases being trapped in the consolidated glass blank, thereby causing the formation of voids in the consolidated glass optical fiber preform. Rather than taking steps to remove these voids, the resultant preform is used to form an optical fiber with voids therein. In some embodiments, these voids may contain one or more gases, such as argon, krypton, $CO_2$, $SO_2$, $O_2$, or mixtures thereof. In some other embodiments, the voids are substantially free of gas. Regardless of the presence or absence of gas, at least one of the refractive index $n_{LIC}$ of the first low-index core region 214, the refractive index $n_{LIT}$ of the first low-index trench 224, the refractive index $n_{lic}$ of the second low-index core region 234 and the refractive index $n_{lit}$ of the second low-index trench 244 are decreased due to the presence of the voids. Alternatively or additionally, at least one of the $n_{LIC}$ of the first low-index core region 214, the refractive index $n_{LIT}$ of the first low-index trench 224, the refractive index $n_{lic}$ of the second low-index core region 234 and the refractive index $n_{lit}$ of the second low-index trench 244 is decreased by forming a down-doped silica glass with a non-periodic, periodic, or both a non-periodic and periodic distribution of voids, as described herein.

The relative refractive index $\Delta_{LIT}\%$ of the first low-index trench 224 is less than the relative refractive index $\Delta_{ICL}\%$ of the first inner cladding portion 225 (i.e., $\Delta_{LIT}\% < \Delta_{ICL}\%$) and less than the relative refractive index $\Delta_{OCL}\%$ of the first outer cladding portion 223 (i.e., $\Delta_{LIT}\% < \Delta_{OCL}\%$). In some embodiments, the relative refractive index $\Delta_{ICL}\%$ is substantially equal to the relative refractive index $\Delta_{OCL}\%$ and $\Delta_{LIT}\% < \Delta_{ICL}\% = \Delta_{OCL}\%$. In other embodiments, the relative refractive index $\Delta_{ICL}\%$ is less than the relative refractive index $\Delta_{OCL}\%$ and $\Delta_{LIT}\% < \Delta_{ICL}\% < \Delta_{OCL}\%$.

The relative refractive index $\Delta_{lit}\%$ of the second low-index trench 244 is less than the relative refractive index $\Delta_{icl}\%$ of the second inner cladding portion 245 (i.e., $\Delta_{lit}\% < \Delta_{icl}\%$) and less than the relative refractive index $\Delta_{ocl}\%$ of the second outer cladding portion 243 (i.e., $\Delta_{lit}\% < \Delta_{ocl}\%$). In some embodiments, the relative refractive index $\Delta_{icl}\%$ is substantially equal to the relative refractive index $\Delta_{ocl}\%$ and $\Delta_{lit}\% < \Delta_{icl}\% = \Delta_{ocl}\%$. In other embodiments, the relative refractive index $\Delta_{icl}\%$ is less than the relative refractive index $\Delta_{ocl}\%$ and $\Delta_{lit}\% < \Delta_{icl}\% < \Delta_{ocl}\%$. In embodiments where the second low-index trench 244, the second inner cladding portion 245 and the second outer cladding portion 243 are made from the same materials as the first low-index trench 224, the first inner cladding portion 225 and the first outer cladding portion 223, respectively, it should be appreciated that the relative refractive index $\Delta_{lit}\%$ may be substantially equal to the relative refractive index $\Delta_{LIT}\%$ (i.e., $\Delta_{lit}\% = \Delta_{LIT}\%$), the relative refractive index $\Delta_{icl}\%$ may be substantially equal to the relative refractive index $\Delta_{ICL}\%$ (i.e., $\Delta_{icl}\% = \Delta_{ICL}\%$) and the relative refractive index $\Delta_{ocl}\%$ may be substantially equal to the relative refractive index $\Delta_{OCL}\%$ (i.e., $\Delta_{ocl}\% = \Delta_{OCL}\%$). Also, in embodiments where the relative refractive index $\Delta_{ICL}\%$ is substantially equal to the relative refractive index $\Delta_{OCL}\%$, then $\Delta_{lit}\% < \Delta_{ICL}\% = \Delta_{OCL}\%$ and $\Delta_{LIT}\% < \Delta_{icl}\% = \Delta_{ocl}\%$. In embodiments where the relative refractive index $\Delta_{ICL}\%$ is less than the relative refractive index $\Delta_{OCL}\%$, then $\Delta_{lit}\% < \Delta_{ICL}\% < \Delta_{OCL}\%$ and $\Delta_{LIT}\% < \Delta_{icl}\% < \Delta_{ocl}\%$.

The first outer cladding 223 of the first segment 210 and the second outer cladding 243 of the second segment 230 may comprise pure silica glass, silica glass with one or more up-dopants which increase the index of refraction of silica glass, or silica glass with one or more down-dopants that decrease the index of refraction of silica glass. Non-limiting examples of suitable up-dopants include Ge, Ti, Al, Cl, P, $GeO_2$, $TiO_2$, $P_2O_5$, combinations thereof or the like. In embodiments, at least one of the first outer cladding 223 and the second outer cladding 243 contain Cl as an up-dopant. Non-limiting examples of suitable down-dopants include F, B, combinations thereof, or the like. In embodiments, at least one of the first outer cladding 223 and the second outer cladding 243 contain F as a down-dopant.

The various embodiments of the optical fiber 200 described herein have improved bend performance due to the incorporation of the first low-index trench 224 within the first cladding portion 222 and the second low-index trench 244 within the second cladding portion 242. Macrobend performance of the optical fiber 200 may be determined according to FOTP-62 (JEC-60793-1-47) as described above.

In embodiments described herein, the optical fiber 200 is manufactured using a conventional fiber manufacturing process to make a fiber preform having a desired structure. Non-limiting examples of processes used to make the fiber preform include outside vapor deposition (OVD), modified chemical vapor deposition (MCVD), physical chemical vapor deposition (PCVD), or the like. Once formed, the fiber preform is drawn into a fiber having the dimensions of the first segment 210 (R-segment). The fiber having the dimensions of the first segment 210 is clamped and a portion of the fiber is further drawn down to the dimensions of the second segment 230 (G-segment) with the transition region 250 positioned between the first segment 210 and the second segment 230.

For example, in one embodiment, the optical fiber 200 may be initially formed such that the optical fiber 200 initially has the first low-index core region 214, first annular core region 213, first inner cladding portion 225, first low-index trench 224 and first outer cladding portion 223. The optical fiber 200 may then be clamped and a portion of the fiber heated and further drawn to create an optical fiber having the first segment 210 with the first low-index core region 214, first annular core region 213, first inner cladding portion 225, first low-index trench 224 and first outer cladding portion 223, and a second segment 230 having the second low-index core region 234, the second annular core region 233, the second inner cladding portion 245, second low-index trench 244 and second outer cladding portion 243. In this procedure, further drawing the optical fiber reduces the dimensions of the second segment 230 of the optical fiber 200 relative to the first segment 210. In particular, the dimensions of the second low-index core region 234 are significantly reduced relative to the first low-index core region 214. In another embodiment, the optical fiber 200 may be formed from splicing the first segment 210 and the second segment 230 together. In such an embodiment, it is understood that the outer diameter $D_0$ of the first segment 210 and the outer diameter $d_0$ of the second segment 230 may be generally equal to each other so long as the first core portion 212, second core portion 232, first cladding portion 222 and second cladding portion 242 have the attributes and properties discussed above.

Referring again to FIGS. 4A, 10A and 12A, the optical fiber 200 may be used to transform a Gaussian laser beam into a ring-shaped beam RSB, which is then re-shaped by an end-cap 1000, and when focused forms a non-circularly symmetric Bessel laser beam BLB. In these embodiments $F_D$ value of the Bessel laser beam BLB is at least 10. For example, $F_D$ value of at least 50, at least 100, at least 250, at least 500, at least 1000, in the range from 10 to 2000, in the range from 50 to 1500, or in the range from 100 to 1000.

Specifically, a Gaussian laser beam GLB is optically coupled to an inlet end 231 of the optical fiber 200 and propagates through the second segment 230 towards the first segment 210. The Gaussian laser beam GLB may be incident on the second low-index core region 234. It is understood that the Gaussian laser beam GLB seeks to propagate through a high-index region rather than a low-index region. Also, as the radius of the second low-index core region 234 increases in size (radius) as it transitions into the first low-index core region 214, the Gaussian laser beam GLB propagating in the first low-index core region 214 decreases in intensity. A combination of the Gaussian laser beam GLB seeking to propagate through a high-index region and its intensity decreasing as it propagates through the first low-index core region 214 results in the Gaussian laser beam GLB penetrating through the first low-index core region 214 and propagating through the first annular core region 213 such that a ring-shaped beam RSB is formed and the light exits the optical fiber 200 through an outlet end 211 as a ring-shaped beam. The ring-shaped beam is then incident on the end-cap 1000 which is situated adjacent to and in contact with the outlet 211 (see FIGS. 3A, 3C, 3E) and is transformed into a non-axisymmetric, non-Gaussian laser beam. If the end-cap 1000 has an output surface that is curved or that forms a focusing lens, or if such lens (1301, 130C) is directly formed or attached to the outlet end of the end-cap 1000 (see FIG. 3E), the non-axisymmetric, non-Gaussian laser beam is then transformed into a converging or focused non-axisymmetric Bessel beam. More specifically, the end-cap 1000 (because it is not axi-symmetric) disrupts the circular symmetry of the ring shaped laser beam (RSB) and can transform the ring shaped laser beam (RSB) into a "broken ring" shaped beam or into a "partial ring" shaped beam, In some embodiments, the ring-shaped laser beam (RSB) exiting the outlet end 211 of the optical fiber 200, couples into end-cap 1000 and is then modified by the end-cap 1000 to become a non-axisymmetric laser beam, and then exits the end-cap to be focused with free space bulk optics (for example, 1301, 130A as shown in FIGS. 3A, 3C) forming the non-axisymmetric Bessel laser beam BLB. The Gaussian laser beam GLB can be coupled to the inlet end 231 of the optical fiber 200 through a lens component (FIG. 3A), direct butt-coupling (not shown) or fusion splicing Referring to FIGS. 4B, 9B, 10B, 10C, 11B, 12B, and 12C one embodiment of an optical fiber 200' comprises a first segment 210' (R-segment) optically coupled to a second segment 230' (G-segment) with a transition region 250'. Optical Fiber 200' similar to the optical fiber 200, but the core of the optical fiber 200' includes low index region(s) R described in more detail below.

Figure 9B:
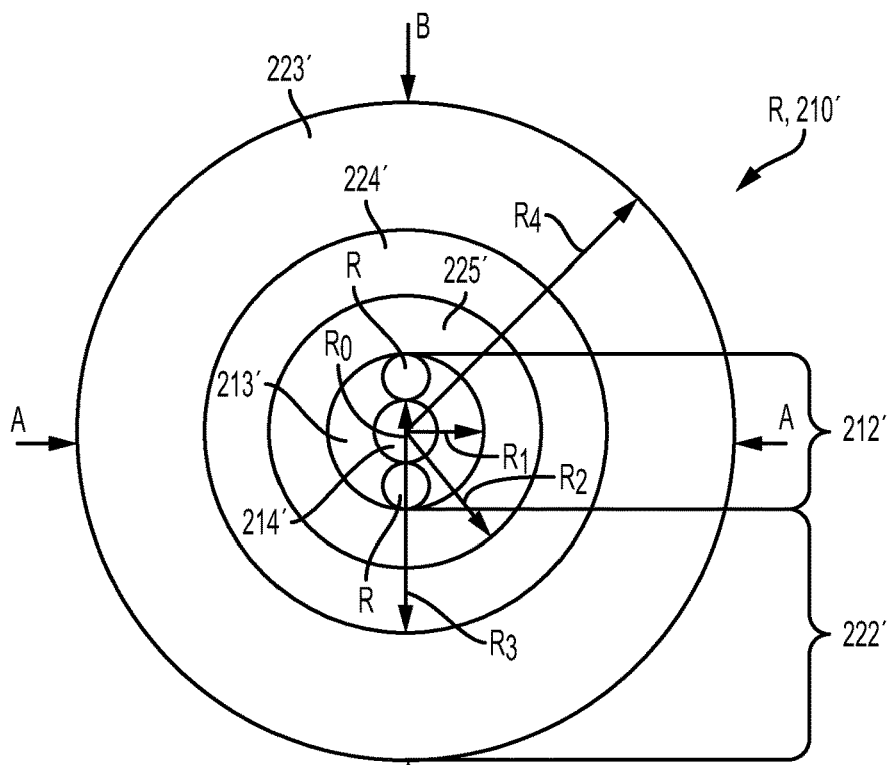
FIG. 9B schematically depicts a radial cross section of a first segment of the optical fiber of FIG. 4B to one or more embodiments shown and described herein.

The R-section of the optical fiber 200' (i.e., section 210') is shown in FIGS. 9B, 10B and 10C. It is similar to that of the R-segment (segment 210) of the fiber 200, but the first core region 213' of the core 212' is no longer fully annular, but is "split" by one or more low index region(s) R of material that has lower index of refraction than that of the region 213' (e.g., pure silica). Alternatively region(s) R one or more air holes H, Therefore, the first core region 213' is not fully annular because the core 212' includes one or more regions R that have lower index of refraction than that of the adjacent region 113' (e.g., pure silica, or air hole H). In such embodiments the first core region 213', has a high relative refractive index $\Delta_{AC}\%$ relative to the cladding, and has a "broken ring shape, or a "partial ring" shape. Thus, in one cross-section (A-A) the fiber section 210' of the optical fiber 200' has a refractive index profile shown in FIG. 10B, and in another cross-section (B-B) a refractive index profile that shown in FIG. 10C. The regions R (e.g., air holes H) interrupt the symmetry of the core region 213', and disrupt the symmetry of the laser beam propagating through the fiber core.

Figure 12B:
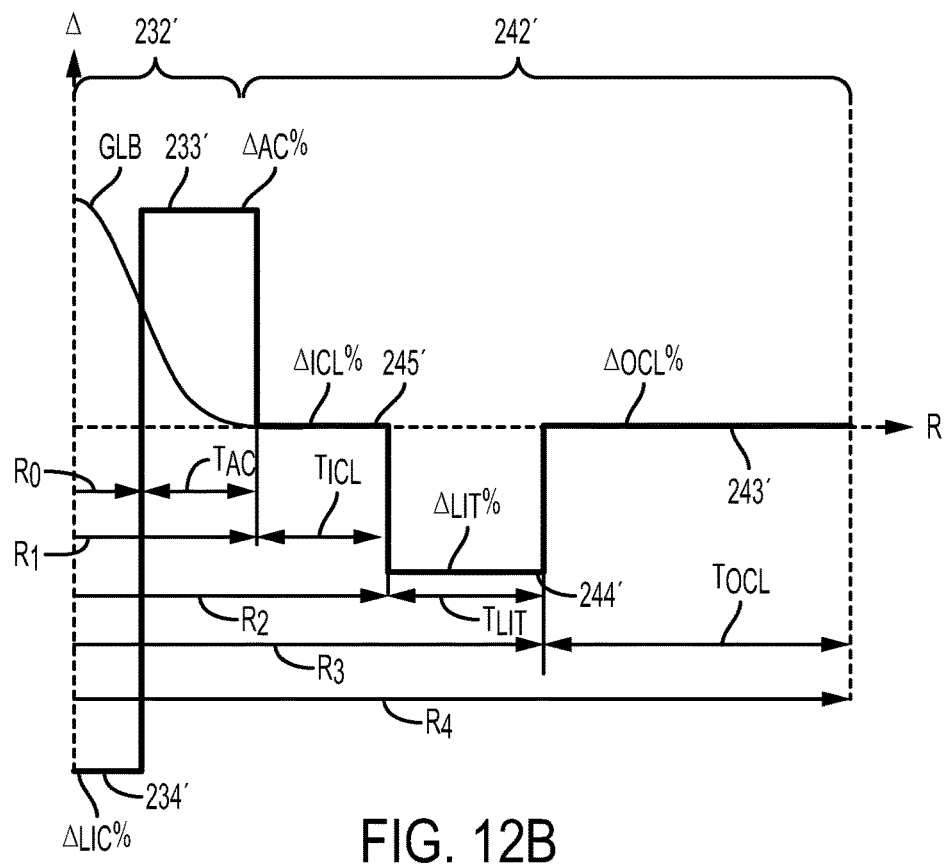
FIG. 12B graphically depicts the relative refractive index profile of the second segment of the optical fiber of FIG. 11B (A-A cross-section) as a function of the radius r of the glass portion of the optical fiber according to one or more embodiments shown and described herein.
Figure 12C:
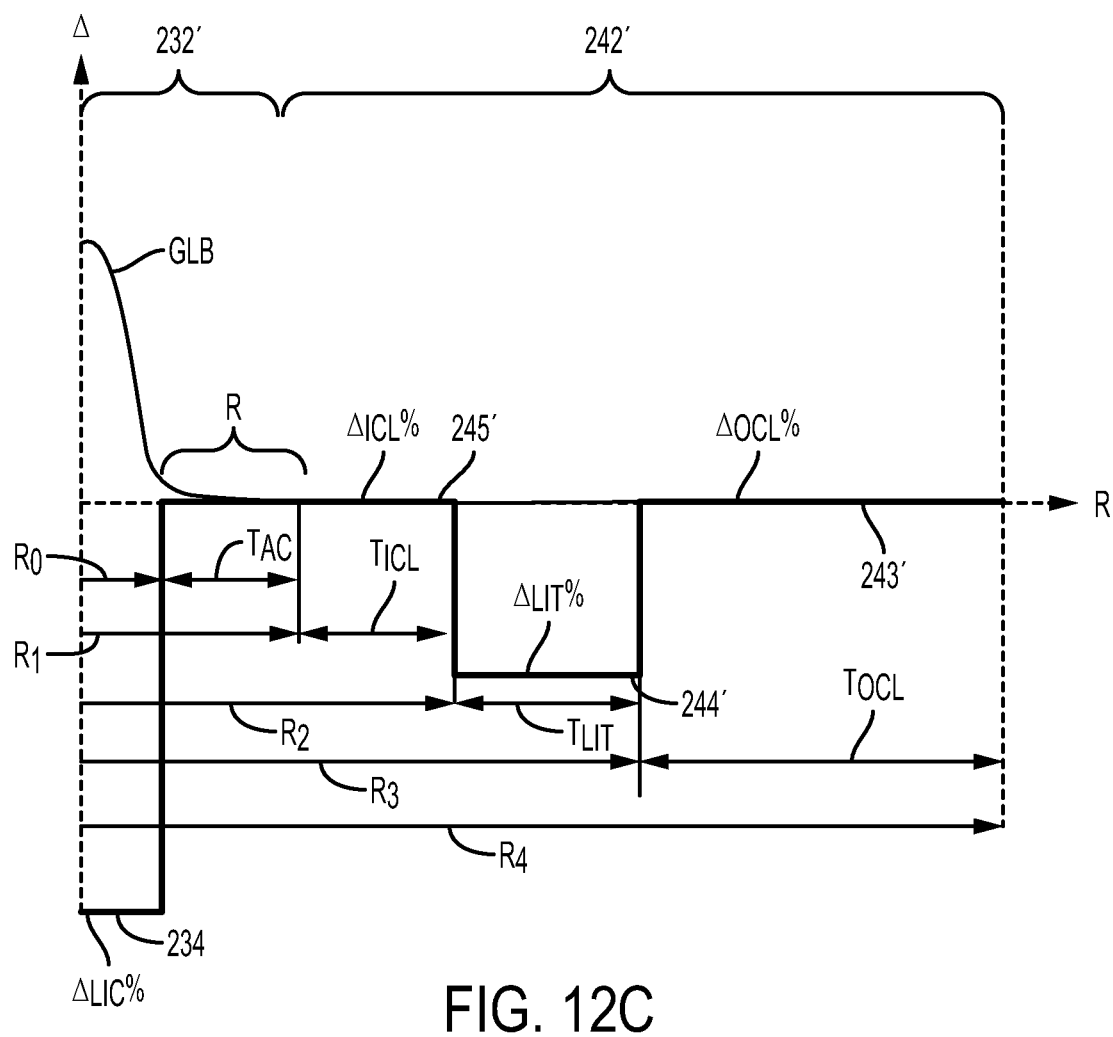
FIG. 12C graphically depicts the relative refractive index profile of the second segment of the optical fiber of FIG. 11B (B-B cross-section) as a function of the radius r of the glass portion of the optical fiber according to one or more embodiments shown and described herein.

The exemplary G-section of the optical fiber 200' (section 230') of this embodiment is shown in FIGS. 11B, 12B, and 12C and preferably also includes or more regions R (e.g., pure silica, down doped silica, or air holes H) that have lower index of refraction than that of the adjacent region, to make the Gaussian beam propagating through the G-section (second segment 230') of the fiber 200' non-circularly symmetric. Thus, in one cross-section (A-A) the fiber section 210' of the optical fiber 200' has a refractive index profile shown in FIG. 12B, and in another cross-section (B-B) a refractive index profile that shown in FIG. 12C. The non-circularly symmetric Gaussian laser beam GLB propagating through the second segment 230' seeks to propagate through the high-index core portion and thereby propagates or "follows" the second higher index portion of the core portion 232' as it transitions into the first annular core region 213', and does not significantly propagate through the regions of lower index material R or through the air hole(s) R of the fiber section 210'.

Specifically, a Gaussian laser beam GLB is optically coupled to an inlet end 231' of the optical fiber 200' and propagates through the second segment 230' (G-segment) towards the first segment 210' (R segment). The Gaussian laser beam GLB may be incident on the second low-index core region 234'. It is understood that the Gaussian laser beam GLB seeks to propagate through a high-index region rather than a low-index region. Also, as the radius of the second low-index core region 234' increases in size (radius) as it transitions into the first low-index core region 214', the portion of the Gaussian laser beam GLB propagating in the first low-index core region 214' decreases in intensity. A combination of the Gaussian laser beam GLB seeking to propagate through a high-index region and its intensity decreasing as it propagates through the first low-index core region 214' results in the Gaussian laser beam GLB penetrating through the first low-index core region 214' and propagating through the first core region 213' such that a non-axisymmetric non-Gaussian (e.g., broken ring shaped beam) is formed and this beam exits the optical fiber 200' through an outlet end 211'. If the outlet end 211' of the optical fiber 200' is curved, and/or forms a focusing lens surface, then optical fiber 200' forms an non-axisymmetric (non-circularly symmetric) Bessel laser beam BLB and the Bessel laser beam BLB exits the optical fiber 200' having undergone the transformation from the Gaussian laser beam to an non-axisymmetric Bessel laser beam. The non axisymmetric laser beam provided to the outlet end 211' of the optical fiber 200' can be focused with free space bulk optics 1301, 130A (see FIG. 3B) or a lens may be directly formed on the outlet end 211' of the optical fiber (not shown), or attached to the outlet end 211' of the optical fiber (FIG. 3F)

The Gaussian laser beam GLB can be coupled to the inlet end 231' of the optical fiber 200', for example, through a lens component 5A (see FIG. 3B), via direct butt-coupling or via fusion splicing (see FIG. 3D).

However, in some embodiments fiber section 210' may be connected to the fiber section 230 of the optical fiber 200, for example by splicing the fiber section 210' to the transition region 250. In such embodiments the fiber section 210' is similar to that shown in FIGS. 9B and 10B, 10C while fiber section 230 is that shown in FIGS. 11A and 12A.

It is noted that if the optical fiber 200 is utilized instead of optical fiber 200', a small fiber segment with the geometry and the refractive index profiles shown in FIGS. 9B, 10B and 10C can be attached to the endface of the segment 210 optical fiber 200 and utilized as the end-cap 1000, for converting an axi-symmetrical ring shaped laser beam propagating through the segment 210 (R-segment) of the optical fiber 200 into a laser beam that is non-axisymmetric. Other end-caps 1000 that that introduce asymmetry to the ring-shaped beam propagating through the optical fiber 200 or 100 may also be utilized. As described above, when focused, the non-axisymmetric beam propagating the end 1000 used in conjunction with the fiber 200 (or through the fiber 200') forms a non-axisymmetric laser beam (e.g., non-axisymmetric Bessel beam) which results in a non-axisymmetric spot 14.

Figure 13A:
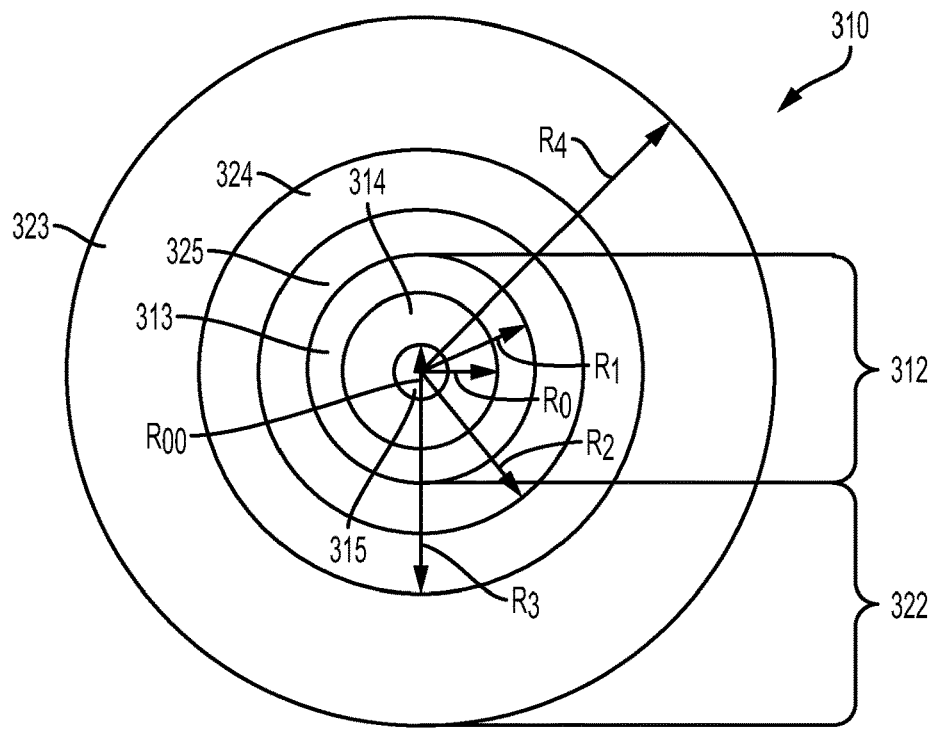
FIG. 13A schematically depicts a radial cross section of a first segment of the optical fiber of FIG. 4C according to one or more embodiments shown and described herein.
Figure 14A:
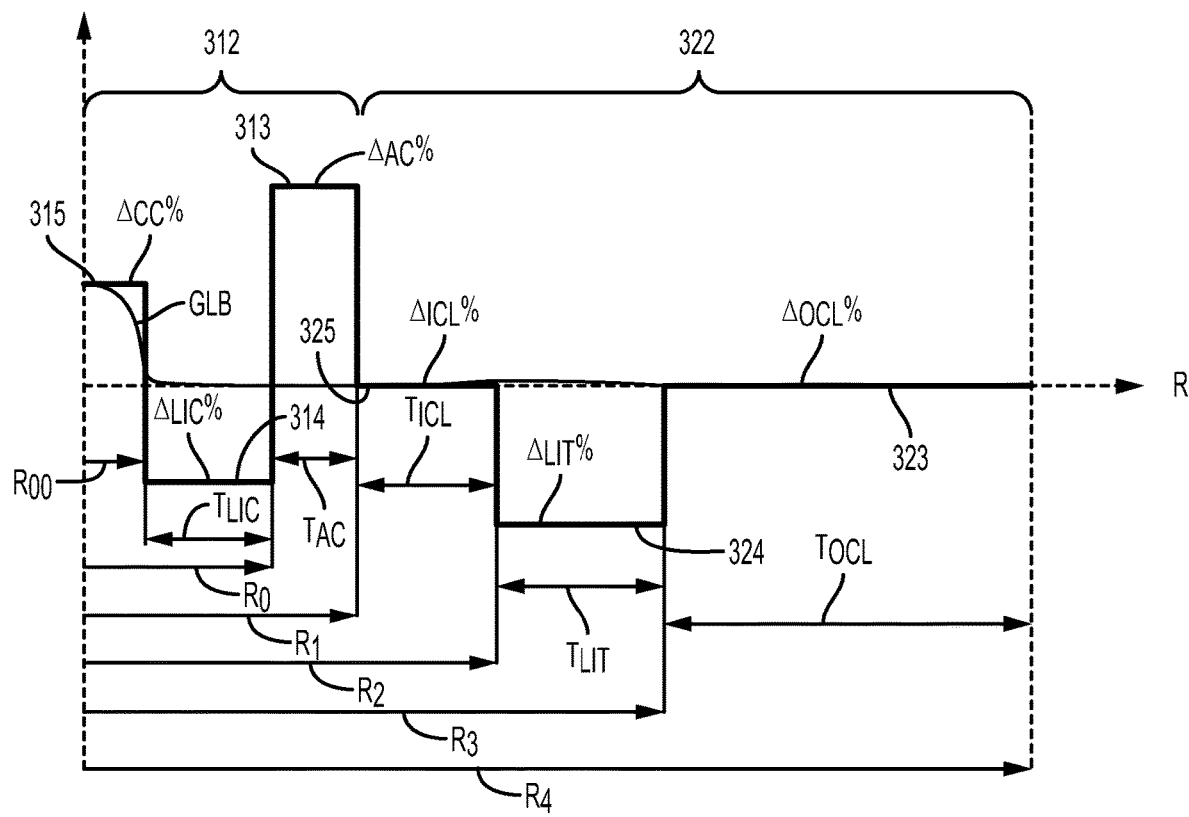
FIG. 14A graphically depicts the relative refractive index profile of the first segment of the optical fiber of FIG. 13A as a function of the radius R of the glass portion of the optical fiber according to one or more embodiments shown and described herein.
Figure 14B:
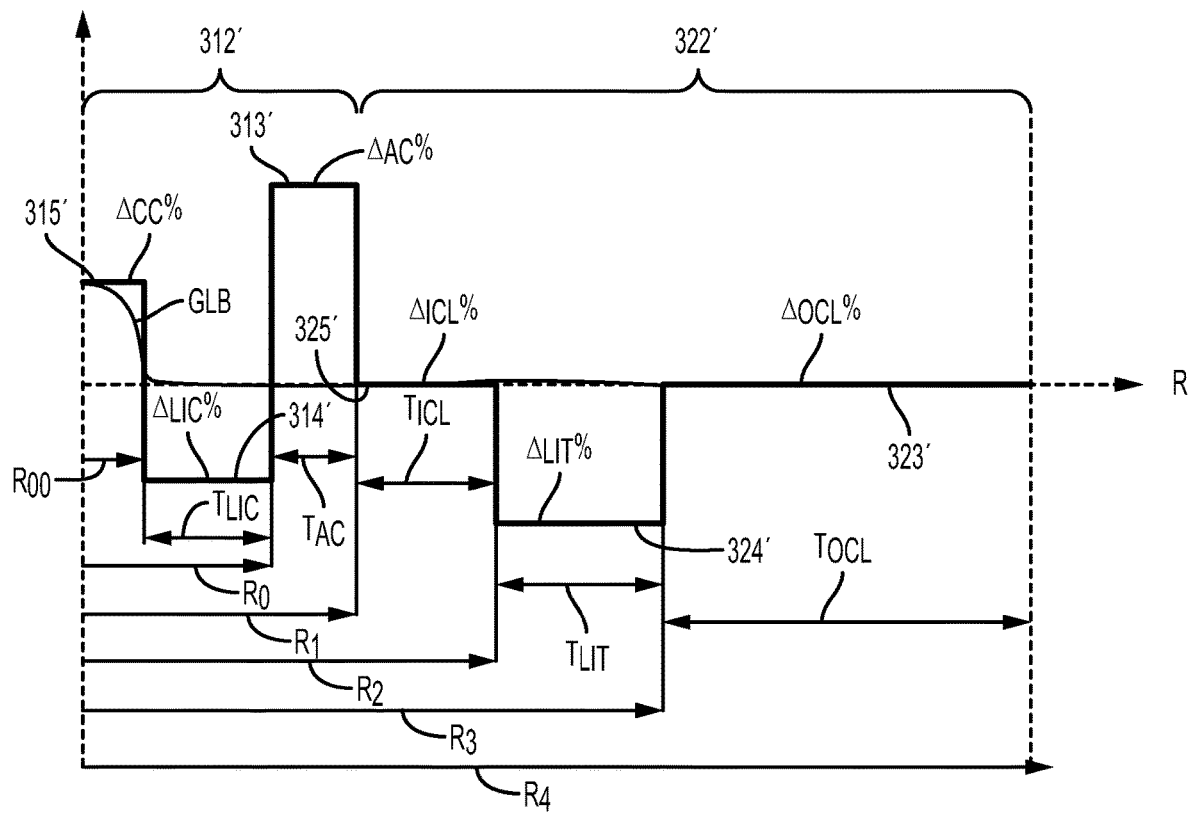
FIG. 14B graphically depicts the relative refractive index profile of the first segment of the optical fiber of FIG. 13B (in A-A cross-section) as a function of the radius R of the glass portion of the optical fiber according to one or more embodiments shown and described herein.
Figure 14C:
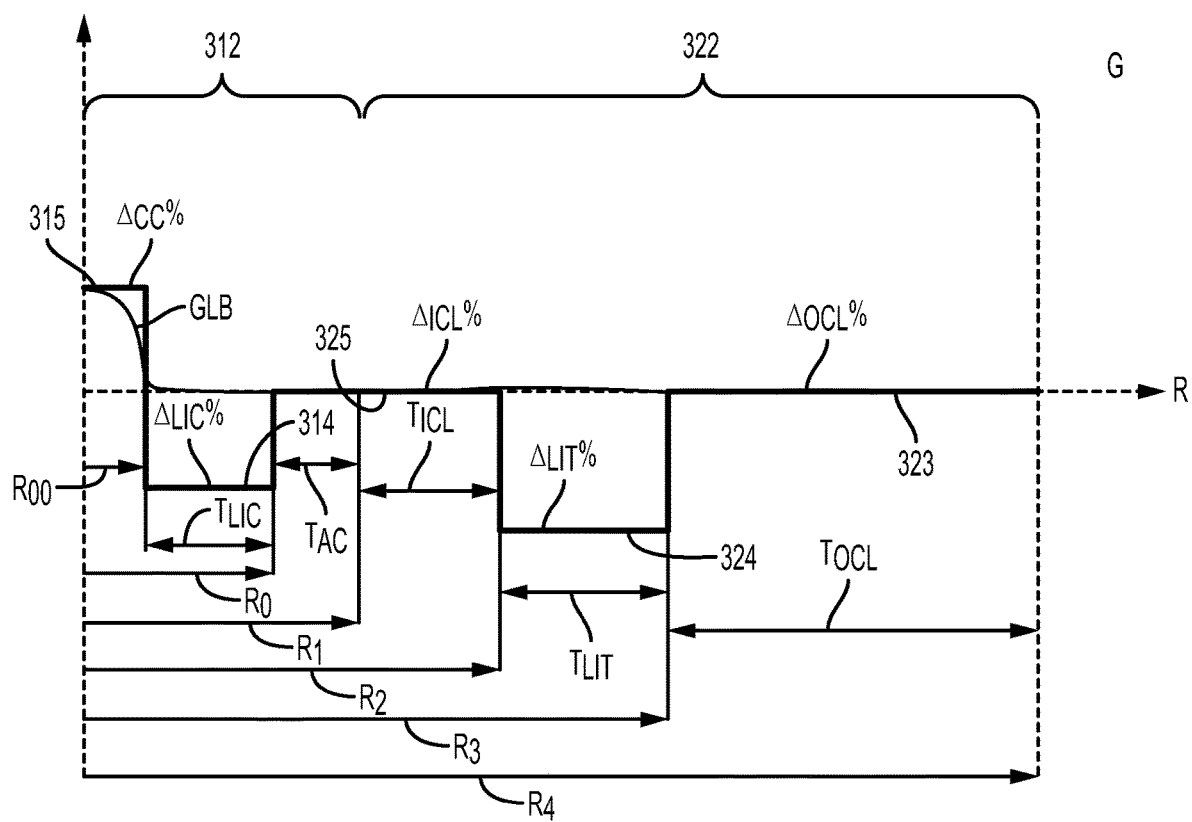
FIG. 14C graphically depicts the relative refractive index profile of the first segment of the optical fiber of FIG. 13B (in B-B cross-section) as a function of the radius R of the glass portion of the optical fiber according to one or more embodiments shown and described herein.
Figure 15A:
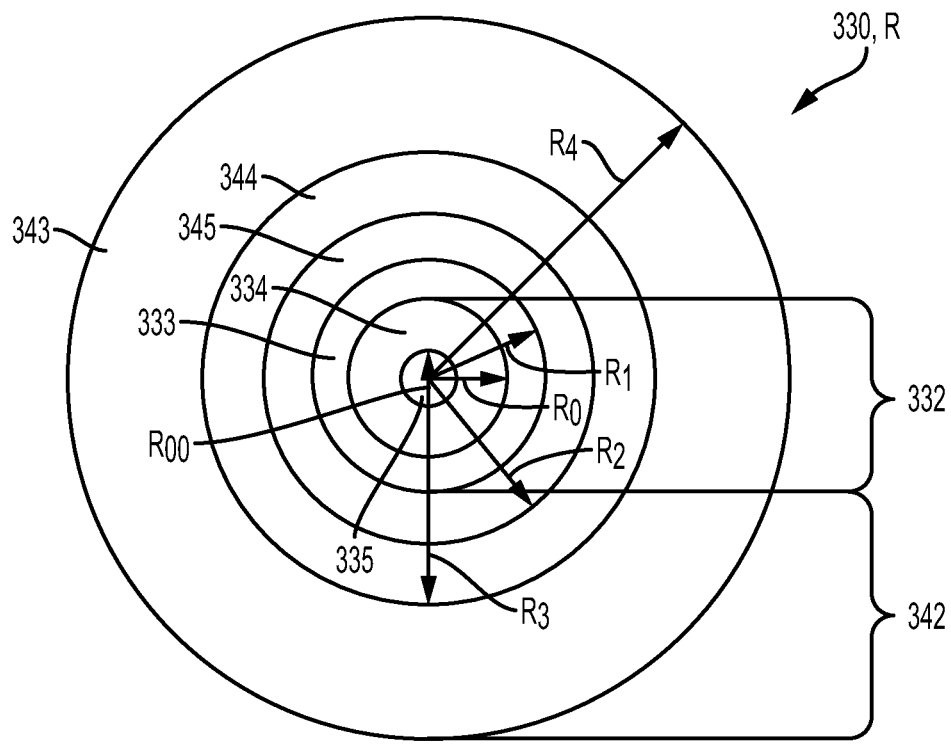
FIG. 15A schematically depicts a radial cross section of a second segment of the optical fiber of FIG. 4C according to one or more embodiments shown and described herein.
Figure 15B:
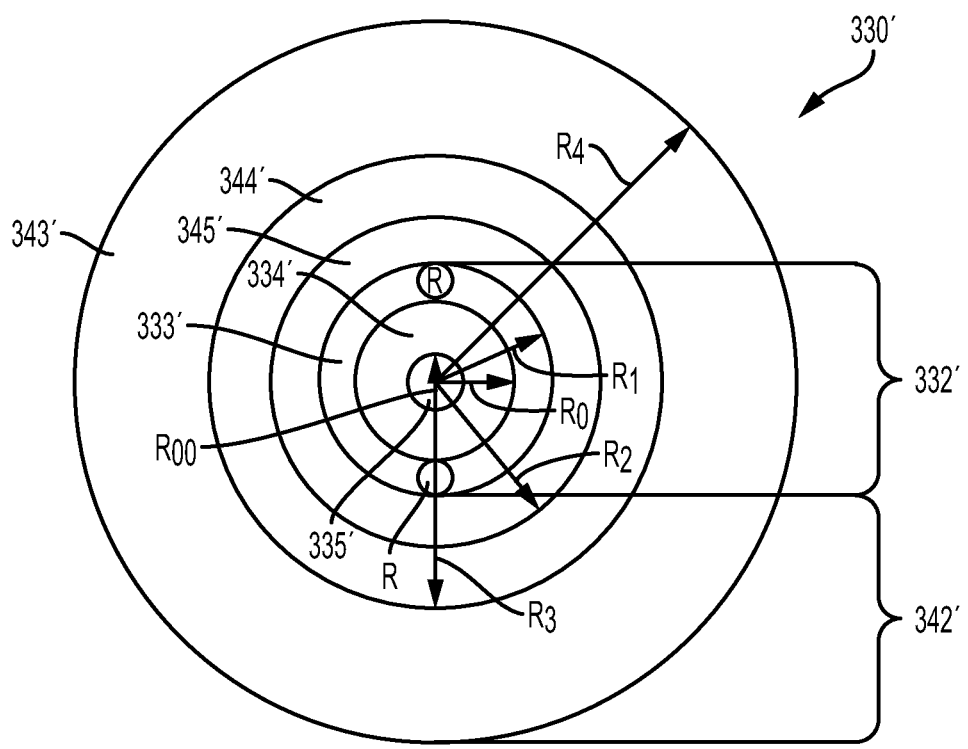
FIG. 15B schematically depicts a radial cross section of a second segment of the optical fiber of FIG. 4D according to one or more embodiments shown and described herein.
Figure 16A:
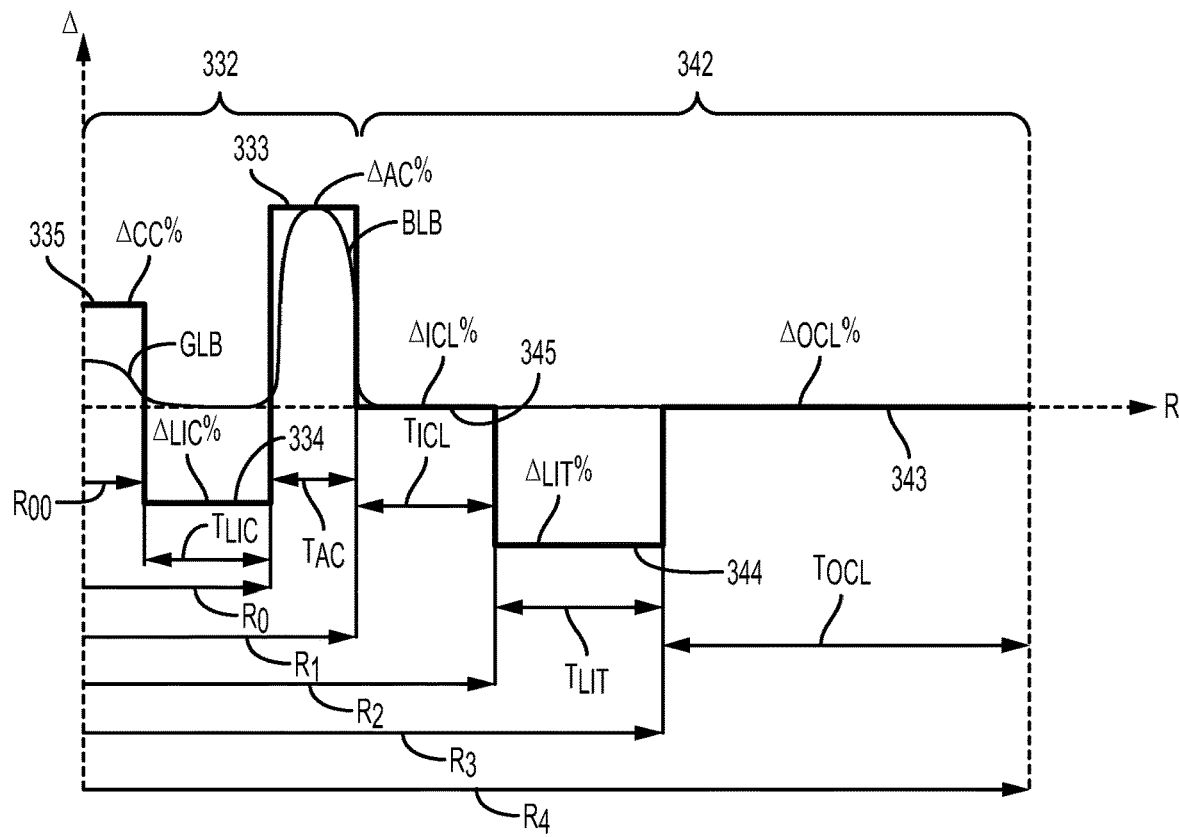
FIG. 16A graphically depicts the relative refractive index profile of the second segment of the optical fiber of FIG. 13A as a function of the radius r of the glass portion of the optical fiber according to one or more embodiments shown and described herein.

Referring to FIGS. 4C and 13A-16A, an embodiment of an optical fiber 300 with a first segment 310 optically coupled to a second segment 330 with a transition region 350 is shown. The optical fiber 300 may be similar to the optical fiber 200 except a first core portion of the first segment 310 and a second core portion of the second segment 330 have a "double core" configuration. Particularly, the first core portion of the first segment 310 and the second core portion of the second segment 330 may include a central core region positioned within and spaced apart from an annular core region by a low-index core region. A side view of at least a portion of the optical fiber 300 is shown in FIG. 4C, radial cross sections of the first segment 310 and the second segment 330 of the optical fiber 300 are shown in FIGS. 13A and 15A, respectively, and corresponding relative refractive index profiles for the first segment 310 and second segment 330 are shown in FIGS. 14A and 16A, respectively. The first segment 310 (G-segment) has a first outer diameter '$D_0$' and the second segment 330 (R-segment) has a second outer diameter '$d_0$' (FIG. 4C). The first outer diameter $D_0$ is greater than the second outer diameter $d_0$. In embodiments, the first outer diameter $D_0$ may be from about 0.2 millimeters (mm) to about 5.0 mm, the second outer diameter $d_0$ may be from about 0.1 to about 4.5 mm, and the length of the transition region 350 may be from about 0.5 mm to about 20 mm. In embodiments, the first outer diameter $D_0$ is from about 0.4 mm to about 1.0 mm, the second outer diameter $d_0$ is from about 0.2 mm to about 0.9 mm, and the length of the transition region 350 is from about 1 mm to about 10 mm. In other embodiments, the first outer diameter $D_0$ is from about 150 µm to about 350 µm, the second outer diameter $d_0$ is from about 75 µm to about 225 µm, and the length of the transition region 350 is greater than 10 mm. A Gaussian laser beam GLB propagating through the second segment 330 is converted into a ringed-shaped beam RSB propagating through the first segment 310. In embodiments, the first segment 310 (G-segment), second segment 330 (R-segment) and transition region 350 are integrally formed with one another and the taper ratio (do/Do) of the optical fiber 300 is greater than or equal to about 0.2 and less than or equal to about 0.9. In other embodiments, the taper ratio of the optical fiber 300 is greater than or equal to about 0.3 and less than or equal to 0.9. In still other embodiments, the taper ratio of the optical fiber 300 is greater than or equal to 0.3 and less than or equal to 0.8. The first segment 310 (FIGS. 13A and 14A) of the optical fiber 300 has a first core portion 312 centered on the axial centerline 2 of the optical fiber 300. The first core portion 312 may include a first annular core region 313. A first cladding portion 322 may extend around the first core portion 312. The second segment 330 (FIGS. 15A and 16A) of the optical fiber 300 may have a second core portion 332 and at least a portion of the second core portion 332 is optically coupled to the first core portion 312. A second cladding portion 342 may extend around the second core portion 332.

Referring to FIGS. 4C, 13A and 14A, a radial cross section of the first segment 310 (G-segment) of the optical fiber 300 of FIG. 4C is schematically depicted in FIG. 13A and the relative refractive index of the radial cross section relative to the centerline of the cross section is graphically depicted in FIG. 14A. The first segment 310 generally includes a first core portion 312 and a first cladding portion 322. The first core portion 312 is positioned within the first cladding portion 322 with the first cladding portion 322 extending around the first core portion 312. The first core portion 312 and the first cladding portion 322 may be generally concentric such that a cross section of the first segment 310 of the optical fiber 300 is generally circular symmetric with respect to the center of the first core portion 312 of the optical fiber 300. Also, the first core portion 312 and the first cladding portion 322 may be generally axisymmetric with respect to the center of the first core portion 312 of the optical fiber 300. In embodiments, the first core portion 312 may include a first annular core region 313, a first low-index core region 314 and a first central core region 315. The first low-index core region 314 is positioned within the first annular core region 313 and the first central core region 315 is positioned within the first low-index core region 314. The first central core region 315 is spaced apart from the first annular core region 313 by the first low-index core region 314 as depicted in FIG. 14A. In embodiments, the first low-index core region 314 is directly adjacent to and in direct contact with the first annular core region 313 and the first central core region 315 is directly adjacent to and in direct contact with the first low-index core region 314.

In some embodiments, the first cladding portion 322 may optionally include a first low-index trench 324 and a first outer cladding portion 323. The first low-index trench 324 is positioned within the first outer cladding 323 and the first low-index trench 324 may be directly adjacent to and in direct contact with the first outer cladding 323. The first low-index trench 324, when included, improves the bend performance of the optical fiber 300. That is, the first low-index trench 324 reduces attenuation of light propagating in the optical fiber 300 when the optical fiber 300 is coiled, thereby permitting the optical fiber 300 to be coiled to a tighter (i.e., smaller) radius without increasing the attenuation of light propagating in the optical fiber 300 relative to an optical fiber having a similar structure without the first low-index trench 324.

In some embodiments (not depicted), the first low-index trench 324 may be directly adjacent to and in direct contact with the first core portion 312. In some other embodiments, such as the embodiment depicted in FIGS. 13A and 14A, the first low-index trench 324 may be spaced apart from the first core portion 312 by a first inner cladding portion 325, i.e., the first inner cladding portion 325 is positioned within the first low-index trench 324 between the first low-index trench 324 and the first core portion 312. In embodiments, the first inner cladding portion 325 is directly adjacent to and in direct contact with the first low-index trench 324 and the first annular core region 313.

The first segment 310 has a radius $R_4$ from the axial centerline 2 of the optical fiber 300. The first core portion 312 has a radius $R_1$ that is less than the radius $R_4$. The first central core region 315 has a radius $R_{00}$. The first low-index core region 314 has an inner radius $R_{00}$, an outer radius $R_0$ and a radial thickness $T_{LIC}=R_0-R_{00}$. The first annular core region 313 has an inner radius $R_0$, an outer radius $R_1$ and a radial thickness $T_{AC}=R_1-R_0$. The radii $R_{00}$, $R_0$ and $R_1$ of the first central core region 315, first low-index core region 314 and first annular core region 313, respectively, are defined at the points at which the lines tangent to the maximum slopes of the relative refractive index profile (FIG. 14A) of the first central core region 315, first low-index core region 314 and first annular core region 313, respectively, cross the reference relative refractive index line $\Delta_{OCL}\%$. The first cladding portion 322 has an inner radius $R_1$, an outer radius $R_4$ and a radial thickness $T_{CL}=R_4-R_1$. In embodiments where the first cladding portion 322 includes the first low-index trench 324 and the first outer cladding portion 323, the first low-index trench 324 has an inner radius $R_2$, an outer radius $R_3$ and a radial thickness $T_{LIT}=R_3-R_2$. The first outer cladding portion 323 has an inner radius $R_3$, an outer radius $R_4$ and a radial thickness $T_{OCL}=R_4-R_3$. In embodiments (not depicted) where the first low-index trench 324 is directly adjacent to and in direct contact with the first core portion 312, the inner radius $R_2$ of the first low-index trench 324 may be equal to the radius $R_1$ of the first core portion 312. In embodiments where the first low-index trench 324 is spaced apart from the first core portion 312 by the first inner cladding portion 325, the first inner cladding portion 325 has an inner radius $R_1$, an outer radius $R_2$ and a radial thickness $T_{ICL}=R_2-R_1$.

The radius $R_4$ of the first segment 310 is from about 50 μm to about 250 μm. In some embodiments, the radius $R_4$ of the first segment 310 is from about 100 μm to about 150 μm. The radius $R_1$ of the first core portion 312 is from about 5 μm to about 40 μm. In some embodiments, the radius $R_1$ is from about 10 μm to about 35 μm. The radial thickness $T_{CL}(R_4-R_1)$ of the first cladding portion 322 is from about 75 μm to about 175 μm. In some embodiments the radial thickness $T_{CL}$ is from about 85 μm to about 150 μm. The radius $R_{00}$ of the first central core region 315 is from about 1 μm to about 15 μm. In some embodiments, the radius $R_{00}$ of the first central core region 315 is from about 2 μm to about 10 μm. The inner radius $R_{00}$ of the first low-index core region 314 is from about 1 μm to about 15 μm, the outer radius $R_0$ is from about 2 μm to about 30 μm and the radial thickness $T_{LIC}$ is from about 1 μm to about 20 μm. In some embodiments, the inner radius $R_{00}$ is from about 2 μm to about 10 μm, the outer radius $R_0$ is from about 5 μm to about 25 μm and the radial thickness $T_{LIC}$ is from about 2.5 μm to about 17.5 μm. The inner radius $R_0$ of the first annular core region 313 is from about 2 μm to about 30 μm, the outer radius $R_1$ is from about 5 μm to about 40 μm and the radial thickness $T_{AC}$ of the first annular core region 313 is from about 2 μm to about 20 μm. In embodiments, the inner radius $R_0$ is from about 5 μm to about 25 μm, the outer radius $R_1$ is from about 10 μm to about 35 μm and the radial thickness $T_{AC}$ is from about 2.5 μm to about 15 μm. In embodiments where the first cladding portion 322 includes the first low-index trench 324 and the first outer cladding portion 323, the inner radius $R_2$ of the first low-index trench 324 is from about 10 μm to about 50 μm, the outer radius $R_3$ is from about 15 μm to about 65 μm and the radial thickness $T_{LIT}(R_3-R_2)$ is from about 1 μm to about 40 μm. In embodiments, the inner radius $R_2$ is from about 15 μm to about 40 μm, the outer radius $R_3$ is from about 25 μm to about 55 μm and the radial thickness $T_{LIT}$ is from about 1 μm to about 35 μm. The inner radius $R_3$ of the first outer cladding portion 323 is from about 15 μm to about 65 μm, the outer radius $R_4$ is from about 50 μm to about 250 μm and the radial thickness $T_{OCL}(R_4-R_3)$ is from about 50 μm to about 150 μm. In embodiments, the inner radius $R_3$ is from about 25 μm to about 55 μm, the outer radius $R_4$ is from about 100 μm to about 150 μm and the radial thickness $T_{OCL}$ is from about 60 μm to about 125 μm. In embodiments where the first low-index trench 324 is spaced apart from the first core portion 312 by the first inner cladding portion 325, the inner radius $R_1$ of the first inner cladding portion 325 is from about 5 μm to about 40 μm, the outer radius $R_2$ is from about 10 μm to about 50 μm and the radial thickness $T_{ICL}(R_2-R_1)$ is from about 1 μm to about 15 μm. In embodiments, the inner radius $R_1$ is from about 10 μm to about 35 μm, the outer radius $R_2$ is from about 15 μm to about 40 μm and the radial thickness $T_{ICL}$ is from about 1 μm to about 10 μm.

Referring to FIGS. 4C, 15A and 16A, a radial cross section of the second segment 330 (R-segment) of the optical fiber 300 of FIG. 4C is schematically depicted in FIG. 15A and the relative refractive index of the radial cross section relative to the centerline of the cross section is graphically depicted in FIG. 16A. The second segment 330 generally includes a second core portion 332 and a second cladding portion 342. The second core portion 332 is positioned within the second cladding portion 342 with the second cladding portion 342 extending around the second core portion 332. The second core portion 332 and the second cladding portion 342 may be generally concentric such that a cross section of the second segment 330 of the optical fiber 300 is generally circularly symmetric with respect to the center of the second core portion 332 of the optical fiber 300. Also, the second core portion 332 and the second cladding portion 342 may be generally axisymmetric with respect to the center of the second core portion 332 of the optical fiber 300. In some embodiments, the second core portion 332 may include a second annular core region 333, a second low-index core region 334 and a second central core region 335. The second low-index core region 334 is positioned within the second annular core region 333 and the second central core region 335 is positioned within the second low-index core region 334. The second central core region 335 is spaced apart from the second annular core region 333 by the second low-index core region 334 as depicted in FIG. 15A. In some embodiments, the second low-index core region 334 is directly adjacent to and in direct contact with the second annular core region 333 and the second central core region 335 is directly adjacent to and in direct contact with the second low-index core region 334.

In some embodiments, the second cladding portion 342 may optionally include a second low-index trench 344 and a second outer cladding portion 343. The second low-index trench 344 is positioned within the second outer cladding 343 and the second low-index trench 344 may be directly adjacent to and in direct contact with the second outer cladding 343. The second low-index trench 344, when included, improves the bend performance of the optical fiber 300. That is, the second low-index trench 344 reduces attenuation of light propagating in the optical fiber 300 when the optical fiber 300 is coiled, thereby permitting the optical fiber 300 to be coiled to a tighter (i.e., smaller) radius without increasing the attenuation of light propagating in the optical fiber 300 relative to an optical fiber having a similar structure without the second low-index trench 344. It should be understood that, when the first segment 310 of the optical fiber 300 includes the first low-index trench 324, the second segment 330 of the optical fiber 300 will include a second low-index trench 344 and vice-versa.

In some embodiments (not depicted), the second low-index trench 344 may be directly adjacent to and in direct contact with the second core portion 332. In some other embodiments, the second low-index trench 344 may be spaced apart from the second core portion 332 by a second inner cladding portion 345 as depicted in FIGS. 15A and 16A. That is, the second inner cladding portion 345 is positioned within the second low-index trench 344 and is positioned between the second low-index trench 344 and the second core portion 332. In embodiments, the second inner cladding portion 345 is directly adjacent to and in direct contact with the second low-index trench 344 and the second annular core region 333.

Referring to FIGS. 4C and 13A-16A, it should be appreciated that the first core portion 312 is optically coupled with the second core portion 332 and the first cladding portion 322 is optically coupled to the second cladding portion 342 through the transition region 350. Particularly, the first central core region 315 is optically coupled to the second central core region 335, the first low-index core region 314 is optically coupled to the second low-index core region 334, the first annular core region 313 is optically coupled to the second annular core region 333, the first outer cladding portion 323 is optically coupled to the second outer cladding portion 343, the first low-index trench 324 is optically coupled to the second low-index trench 344, and the first inner cladding portion 325 is optically coupled to the second inner cladding portion 345 through the transition region 350.

The second segment 330 has a radius $r_4$ from the axial centerline 2 of the optical fiber 300. The second core portion 332 has a radius $r_1$ that is less than the radius $r_4$. The second central core region 335 has a radius $r_{00}$. The second low-index core region 334 has an inner radius $r_{00}$, an outer radius $r_0$ and a radial thickness $t_{lic}=r_0-r_{00}$. The second annular core region 333 has an inner radius $r_0$, an outer radius $r_1$ and a radial thickness $t_{ac}=r_1-r_0$. The radii $r_{00}$, $r_0$ and $r_1$ of the second central core region 335, second low-index core region 334 and second annular core region 333 are defined at the points at which the lines tangent to the maximum slope of the relative refractive index profile (FIG. 16A) of the second central core region 335, second low-index core region 334 and second annular core region 333, respectively, cross the reference relative refractive index line $\Delta_{ocl}\%$. The second cladding portion 342 has an inner radius $r_1$, an outer radius $r_4$ and a radial thickness $t_{cl}=r_4-r_1$. In embodiments where the second cladding portion 342 includes the second low-index trench 344 and the second outer cladding portion 343, the second low-index trench 344 has an inner radius $r_2$, an outer radius $r_3$ and a radial thickness $t_{lit}=r_3-r_2$. The second outer cladding portion 343 has an inner radius $r_3$, an outer radius $r_4$ and a radial thickness $t_{ocl}=r_4-r_3$. In embodiments (not depicted) where the second low-index trench 344 is directly adjacent to and in direct contact with the second core portion 332, the inner radius $r_2$ of the second low-index trench 344 may be equal to the radius $r_1$ of the second core portion 332. In embodiments where the second low-index trench 344 is spaced apart from the second core portion 332 by the second inner cladding portion 345, the second inner cladding portion 345 has an inner radius $r_1$, an outer radius $r_2$ and a radial thickness $t_{icl}=r_2-r_1$.

The radius $r_4$ of the second segment 330 is from about 30 μm to about 80 μm. In some embodiments, the radius $r_4$ of the second segment 330 is from about 40 μm to about 70 μm. The radius $r_1$ of the second core portion 332 is from about 3 μm to about 20 μm. In some embodiments, the radius $r_1$ is from about 5 μm to about 17.5 μm. The radial thickness $t_{cl}$ ($r_4-r_1$) of the second cladding portion 242 is from about 25 μm to about 70 μm. In some embodiments the radial thickness $t_{cl}$ is from about 35 μm to about 60 μm. The radius $r_{00}$ of the second central core region 335 is from about 0.5 μm to about 7.5 μm. In some embodiments, the radius $r_{00}$ of the second central core region 335 is from about 1 μm to about 5 μm. The inner radius $r_{00}$ of the second low-index core region 334 is from about 0.5 μm to about 7.5 μm, the outer radius $r_0$ is from about 2 μm to about 15 μm and the radial thickness $t_{lic}$ is from about 1 μm to about 10 μm. In some embodiments, the inner radius $r_{00}$ is from about 1 μm to about 5 μm, the outer radius $r_0$ is from about 3 μm to about 12 μm and the radial thickness $t_{lic}$ is from about 2 μm to about 7.5 μm. The inner radius $r_0$ of the second annular core region 333 is from about 2 μm to about 15 μm, the outer radius $r_1$ is from about 3 μm to about 20 μm and the radial thickness $t_{ac}$ of the second annular core region 333 is from about 1 μm to about 10 μm. In some embodiments, the inner radius $r_0$ is from about 3 μm to about 12 μm, the outer radius $r_1$ is from about 5 μm to about 17.5 μm and the radial thickness $t_{ac}$ is from about 2 μm to about 7 μm. In embodiments where the second cladding portion 342 includes the second low-index trench 344 and the second outer cladding portion 343, the inner radius $r_2$ of the second low-index trench 344 is from about 5 μm to about 25 μm, the outer radius $r_3$ is from about 7 μm to about 30 μm and the radial thickness $t_{lit}$ ($r_3-r_2$) is from about 1 μm to about 20 μm. In some embodiments, the inner radius $r_2$ is from about 7 μm to about 20 μm, the outer radius $r_3$ is from about 10 μm to about 25 μm and the radial thickness $t_{lit}$ is from about 1 μm to about 15 μm. The inner radius $r_3$ of the second outer cladding portion 343 is from about 7 μm to about 30 μm, the outer radius $r_4$ is from about 30 μm to about 80 μm and the radial thickness $t_{ocl}$ ($r_4-r_3$) is from about 20 μm to about 70 μm. In some embodiments, the inner radius $r_3$ is from about 10 μm to about 25 μm, the outer radius $r_4$ is from about 40 μm to about 70 μm and the radial thickness $t_{ocl}$ is from about 25 μm to about 65 μm. In embodiments where the second low-index trench 344 is spaced apart from the second core portion 332 by the second inner cladding portion 345, the inner radius $r_1$ of the second inner cladding portion 345 is from about 3 μm to about 20 μm, the outer radius $r_2$ is from about 5 μm to about 25 μm and the radial thickness $t_{icl}$ ($r_2-r_1$) is from about 1 μm to about 7.5 μm. In embodiments, the inner radius $r_1$ is from about 5 μm to about 17.5 μm, the outer radius $r_2$ is from about 7 μm to about 20 μm and the radial thickness $t_{icl}$ is from about 1 μm to about 5 μm.

The first central core region 315 of the first segment 310 has a refractive index $n_{CC}$ and a relative refractive index $\Delta_{CC}\%$, and the second central core region 335 of the second segment 330 has a refractive index $n_{cc}$ and a relative refractive index $\Delta_{cc}\%$. In embodiments, the first central core region 315 and the second central core region 335 are made from the same material and the relative refractive index $\Delta_{CC}\%$ is substantially equal to the relative refractive index $\Delta_{cc}\%$ (i.e., $\Delta_{CC}\%=\Delta_{cc}\%$). The relative refractive index $\Delta_{CC}\%$ and the relative refractive index $\Delta_{cc}\%$ are from about 0.0% to about 0.5%. In embodiments, the relative refractive index $\Delta_{CC}\%$ and the relative refractive index $\Delta_{CC}\%$ are from about 0.1% to about 0.4%.

The first low-index core region 314 of the first segment 310 has a refractive index $n_{LIC}$ and a relative refractive index $\Delta_{LIC}\%$, and the second low-index core region 334 of the second segment 330 has a refractive index $n_{lic}$ and a relative refractive index $\Delta_{lic}\%$. In embodiments, the first low-index core region 314 and the second low-index core region 334 are made from the same material and the relative refractive index $\Delta_{LIC}\%$ is substantially equal to the relative refractive index $\Delta_{lic}\%$ (i.e., $\Delta_{LIC}\%=\Delta_{lic}\%$). The relative refractive index $\Delta_{LIC}\%$ and the relative refractive index $\Delta_{lic}\%$ are from about 0.2% to about −1.0%. In embodiments, the relative refractive index $\Delta_{LIC}\%$ and the relative refractive index $\Delta_{lic}\%$ are from about 0.1% to about −0.5%.

The first annular core region 313 has a refractive index $n_{AC}$ and a relative refractive index $\Delta_{AC}\%$, and the second annular core region 333 has a refractive index $n_{ac}$ and a relative refractive index $\Delta_{ac}\%$. In embodiments, the first annular core region 313 and the second annular core region 333 are made from the same material and the relative refractive index $\Delta_{AC}\%$ is substantially equal to the relative refractive index $\Delta_{ac}\%$ (i.e., $\Delta_{AC}\%=\Delta_{ac}\%$). The relative refractive index $\Delta_{AC}\%$ and the relative refractive index $\Delta_{ac}\%$ are greater than the relative refractive index $\Delta_{LIC}\%$ and the relative refractive index $\Delta_{lic}\%$, respectively (i.e., $\Delta_{AC}\%>\Delta_{LIC}\%$; $\Delta_{ac}\%>\Delta_{lic}\%$). In some embodiments, the relative refractive index $\Delta_{AC}\%$ is greater than the relative refractive index $\Delta_{CC}\%$ (i.e., $\Delta_{AC}\%>\Delta_{CC}\%$) and the relative refractive index $\Delta_{ac}\%$ is greater than the relative refractive index $\Delta_{CC}\%$ (i.e., $\Delta_{ac}\%>\Delta_{CC}\%$). In other embodiments, the relative refractive index $\Delta_{AC}\%$ is substantially equal to the relative refractive index $\Delta_{CC}\%$ (i.e., $\Delta_{AC}\%=\Delta_{CC}\%$) and the relative refractive index $\Delta_{ac}\%$ is substantially equal to the relative refractive index $\Delta_{cc}\%$ (i.e., $\Delta_{ac}\%=\Delta_{cc}\%$). In embodiments where the first low-index core region 314 and the second low-index core region 334 are made from the same material, and the first annular core region 313 and the second annular core region 333 are made from the same material, $\Delta_{AC}\%>\Delta_{lic}\%$ and $\Delta_{ac}\%>\Delta_{LIC}\%$. The relative refractive index $\Delta_{AC}\%$ and the relative refractive index $\Delta_{ac}\%$ are from about 0.2% to about 2.0%. In embodiments, the relative refractive index $\Delta_{AC}\%$ and the relative refractive index $\Delta_{ac}\%$ are from about 0.3% to about 0.75%.

The first cladding portion 322 has a refractive index $n_{CL}$ and a relative refractive index $\Delta_{CL}\%$ relative to pure silica glass. The refractive index $n_{CL}$ of the first cladding portion 322 may be used as the reference for the relative refractive indices of the other glass portions of the first segment 310 of the optical fiber 300. In embodiments where the first cladding portion 322 includes a first outer cladding portion 323, a first low-index trench 324, and (optionally) a first inner cladding portion 325, the relative refractive indices of the other glass portions of the first segment 310 of the optical fiber 300 are determined relative to the first outer cladding portion 323, as described in further detail herein.

In embodiments where the first cladding portion 322 includes the first inner cladding portion 325 and the first low-index trench 324, the first inner cladding portion 325 has a refractive index $n_{ICL}$ and a relative refractive index $\Delta_{ICL}\%$, and the first low-index trench 324 has a refractive index $n_{LIT}$ and a relative refractive index $\Delta_{LIT}\%$. The relative refractive index $\Delta_{ICL}\%$ is generally greater than the relative refractive index $\Delta_{LIT}\%$ and generally less than the relative refractive index $\Delta_{AC}\%$ (i.e., $\Delta_{AC}\% > \Delta_{ICL}\% > \Delta_{LIT}\%$) as generally depicted in FIG. 14A. The relative refractive index $\Delta_{ICL}\%$ is from about −0.1% to about 0.1% and the relative refractive index $\Delta_{LIT}\%$ is from about −0.1% to about −1.0%. In embodiments, the relative refractive index $\Delta_{ICL}\%$ is from about −0.05% to about 0.05% and the relative refractive index $\Delta_{LIT}\%$ is from about −0.3% to about −0.5%.

The second cladding portion 342 has a refractive index $n_{cl}$ and a relative refractive index $\Delta_{cl}\%$ relative to pure silica glass. The refractive index $n_{cl}$ of the second cladding portion 342 may be used as the reference for the relative refractive indices of the other glass portions of the second segment 330 of the optical fiber 300. In embodiments where the second cladding portion 342 includes a second outer cladding portion 343, a second low-index trench 344, and (optionally) a second inner cladding portion 345, the relative refractive indices of the other glass portions of the second segment 330 of the optical fiber 300 are determined relative to the second outer cladding portion 343, as described in further detail herein.

In embodiments where the second cladding portion 342 includes the second inner cladding portion 345 and the second low-index trench 344, the second inner cladding portion 345 has a refractive index $n_{icl}$ and a relative refractive index $\Delta_{icl}\%$, and the second low-index trench 344 has a refractive index $n_{lit}$ and a relative refractive index $\Delta_{lit}\%$. The relative refractive index $\Delta_{icl}\%$ is generally greater than the relative refractive index $\Delta_{lit}\%$ and generally less than the relative refractive index $\Delta_{ac}\%$ (i.e., $\Delta_{ac}\% > \Delta_{icl}\% > \Delta_{lit}\%$) as generally depicted in FIG. 16A. In embodiments, the second inner cladding portion 345 is made from the same material as the first inner cladding portion 325 and the second low-index trench 344 is made from the same material as the first low-index trench 324. Accordingly, the refractive indices $n_{icl}$ and $n_{lit}$ may be substantially equal to the refractive indices, $n_{ICL}$ and $n_{LIT}$, respectively (i.e., $n_{icl}=n_{ICL}$; $n_{lit}=n_{LIT}$), and the relative refractive indices $\Delta_{icl}\%$ and $\Delta_{lit}\%$ may be substantially equal to the relative refractive indices $\Delta_{ICL}\%$ and $\Delta_{LIT}\%$, respectively (i.e., $\Delta_{icl}\%=\Delta_{ICL}\%$; $\Delta_{lit}\%=\Delta_{LIT}\%$). For example, the relative refractive index $\Delta_{icl}\%$ may be from about −0.1% to about 0.1% and the relative refractive index $\Delta_{lit}\%$ may be from about −0.1% to about −1.0%. In embodiments, the relative refractive index $\Delta_{icl}\%$ may be from about −0.05% to about 0.05% and the relative refractive index $\Delta_{lit}\%$ may be from about −0.3% to about −0.5%.

In embodiments where the first cladding portion 322 includes the first outer cladding portion 323, the first outer cladding portion 323 has a refractive index $n_{OCL}$ and a relative refractive index $\Delta_{OCL}\%$. In these embodiments, the relative refractive index $\Delta_{OCL}\%$ may be used as the reference for determining the relative refractive indices of the other glass portions of the first segment 310 of the optical fiber 300. In the embodiments described herein, the relative refractive index $\Delta_{OCL}\%$ of the first outer cladding portion 323 is greater than the relative refractive index $\Delta_{LIT}\%$ of the first low-index trench 324 (i.e., $\Delta_{OCL}\% > \Delta_{LIT}\%$). In some embodiments, the relative refractive index $\Delta_{OCL}\%$ of the first outer cladding portion 323 may be greater than the relative refractive index $\Delta_{ICL}\%$ of the first inner cladding portion 325, such as when the first inner cladding portion 325 comprises silica glass down-doped with one or more down-dopants which decrease the index of refraction $n_{ICL}$ of the first inner cladding portion 325 relative to the index of refraction $n_{OCL}$ of the first outer cladding portion 323. In other embodiments, the relative refractive index $\Delta_{OCL}\%$ of the first outer cladding portion 323 may be substantially equal to the relative refractive index $\Delta_{ICL}\%$ of the first inner cladding portion 325. In such embodiments, the composition of the first outer cladding portion 323 may be the same as the composition of the first inner cladding portion 325 or different than the composition of the first inner cladding portion 325, so long as $\Delta_{OCL}\%=\Delta_{ICL}\%$. Based on the foregoing, it should be understood that the relative refractive index $\Delta_{OCL}\%$ of the first outer cladding portion 323 is greater than or substantially equal to the relative refractive index $\Delta_{ICL}\%$ of the first inner cladding portion 325.

In embodiments where the second cladding portion 342 includes the second outer cladding portion 343, the second outer cladding portion 343 has a refractive index $n_{ocl}$ and a relative refractive index $\Delta_{ocl}\%$. Accordingly, the relative refractive index $\Delta_{ocl}\%$ may be used as the reference for the relative refractive indices of the other glass portions of the second segment 330 of the optical fiber 300. In the embodiments described herein, the relative refractive index $\Delta_{ocl}\%$ of the second outer cladding portion 343 is greater than the relative refractive index $\Delta_{lit}\%$ of the second low-index trench 344 (i.e., $\Delta_{ocl}\% > \Delta_{lit}\%$). In some embodiments, the relative refractive index $\Delta_{ocl}\%$ of the second outer cladding portion 343 may be greater than the relative refractive index $\Delta_{icl}\%$ of the second inner cladding portion 345, such as when the second inner cladding portion 345 comprises silica glass down-doped with one or more down-dopants which decrease the index of refraction $n_{icl}$ of the second inner cladding portion 345 relative to the index of refraction $n_{ocl}$ of the second outer cladding portion 343. In other embodiments, the relative refractive index $\Delta_{ocl}\%$ of the second outer cladding portion 343 may be substantially equal to the relative refractive index $\Delta_{icl}\%$ of the second inner cladding portion 345. In such embodiments, the composition of the second outer cladding portion 343 may be the same as the composition of the second inner cladding portion 345 or different than the composition of the second inner cladding portion 345, so long as $\Delta_{ocl}\%=\Delta_{icl}\%$. Based on the foregoing, it should be understood that the relative refractive index $\Delta_{ocl}\%$ of the second outer cladding portion 343 is greater than or substantially equal to the relative refractive index $\Delta_{icl}\%$ of the second inner cladding portion 345. In embodiments, the second outer cladding portion 343 is made from the same material as the first outer cladding portion 323, and as such, the refractive index $n_{ocl}$ of the second outer cladding portion 343 may be substantially equal to the refractive index $n_{OCL}$ of the first outer cladding portion 323 (i.e., $n_{ocl}=n_{OCL}$) and the relative refractive index $\Delta_{ocl}\%$ of the second outer cladding portion 343 may be substantially equal to the relative refractive index $\Delta_{OCL}\%$ of the first outer cladding portion 323, (i.e., $\Delta_{ocl}\%=\Delta_{OCL}\%=0$).

The first central core region 315 of the first segment 310 and the second central core region 335 of the second segment 330 comprise silica glass with one or more up-dopants which increase the index of refraction of silica glass, for example and without limitation, Ge, Ti, Al, Cl, P, $GeO_2$, $TiO_2$, $P_2O_5$, combinations thereof or the like. In embodiments, at least one of the first central core region 315 and the second central core region 335 contain between about 3 wt. % to about 17 wt. % $GeO_2$. In some other embodiments, at least one of the first central core region 315 and the second central core region 335 contain between about 5 wt. % to about 13 wt. % $GeO_2$. In embodiments, the first central core region 315 and the second central core region 335 are made from the same materials and the dopant concentration in the first central core region 315 is substantially equal to the dopant concentration in the second central core region 335.

The first low-index core region 314 of the first segment 310 and the second low-index core region 334 of the second segment 330 comprise silica glass with one or more down-dopants which decrease the index of refraction of silica glass, for example and without limitation, F, B, combinations thereof, or the like. In embodiments, at least one of the first low-index core region 314 and the second low-index core region 334 comprise F in a concentration between about 0.1 wt. % to about 2.5 wt. %. In some embodiments, at least one of the first low-index core region 314 and the second low-index core region 334 comprise F in a concentration between about 0.1 wt. % to about 1.8 wt. %. In other embodiments, at least one of the first low-index core region 314 and the second low-index core region 334 comprise F in a concentration between about 0.1 wt. % to about 1.5 wt. %. In still other embodiments, at least one of the first low-index core region 314 and the second low-index core region 334 comprise F in a concentration between about 0.5 wt. % to about 1.8 wt. %. In still yet other embodiments, at least one of the first low-index core region 314 and the second low-index core region 334 comprise F in a concentration between about 0.7 wt. % to about 1.8 wt. %.

The first annular core region 313 of the first segment 310 and the second annular core region 333 of the second segment 330 comprise silica glass with one or more up-dopants which increase the index of refraction of silica glass, for example and without limitation, Ge, Ti, Al, Cl, P, $GeO_2$, $TiO_2$, $P_2O_5$, combinations thereof or the like. In embodiments, at least one of the first annular core region 313 and the second annular core region 333 contain between about 3 wt. % to about 17 wt. % $GeO_2$. In some other embodiments, at least one of the first annular core region 313 and the second annular core region 333 contain between about 5 wt. % to about 13 wt. % $GeO_2$. In embodiments, the first annular core region 313 and the second annular core region 333 are made from the same materials and the dopant concentration in the first annular core region 313 is substantially equal to the dopant concentration in the second annular core region 333.

The first inner cladding portion 325 of the first segment 310 and the second inner cladding portion 345 of the second segment 330 may comprise pure silica glass, silica glass with one or more up-dopants which increase the index of refraction of silica glass, or silica glass with one or more down-dopants that decrease the index of refraction of silica glass. Non-limiting examples of suitable up-dopants include Ge, Ti, Al, Cl, P, $GeO_2$, $TiO_2$, $P_2O_5$, combinations thereof or the like. In embodiments, at least one of the first inner cladding 325 and the second inner cladding 345 contain Cl as an up-dopant. Non-limiting examples of suitable down-dopants include F, B, combinations thereof, or the like. In embodiments, at least one of the first inner cladding 325 and the second inner cladding 345 contain F as a down-dopant.

As discussed in relation to expressions (32) and (33) above, the radial thickness of a particular glass portion of an optical fiber may be interrelated with a relative refractive index of the particular glass portion. In the embodiments described herein, the trench volume $V_{LIT}$ of the first low-index trench 324 may be greater than or equal to about 80%-$\mu m^2$, such as greater than or equal to about 100%-$\mu m^2$. In some embodiments, the trench volume $V_{LIT}$ may be greater than or equal to about 110%-$\mu m^2$ or even greater than or equal to about 120%-$\mu m^2$. In some embodiments, the trench volume $V_{LIT}$ may be greater than or equal to about 80%-$\mu m^2$ and less than or equal to about 220%-$\mu m^2$. In some embodiments, the trench volume $V_{LIT}$ may be greater than or equal to about 100%-$\mu m^2$ and less than or equal to about 200%-$\mu m^2$. In still other embodiments, the trench volume profile $V_{LIT}$ may be greater than or equal to about 110%-$\mu m^2$ and less than or equal to about 180%-$\mu m^2$.

In the embodiments described herein, the trench volume $v_{lit}$ of the second low-index trench 344 may be greater than or equal to about 40%-$\mu m^2$, such as greater than or equal to about 50%-$\mu m^2$. In some embodiments, the trench volume $v_{lit}$ may be greater than or equal to about 55%-$\mu m^2$ or even greater than or equal to about 60%-$\mu m^2$. In some embodiments, the trench volume $v_{lit}$ may be greater than or equal to about 40%-$\mu m^2$ and less than or equal to about 110%-$\mu m^2$. In some embodiments, the trench volume $v_{lit}$ may be greater than or equal to about 50%-$\mu m^2$ and less than or equal to about 100%-$\mu m^2$. In still other embodiments, the trench volume profile $v_{lit}$ may be greater than or equal to about 55%-$\mu m^2$ and less than or equal to about 90%-$\mu m^2$.

In the embodiments of the optical fibers described herein, the first low-index trench 324, the second low-index trench 344, or both the first low-index trench 324 and the second low-index trench 344, comprise silica glass with one or more down-dopants which decrease the index of refraction of silica glass. Non-limiting examples of down-dopants include F, B, combinations thereof, or the like. In embodiments, at least one of the first low-index trench 324 and the second low-index trench 344 comprise F in a concentration between about 0.1 wt. % to about 2.5 wt. %. In some embodiments, at least one of the first low-index trench 324 and the second low-index trench 344 comprise F in a concentration between about 0.1 wt. % to about 1.8 wt. %. In other embodiments, at least one of the first low-index trench 324 and the second low-index trench 344 comprise F in a concentration between about 0.1 wt. % to about 1.5 wt. %. In still other embodiments, at least one of the first low-index trench 324 and the second low-index trench 344 comprise F in a concentration between about 0.5 wt. % to about 1.8 wt. %. In still yet other embodiments, at least one of the first low-index trench 324 and the second low-index trench 344 comprise F in a concentration between about 0.7 wt. % to about 1.8 wt. %.

In some embodiments, at least one of the relative refractive index $\Delta_{LIC}\%$ of the first low-index core region 314, the relative refractive index $\Delta_{LIT}\%$ of the first low-index trench 324, the relative refractive index $\Delta_{lic}\%$ of the second low-index core region 334 and the relative refractive index $\Delta_{lit}\%$ of the second low-index trench 344 is achieved by forming the silica glass of at least one of the first low-index core region 314, the first low-index trench 324, the second low-index core region 334 and the second low-index trench 344, respectively, with voids which are either non-periodically disposed, or periodically disposed, or both, throughout the silica glass. The voids are stretched (elongated) along the length (i.e. parallel to the longitudinal axis) of the optical fiber 300, but do not extend the entire length of the entire fiber. While not wishing to be bound by theory, it is believed that the voids extend less than a few meters, and in many cases less than 1 meter along the length of the fiber. Optical fiber disclosed herein can be made by methods which utilize preform consolidation conditions which are effective to result in a significant amount of gases being trapped in the consolidated glass blank, thereby causing the formation of voids in the consolidated glass optical fiber preform. Rather than taking steps to remove these voids, the resultant preform is used to form an optical fiber with voids therein. In some embodiments, these voids may contain one or more gases, such as argon, krypton, $CO_2$, $SO_2$, $O_2$, or mixtures thereof. In some other embodiments, the voids are substantially free of gas. Regardless of the presence or absence of gas, at least one of the refractive index $n_{LIC}$ of the first low-index core region 314, the refractive index $n_{LIT}$ of the first low-index trench 324, the refractive index $n_{lic}$ of the second low-index core region 334 and the refractive index $n_{lit}$ of the second low-index trench 344 are decreased due to the presence of the voids. Alternatively or additionally, at least one of the $n_{LIC}$ of the first low-index core region 314, the refractive index $n_{LIT}$ of the first low-index trench 324, the refractive index $n_{lic}$ of the second low-index core region 334 and the refractive index $n_{lit}$ of the second low-index trench 344 is decreased by forming a down-doped silica glass with a non-periodic, periodic, or both non-periodic and periodic distribution of voids, as described herein.

The relative refractive index $\Delta_{LIT}\%$ of the first low-index trench 324 is less than the relative refractive index $\Delta_{ICL}\%$ of the first inner cladding portion 325 (i.e., $\Delta_{LIT}\%<\Delta_{ICL}\%$) and less than the relative refractive index $\Delta_{OCL}\%$ of the first outer cladding portion 323 (i.e., $\Delta_{LIT}\%<\Delta_{OCL}\%$). In some embodiments, the relative refractive index $\Delta_{ICL}\%$ is substantially equal to the relative refractive index $\Delta_{OCL}\%$ and $\Delta_{LIT}\%<\Delta_{ICL}\%=\Delta_{OCL}\%$. In other embodiments, the relative refractive index $\Delta_{ICL}\%$ is less than the relative refractive index $\Delta_{OCL}\%$ and $\Delta_{LIT}\%<\Delta_{ICL}\%<\Delta_{OCL}\%$.

The relative refractive index $\Delta_{lit}\%$ of the second low-index trench 344 is less than the relative refractive index $\Delta_{icl}\%$ of the second inner cladding portion 345 (i.e., $\Delta_{lit}\%<\Delta_{icl}\%$) and less than the relative refractive index $\Delta_{ocl}\%$ of the second outer cladding portion 343 (i.e., $\Delta_{lit}\%<\Delta_{ocl}\%$). In some embodiments, the relative refractive index $\Delta_{icl}\%$ is substantially equal to the relative refractive index $\Delta_{ocl}\%$ and $\Delta_{lit}\%<\Delta_{icl}\%=\Delta_{ocl}\%$. In other embodiments, the relative refractive index $\Delta_{icl}\%$ is less than the relative refractive index $\Delta_{ocl}\%$ and $\Delta_{lit}\%<\Delta_{icl}\%<\Delta_{ocl}\%$. In embodiments where the second low-index trench 344, the second inner cladding portion 345 and the second outer cladding portion 343 are made from the same materials as the first low-index trench 324, the first inner cladding portion 325 and the first outer cladding portion 323, respectively, it should be appreciated that the relative refractive index $\Delta_{lit}\%$ may be substantially equal to the relative refractive index $\Delta_{LIT}\%$ (i.e., $\Delta_{lit}\%=\Delta_{LIT}\%$), the relative refractive index $\Delta_{icl}\%$ may be substantially equal to the relative refractive index $\Delta_{ICL}\%$ (i.e., $\Delta_{icl}\%=\Delta_{ICL}\%$) and the relative refractive index $\Delta_{ocl}\%$ may be substantially equal to the relative refractive index $\Delta_{OCL}\%$ (i.e., $\Delta_{ocl}\%=\Delta_{OCL}\%$).

The first outer cladding 323 of the first segment 310 and the second outer cladding 343 of the second segment 330 may comprise pure silica glass, silica glass with one or more up-dopants which increase the index of refraction of silica glass, or silica glass with one or more down-dopants that decrease the index of refraction of silica glass. Non-limiting examples of suitable up-dopants include Ge, Ti, Al, Cl, P, $GeO_2$, $TiO_2$, $P_2O_5$, combinations thereof or the like. In embodiments, at least one of the first outer cladding 323 and the second outer cladding 343 contain Cl as an up-dopant. Non-limiting examples of suitable down-dopants include F, B, combinations thereof, or the like. In embodiments, at least one of the first outer cladding 323 and the second outer cladding 343 contain F as a down-dopant.

The various embodiments of the optical fiber 300 described herein have improved bend performance due to the incorporation of the first low-index trench 324 within the first cladding portion 322 and the second low-index trench 344 within the second cladding portion 342. Macrobend performance of the optical fiber 200 may be determined according to FOTP-62 (JEC-60793-1-47) as described above.

In the embodiments described herein, the optical fiber 300 is manufactured using a conventional fiber manufacturing process to make a fiber preform having a desired structure. Non-limiting examples of processes used to make the fiber preform include outside vapor deposition (OVD), modified chemical vapor deposition (MCVD), physical chemical vapor deposition (PCVD), or the like. Once formed, the fiber preform is drawn into a fiber having the dimensions of the first segment 310 (G-segment). The fiber having the dimensions of the first segment 310 is clamped and a portion of the fiber is further drawn down to the dimensions of the second segment 330 (R-segment) with the transition region 350 positioned between the first segment 310 and the second segment 330.

For example, in one embodiment, the optical fiber 300 may be initially formed such that the optical fiber 300 initially has the first central core region 315, first low-index core region 314, first annular core region 313, first inner cladding portion 325, first low-index trench 324 and first outer cladding portion 323. The optical fiber 300 may then be clamped and a portion of the fiber heated and further drawn to create an optical fiber having the first segment 310 with the first central core region 315, first low-index core region 314, first annular core region 313, first inner cladding portion 325, first low-index trench 324 and first outer cladding portion 323, and a second segment 330 having the second central core region 335, second low-index core region 334, second annular core region 333, second inner cladding portion 345, second low-index trench 344 and second outer cladding portion 343. In this procedure, further drawing the optical fiber reduces the dimensions of the second segment 330 of the optical fiber 300 relative to the first segment 310. In particular, the dimensions of the second central core region 335 are significantly reduced relative to the first central core region 315.

Referring to FIGS. 4C, 14A and 16A, a Gaussian laser beam GLB is optically coupled to an inlet end 311 of the optical fiber 300 and propagates through the first segment 310 towards the second segment 330. Specifically, the Gaussian laser beam GLB is introduced into the first central core region 315 and propagates through the first segment 310 and into the transition region 350. As the Gaussian laser beam GLB propagates through the transition region 350 and into the second segment 330, the decreased size of second central core region 335 is unable to support propagation of the Gaussian laser beam GLB and the optical power of the Gaussian laser beam GLB propagates, instead, in the second annular core region 333, thereby converting the Gaussian laser beam GLB into a ring-shaped laser beam (RSB). The ring-shaped laser beam propagates through the second segment 330 within the second annular core region 333. In embodiments, a portion of the optical power of the Gaussian laser beam GLB is maintained within the second central core region 335 of the second segment 330 as depicted in FIG. 14A. The portion of the Gaussian laser beam GLB maintained within the second central core region 335 may be less than 10% of the Gaussian laser beam GLB propagating through the first central core region 315 of the first segment 310. In embodiments, the portion of the Gaussian laser beam GLB maintained within the second central core region 335 may be less than 10% of the Gaussian laser beam GLB propagating through the first central core region 315 of the first segment 310. The ring-shaped laser beam RSB exits the optical fiber 300 through an outlet end 331. The Gaussian laser beam GLB can be coupled to the inlet end 311 of the optical fiber 300 through a lens system (not shown), direct butt-coupling (not shown) or fusion splicing (not shown). The ring-shaped laser beam incident on the outlet end 331 of the optical fiber 300 can be focused with free space bulk optics (not shown) or a fiber lens directly formed or attached to the outlet end 331 (not shown). In embodiments, the portion of the Gaussian laser beam GLB maintained within the second central core region 335 may be blocked from exiting the outlet end 331 using paint to cover the second central core region 335 at the outlet end 331, forming an aperture in the second central core region 335 at the outlet end 331, etc.

Referring to FIGS. 4D and 13B, 14B, 14C, 15B, 16B and 16C, one embodiment of an optical fiber 300' with a first segment 310' (G-segment) optically coupled to a second segment 330' (R-segment) with a transition region 350' is shown. Optical fiber 300' is similar to the optical fiber 300 described above, but the core of the optical fiber 300' includes one or more low index region(s) R (for example, in the second core region 333') as described in more detail below. The laser beam that propagates through the second segment 330' within the second annular core region 333' is not circularly symmetric and thus is shaped differently from the ring shaped beam propagating through the second segment 330 within the second annular core region 333 of the optical fiber 300.

Figure 16B:
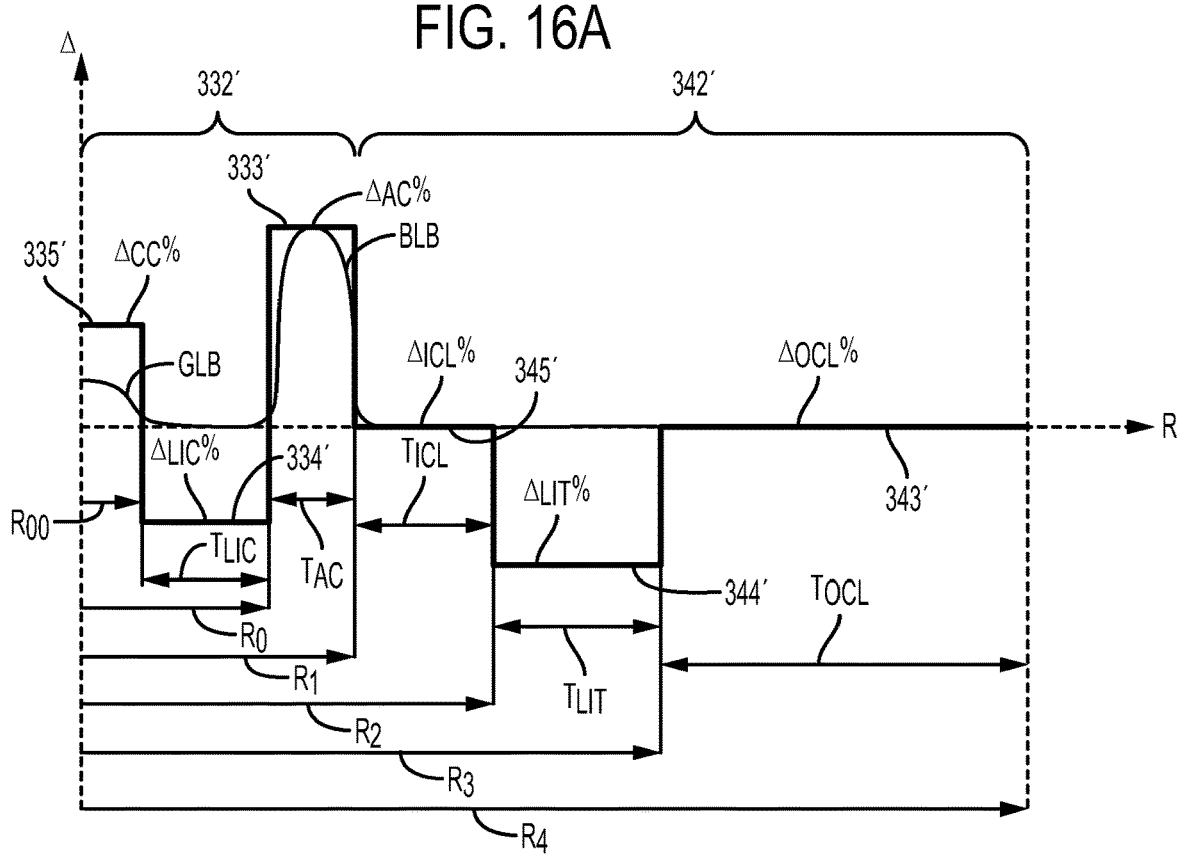
FIG. 16B graphically depicts the relative refractive index profile of the second segment of the optical fiber of FIG. 12B (in A-A cross-section) as a function of the radius r of the glass portion of the optical fiber according to one or more embodiments shown and described herein.
Figure 16C:
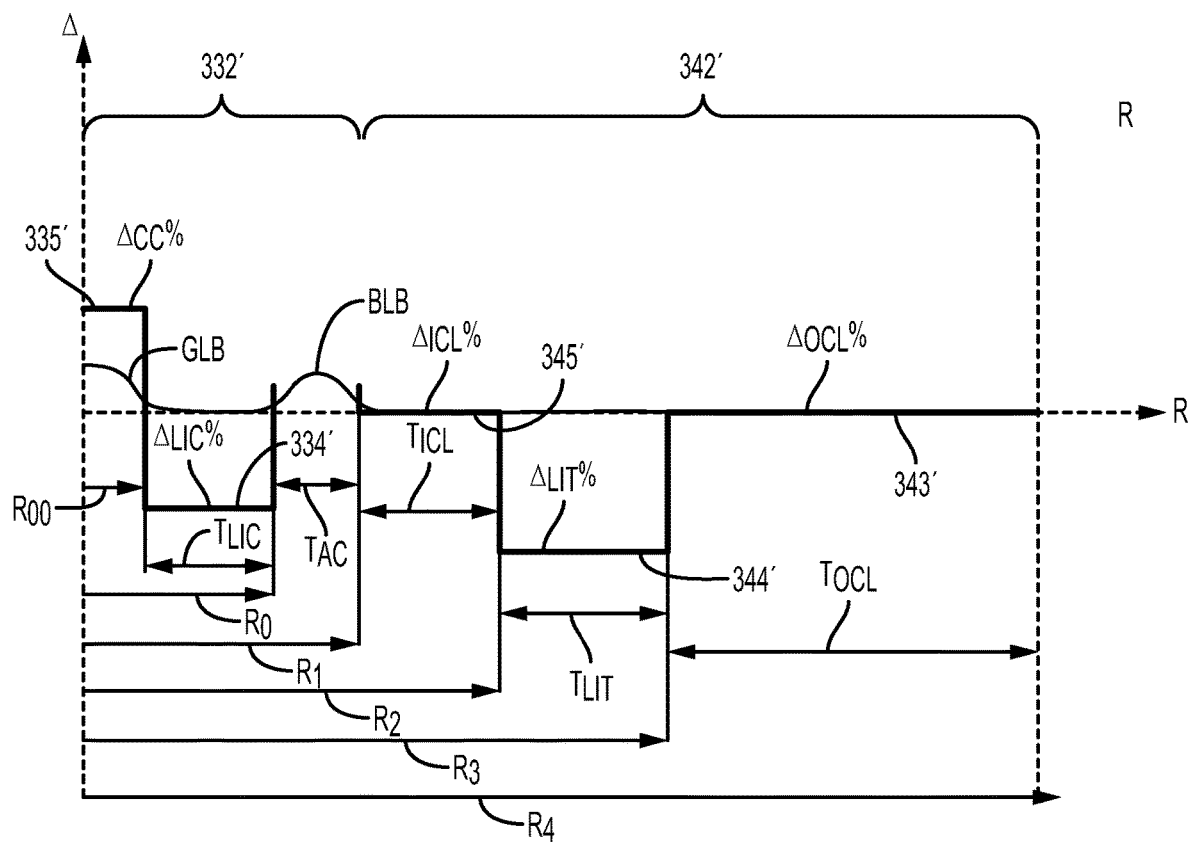
FIG. 16C graphically depicts the relative refractive index profile of the second segment of the optical fiber of FIG. 12B (in B-B cross-section) as a function of the radius r of the glass portion of the optical fiber according to one or more embodiments shown and described herein FIG. 17A schematically depicts an optical system for generating a "diffraction-free" beam using an optical fiber according to one or more embodiments shown and described herein.

The R-segment of the optical fiber 300' (segment 330') is shown in FIGS. 15B, 16B, and 16C. The R-segment of the optical fiber 300' (segment 330') is similar to that of the R segment (segment 330) of the fiber 300, as described above, but the core portion 332' of the fiber 300' is not circularly symmetrical. More specifically, t the core portion 332' is interrupted by one or more regions R of material that has lower index of refraction than that of the region 333' (e.g., pure silica, down doped silica, or one or more air holes H). In such embodiments the first core region 333', has a high relative refractive index $\Delta_{AC}\%$ relative to the cladding, but is discontinuous—i.e., it has a "broken ring shape, or a "partial ring" shape. Thus, in one cross-section (A-A) the fiber section 330' has a refractive index profile shown in FIG. 16B, and in another cross-section (cross section (B-B)) a refractive index profile shown in FIG. 16C. The air holes H or the regions R interrupt the symmetry of the core region 332', and disrupt the symmetry of the laser beam propagating through the fiber core.

Figure 13B:
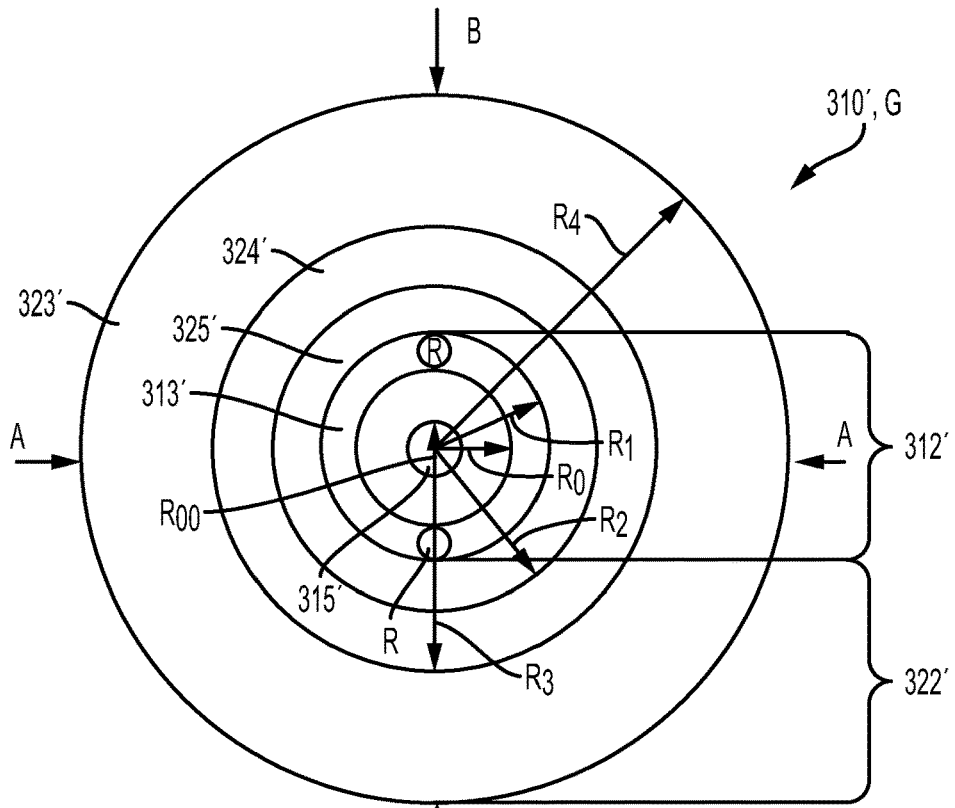
FIG. 13B schematically depicts a radial cross section of a first segment of the optical fiber of FIG. 4D according to one or more embodiments shown and described herein.

One embodiment of an optical fiber 300' comprises a first segment 310' (G-segment) optically coupled to a second segment 230' (R-segment) with a transition region 350'. The exemplary G-section of the optical fiber 300' (first segment 310') of this embodiment is shown in FIGS. 13B, 14B and 14C, and preferably also includes or more regions R (e.g., pure silica, down doped silica, or air holes H) that have lower index of refraction than that of the adjacent first core region 313' (i.e., lower relative refractive index than $\Delta_{AC}\%$, relative to the cladding). The refractive index profile in one cross-section (A-A) of the first segment 310' is illustrated in FIG. 14B, and in another cross-section (B-B) in FIG. 14C). The Gaussian laser beam GLB propagating through the first segment 310' seeks to propagate through a high-index core portion and thereby propagates or "follows" the second higher index portion of the core portion 333' as it transitions into the first core region 333', and does not significantly propagate through the regions of lower index material R or through the air hole(s) R of the fiber section that break the symmetry of the core region 333'.

Specifically, a Gaussian laser beam GLB is optically coupled to the inlet end 311' of the optical fiber 300' and propagates through the first segment 310' towards the second segment 330'. The Gaussian laser beam GLB propagates through the first central core region 315' of the first segment 310' towards the second segment 330'. Specifically, the Gaussian laser beam GLB is introduced into the first central core region 315' and propagates through the first segment 310 and into the transition region 350'. As the Gaussian laser beam GLB propagates through the transition region 350' and into the second segment 330', the decreased size of second central core region 335' is unable to significant support propagation of the Gaussian laser beam GLB and the optical power of the Gaussian laser beam GLB propagates, instead, in the second annular core region 333', thereby converting the Gaussian laser beam GLB into non-asymmetrical shaped laser beam (e.g., broken ring or partial ring shaped beam). The non-asymmetrical shaped laser beam propagates through the second segment 330' within the second non-axisymmetric core region 333'.

The non-axisymmetric laser beam exits the optical fiber 300' through an outlet end 331'. The Gaussian laser beam GLB can be coupled to the inlet end 311' of the optical fiber 300' through a lens system (see FIG. 3B), direct butt-coupling (see FIG. 3D) or fusion splicing (not shown). The non-axisymmetric laser beam incident on the outlet end 331' of the optical fiber 300' can be focused with free space bulk optics (see FIG. 3B) or a fiber lens directly formed or attached to the outlet end 331' (see FIG. 3F). In some embodiments, the portion of the Gaussian laser beam GLB maintained within the second central core region 335' may be less than 10% of the Gaussian laser beam GLB propagating through the first central core region 315' of the first segment 310'. In some embodiments, the portion of the Gaussian laser beam GLB maintained within the second central core region 335' may be blocked from exiting the outlet end 331 using paint to cover the second central core region 335' at the outlet end 331', forming an aperture in the second central core region 335' at the outlet end 331', etc.

If the outlet end 331' of the optical fiber 300' is curved, and/or forms a focusing lens surface, then optical fiber 300' forms an non-axisymmetric (non-circularly symmetric) Bessel laser beam BLB and the Bessel laser beam BLB exits the optical fiber 300' having undergone the transformation from the Gaussian laser beam to an non-axisymmetric (focused) Bessel laser beam. The non-axisymmetric laser beam provided to the outlet end 331' of the optical fiber 300' can be focused with free space bulk optics 1301, 130A (see FIG. 3D) or a lens may be directly formed on the outlet end 331' of the optical fiber (not shown), or attached to the outlet end 331' of the optical fiber (FIG. 3F)

It is noted that if the optical fiber 300 is utilized instead of an optical fiber 300' to create a non-axisymmetric Bessel beam, a small fiber segment with the geometry and the refractive index profiles shown in FIGS. 14B, 16B and 16C of can be attached to the endface of the segment 330 optical fiber 300 and utilized as the end-cap 1000, for converting an axi-symmetrical ring shaped laser beam propagating through the segment 330 (R-segment) of the optical fiber 300 into a laser beam that is non-axisymmetric. Other end-caps (for example those described above) that introduce asymmetry to the ring-shaped beam propagating through the optical fiber 300 may also be utilized. When focused, the non-axisymmetric beam propagating the end-cap 1000 utilized in conjunction with the fiber 300 (or through the fiber 300') forms a non-axisymmetric laser beam (e.g., non-axisymmetric Bessel beam) which results in a non-axisymmetric spot 14.

Figure 17A:
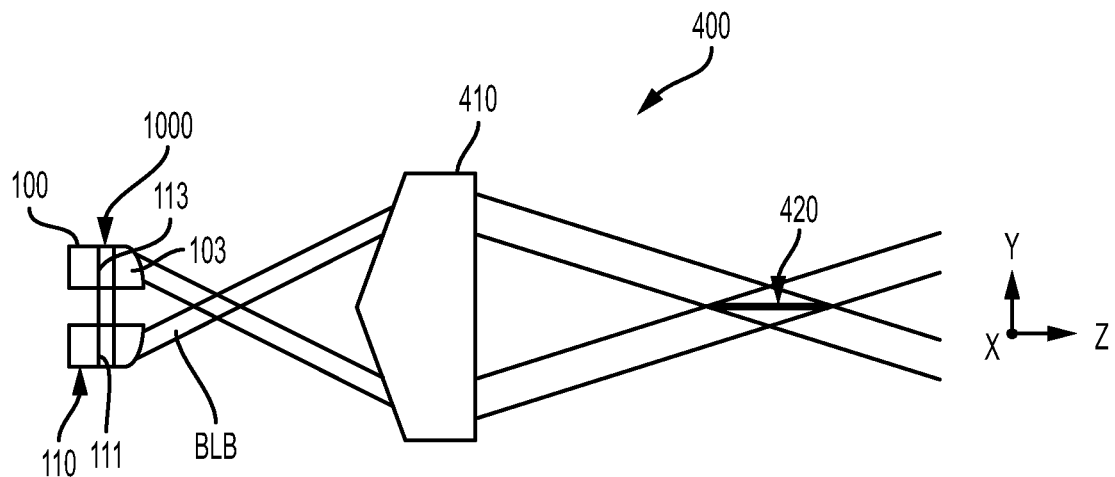
FIG. 17B schematically depicts an optical system for generating a "diffraction-free" beam using an optical fiber according to one or more embodiments shown and described herein.
FIG. 17C illustrates of one embodiment of non-axisymmetric beam provided by the optical systems of FIGS. 17A and 17B.

FIGS. 4A and 17A illustrate schematically an optical system 400 for generating a non-diffracting and/or a quasi non-diffracting laser beam(s). The optical system 400 includes an optical fiber 100 with a first segment 110 optically coupled to a second segment 130 with a transition region 150, as described hereinabove with respect to FIGS. 4A and 5A-8A. As shown in FIG. 17A, in this embodiment an end-cap 1000 is situated at the outlet end 111 of the optical fiber 100. It should be appreciated that the optical system 400 may include an optical fiber 200 as described with respect to FIGS. 4A and 9A-12A or an optical fiber 300 as described with respect to FIGS. 4D and 13A-16A instead of the optical fiber 100. For clarity, only the first annular core region 113 at the outlet end 111 of the first segment 110 is depicted in FIG. 17A, i.e., the first cladding portion 122 is not shown. The outlet end 111 is coupled to the endface lens 103 through the end-cap 1000. The endface lens 103 may be formed directly on the outlet end of the end-cap 1000 (not shown), or alternatively, the endface lens 103 may be attached to the end-cap 1000. For example, the endface lens 103 can be made with conventional polishing or laser based processes that shape the outlet end of the end-cap 1000, or by forming a desired surface shape on a separate fused silica rod which is then fusion spliced to end-cap 1000.

Figure 17B:
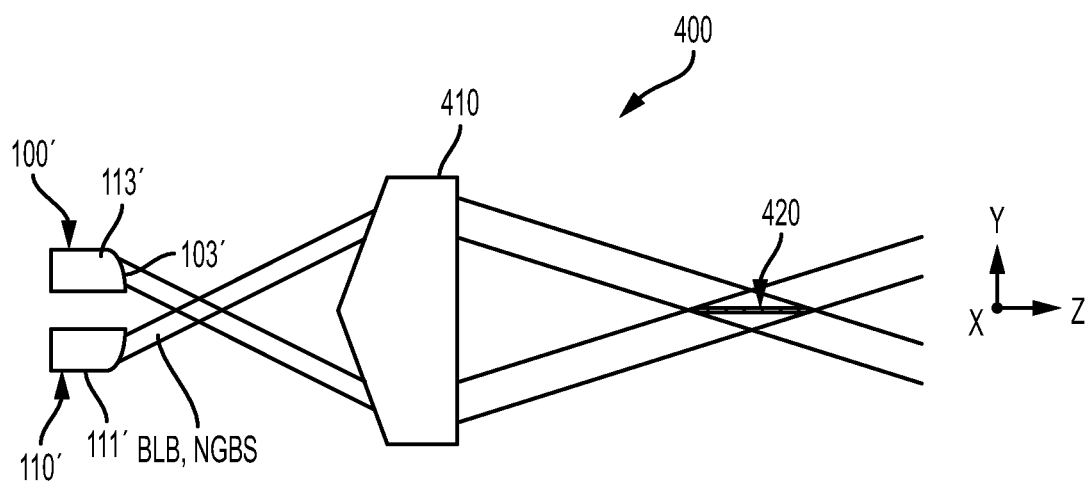

Alternatively, if the optical fiber 100' is utilized instead of the optical fiber 100, no end-cap is necessary as shown in FIG. 17B. In these embodiment the optical system 400 instead utilizes optical fiber 100' with a first segment 110' optically coupled to a second segment 130' through a transition region 150', as described hereinabove. It should be appreciated that the optical system 400 may include an optical fiber 200' as described with respect to FIGS. 4B and 9B, 10B, 10C, 11B, 12B and 12C, or an optical fiber 300' as described with respect to FIGS. 4D and 13B, 14B, 14C, 15B, 16B and 16C instead of the optical fiber 100'. For clarity, only the first annular core region 113' at the outlet end 111' of the first segment 110' is depicted in FIG. 17B, i.e., the first cladding portion 122' is not shown. The outlet end 111' has an endface lens 103 that can greatly increase the beam size of the Bessel laser beam BLB on the surface of the outlet end 111' of the optical fiber 100' in order to mitigate potential surface damage of the outlet end 111' due to high intensity of the incident ring-shaped laser beam (RSB). The endface lens 103' may be formed directly on the outlet end 111' (not shown) of the optical fiber 100', or in the alternative, the endface lens 103' may be attached to the outlet end 111' of the optical fiber 100'. For example, the endface lens 103' can be made with conventional polishing or laser based processes that shape the outlet end 111' of the optical fiber 100' or by forming a desired surface shape on a separate fused silica rod which is then fusion spliced to the outlet end 111' of the optical fiber 100'.

In the embodiments shown in FIGS. 17A, 17B, a Bessel laser beam BLB converted from an original Gaussian laser beam GLB is imaged by the endface lens 103, 103' and projected on to an axicon prism 410. In these embodiments, the endface lens 103,103' has a focal length of less than 10 millimeters (mm). The Bessel laser beam BLB passes through the axicon prism 410 which re-focuses the Bessel laser beam BLB to a line (laser beam focal line), rather than to a point, and re-shapes the Bessel laser beam BLB into a "diffraction-free" beam 420 (i.e., into a quasi-non-diffracting beam). In these embodiments the $F_D$ value of the Bessel laser beam BLB is at least 10. For example $F_D$ value of the Bessel laser beam BLB may be 10 to 5000. For example, at least 50, at least 100, at least 250, at least 500, at least 1000, in the range from 10 to 2000, in the range from 50 to 1500, or in the range from 100 to 1000.

Figure 17C:
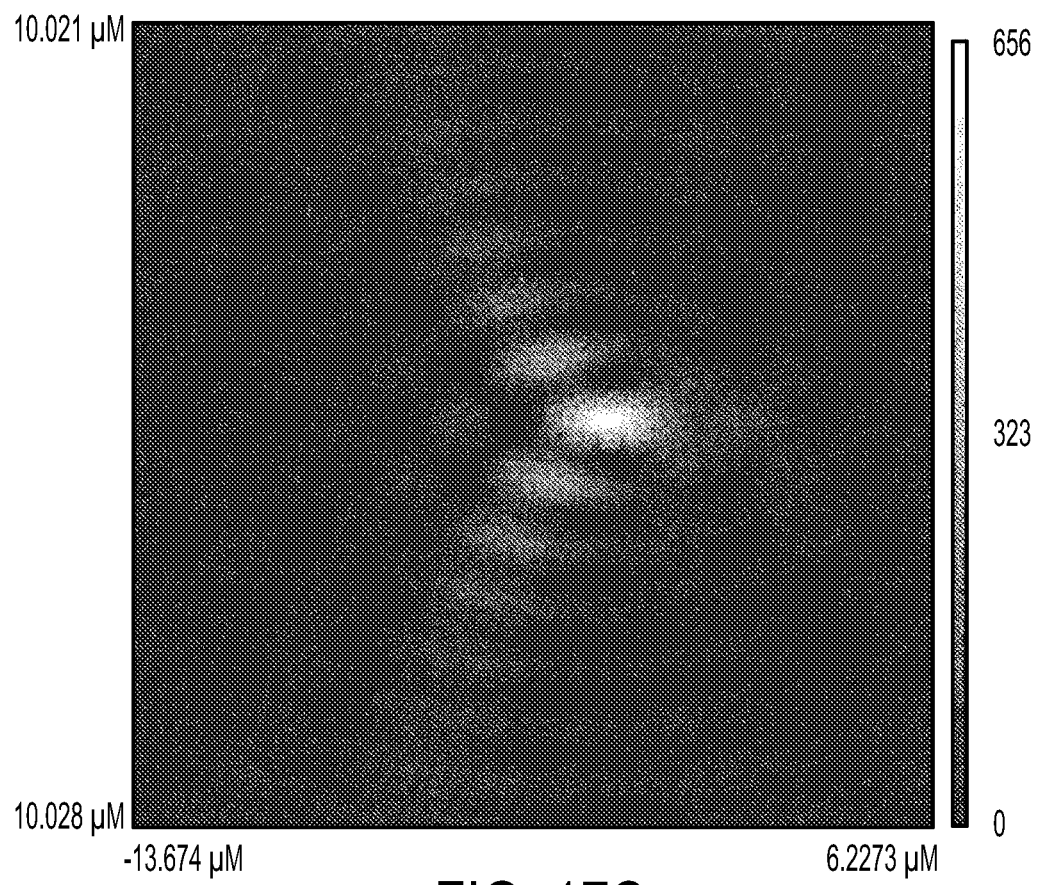
Figure 19A:
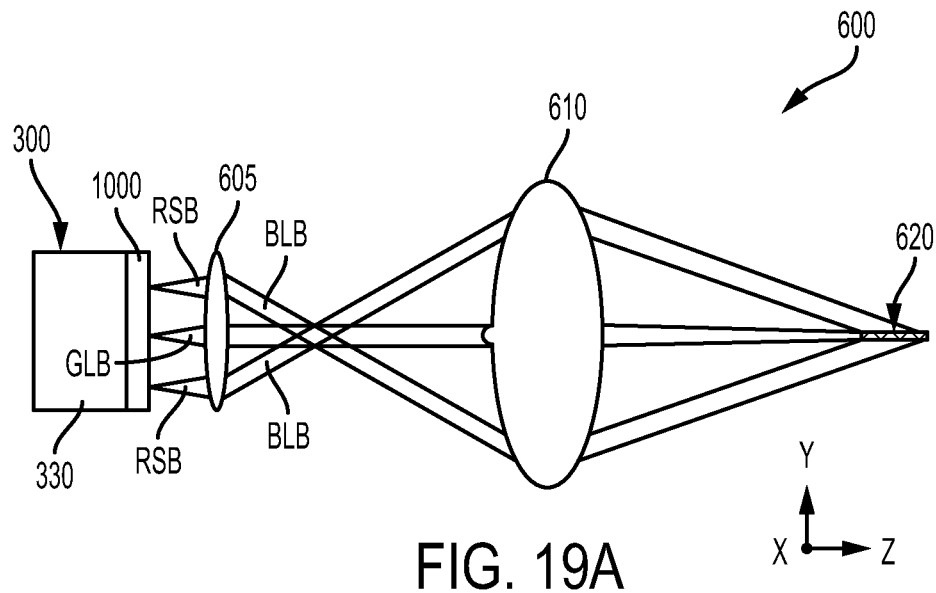
FIG. 19A schematically depicts an optical system for generating a "hybrid" Gauss-Bessel laser beam using an optical fiber according to one or more embodiments shown and described herein FIG. 19B schematically depicts another embodiment of the optical system for generating a "hybrid" Gauss-Bessel laser beam using an optical fiber according to one or more embodiments shown and described herein and FIG. 20 schematically depicts another embodiment optical system for generating a "hybrid" Gauss-Bessel laser beam using an optical fiber according to one or more embodiments shown and described herein.
Figure 19B:
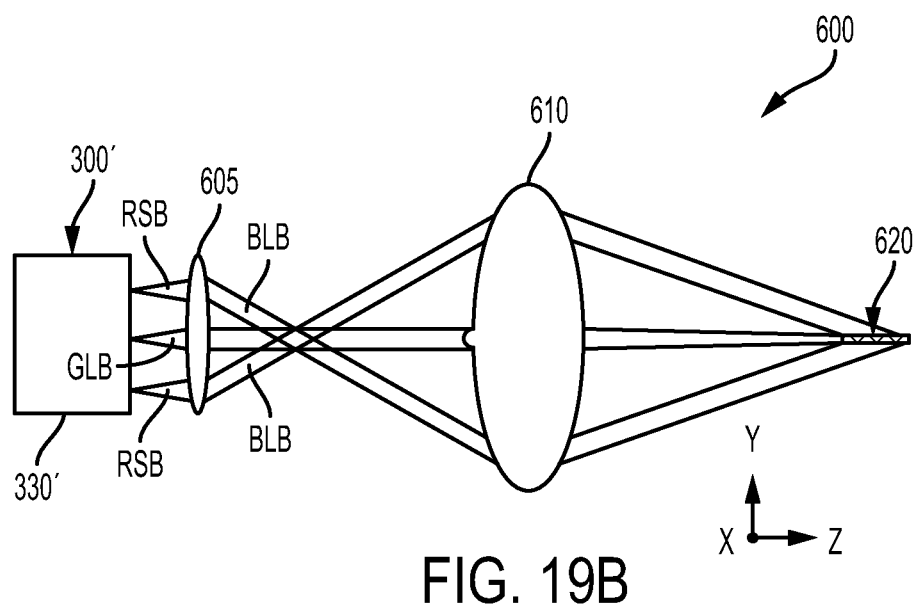
Figure 20:
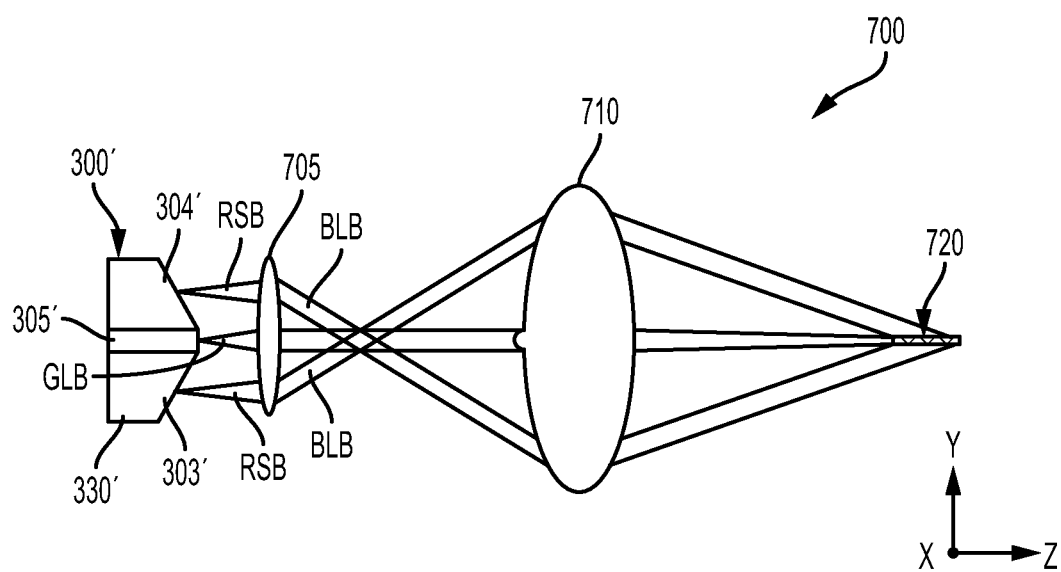

FIG. 17C illustrates abeam intensity profile that is provided with the optical system 400 of FIG. 17A or 17B. The non-axysymmetrical beam passes through an axicon prism 410 as described above, and reshaped so that a desirable diffraction free elliptical beam with a beam intensity profile shown in FIG. 17C can be formed.

Figure 18A:
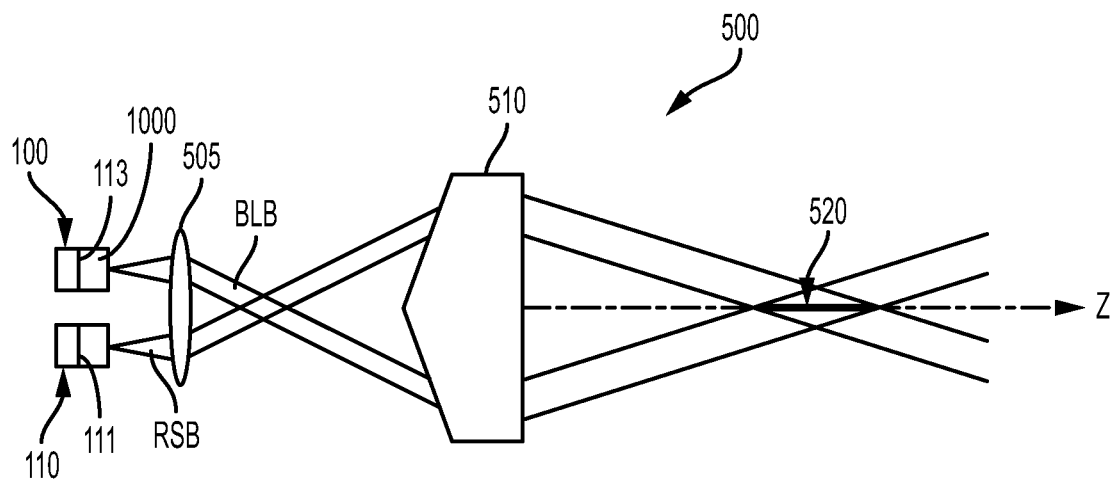
FIG. 18A schematically depicts another optical system for generating a "diffraction-free" beam using an optical fiber according to one or more embodiments shown and described herein.

FIGS. 4A and 18A illustrate another embodiment of an optical system 500 for generating a "diffraction-free" beam. The optical system 500 includes an optical fiber 100 with a first segment 110 optically coupled to a second segment 130 (not shown) with a transition region 150 (not shown). For clarity, only the first annular core region 113 at the outlet end 111 of the first segment 110 is depicted in FIG. 18A, i.e., the first cladding portion 122 is not shown. It should be appreciated that the optical system 500 may include an optical fiber 200 as described with respect to FIGS. 4A and 9A-12A or an optical fiber 300 as described with respect to FIGS. 4C and 13A-15A instead of the optical fiber 100. The optical system 500 of FIG. 18A further includes an end-cap 1000 situated on the output end of the optical fibers 100 (or 200, or 300) the end-cap 1000 being situated adjacent to and facing the lens 505. A laser beam converted from a Gaussian laser beam GLB to a ring-shaped beam RSB is emitted by the optical fiber 100, converted to an a non-axisymmetric beam by the end-cap 1000 and is imaged by the lens 505 which may be, for example, a spherical lens, an aspherical lens with a surface profile that does not include portions of a sphere or cylinder, or the like. In some embodiments, the aspheric lens may comprise a conical wavefront producing optical element, such as an axicon lens, for example, a negative refractive axicon lens, a positive refractive axicon lens, a reflective axicon lens, a diffractive axicon lens, a programmable spatial light modulator axicon lens (e.g., a phase axicon), or the like. According to some embodiments the aspheric lens is for example, a refractive axicon, a reflective axicon, a waxicon, a spatial light modulator, a diffractive optic, or a cubically shaped optical element (not shown). In embodiments, an axisymetrical Bessel laser beam propagates from the optical fiber 100 enters into the end-cap 1000, which makes the Bessel beam non-axisymetric (e.g., by blocking a portion of the beam propagating through the end-cap) and the lens 505 reimages the non-axisymetric Bessel laser beam BLB provided by the end-cap 1000 such that the width of the Bessel laser beam BLB is at least ten times larger than the diameter $D_0$ of the optical fiber 100. The imaged non-axisymetric Bessel laser beam BLB is incident on the axicon prism 510 which focuses the Bessel laser beam BLB to a line (rather than to a point) and reshapes the Bessel laser beam BLB into a desirable "diffraction-free" beam 520 (in this embodiment, into a quasi non-diffracting beam) forming a laser focal line with a non-axisymetric (e.g., elliptical) cross-section.

Figure 18B:
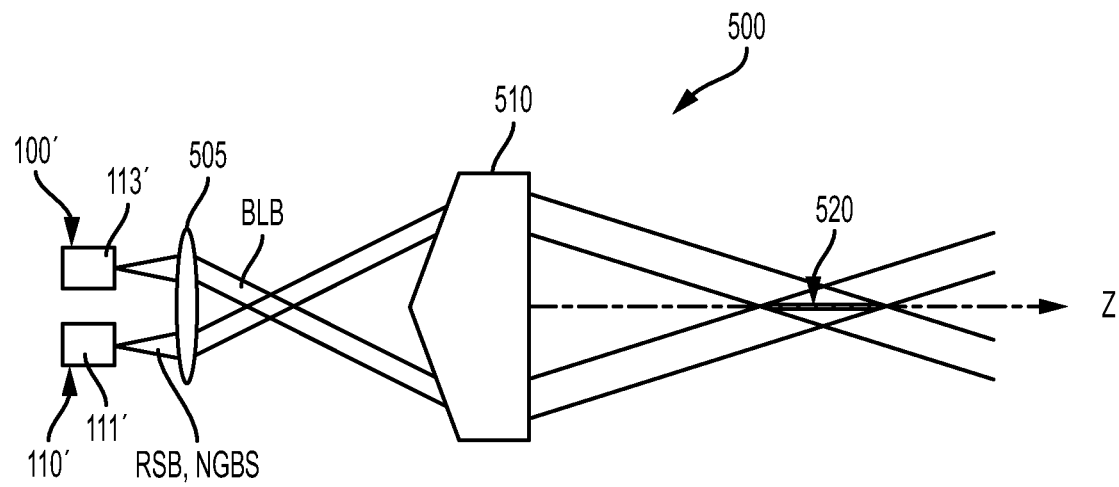
FIG. 18B schematically depicts an optical system for generating a "diffraction-free" beam using an optical fiber according to one or more embodiments shown and described herein.

Referring to FIGS. 4D and 18B, another embodiment of an optical system 500 for generating a "diffraction-free" beam is shown. The optical system 500 includes an optical fiber 100' with a first segment 110' optically coupled to a second segment 130' (not shown) with a transition region 150' (not shown). For clarity, only the first annular core region 113' at the outlet end 111' of the first segment 110' is depicted in FIG. 18B, i.e., the first cladding portion 122' is not shown. It should be appreciated that the optical system 500 may include an optical fiber 200' as described with respect to FIGS. 4B and 9B, 10B, 10C, 11B, 12B, 12C or an optical fiber 300' as described with respect to FIGS. 4D and 13B, 14B, 14C, 15B, 16B and 16C instead of the optical fiber 100'. A laser beam converted from a Gaussian laser beam GLB to a non-axisymmetric shaped beam (e.g., broken ring shaped beam or partial ring shaped beam) is emitted by the optical fiber 100' and is imaged by the lens 505 which may be, for example, a spherical lens, an aspherical lens with a surface profile that does not include portions of a sphere or cylinder, or the like. In some embodiments, the aspheric lens (also referred to as an aspheric optical element herein) may comprise a conical wavefront producing optical element, such as an axicon lens, for example, a negative refractive axicon lens, a positive refractive axicon lens, a reflective axicon lens, a diffractive axicon lens, a programmable spatial light modulator axicon lens (e.g., a phase axicon), or the like. The aspheric optical element may be, for example, a refractive axicon, a reflective axicon, waxicon, a spatial light modulator, a diffractive optic, or a cubically shaped optical element (not shown). In embodiments, the non-axisymmetric Bessel laser beam BLB propagates from the optical fiber 100' and the lens 505 reimages the Bessel laser beam BLB such that the width of the Bessel laser beam BLB is at least ten times larger than the diameter $D_0$ of the optical fiber 100'. The imaged Bessel laser beam BLB is incident on the axicon prism 510 which focuses the Bessel laser beam BLB to a line (rather than to a point) and reshapes the Bessel laser beam BLB into a desirable "diffraction-free" beam 520 (in this embodiment, into a quasi non-diffracting beam) forming a laser focal line with a non-axisymmetric (e.g., elliptical) cross-section.

It should be appreciated that when the Bessel laser beam BLB reaches the axicon prism 410 shown in FIG. 17A, 17B and axicon prism 510 shown in FIG. 18A, 18B the optical signal in a central region of the Bessel laser beam BLB is minimized. As a result, the configuration of the optical systems 400, 500 are insensitive to the shape of a central apex area of the axicon prism 410, 510. This is especially beneficial for optical system configurations using an axicon prism since most axicon prisms suffer from quality control issues near the apex region due to manufacturing process limitations and the central apex area may perform like a conventional lens which greatly deteriorates beam quality of the "diffraction-free" beam. Accordingly, the optical system configurations shown in FIGS. 17A, 17B, 18A, and 18B effectively avoid axicon prism central apex area issues and produce a high quality "diffraction-free" beam (i.e., a quasi non-diffracting beam) with a non-circular cross-section. According to this embodiment the $F_D$ value of the laser beam is at least 10. For example, at least 50, at least 100, at least 250, at least 500, at least 1000, or for example in the range from 10 to 2000, in the range from 50 to 1500, or in the range from 100 to 1000.

Referring to FIGS. 4C, 13A-16A, and 19A, an optical system 600 for generating a "hybrid" Gauss-Bessel laser beam which has both "diffraction-free" and Gaussian properties is shown. The optical system 600 includes an optical fiber 300 with a first segment 310 optically coupled to a second segment 330 with a transition region 350. The optical system 600 also includes at least one lens 605 and a bifocal lens 610. A beam exiting the second segment 330 of the optical fiber 300 has a ring-shaped portion and a Gaussian laser beam GLB portion, as described herein. The is ring-shaped beam (RSB) portion emitted by the optical fiber 300 is converted into a non-axisymmetric beam portion (e.g., a broken ring shaped beam, or a partial ring shaped beam) by the end-cap 1000, is reimaged by the at least one lens 605 which may be, for example, a spherical lens, an aspherical lens, or the like. In embodiments, the ring shape beam RSB portion propagates from the optical fiber 30, and the lens 605 forms the Bessel laser beam BLB such that the outer width (or outer diameter) of the Bessel laser beam BLB portion is at least ten times larger than the diameter $D_0$ of the optical fiber 300. The Bessel laser beam BLB formed by the lens 605 is incident on an outer portion of the bifocal lens 610 which reshapes the Bessel laser beam BLB into a desirable "diffraction-free" beam (i.e., in this embodiment, into a quasi non-diffracting beam). Simultaneously, the Gaussian laser beam GLB portion of the beam exiting the second segment 330 of the optical fiber 300 passes through the at least one lens and is reimaged by a central portion of the bifocal lens 610. The bifocal lens 610 effectively combines the Bessel laser beam BLB portion and the Gaussian laser beam GLB portion together to form a hybrid beam 620 in which a majority of the hybrid beam 620 is "diffraction-free". Also, in embodiments where the Gaussian laser beam GLB is not desired or need, the Gaussian laser beam GLB can be blocked by paint, an aperture, etc.

Referring to FIGS. 4D, 13B, 14B, 14C, 15B, 16B, 16C, and 19B, another optical system 600 for generating a "hybrid" Gauss-Bessel laser beam which has both "diffraction-free" and Gaussian properties is shown. The optical system 600 of FIG. 19B includes an optical fiber 300' with a first segment 310' optically coupled to a second segment 330' with a transition region 350', and does not require the end-cap 1000. The optical system 600 of FIG. 19B also includes at least one lens 605 and a bifocal lens 610. In this embodiment, a beam exiting the second segment 330' of the optical fiber 300' has an non-axisymmetric portion (e.g., a broken ring-shaped portion) and a Gaussian laser beam GLB portion, as described herein. The broken ring-shaped beam (broken RSB) portion emitted by the optical fiber 300' is thus non-axisymmetric and this non-axisymmetric beam is reimaged by the at least one lens 605 which may be, for example, a spherical lens, an aspherical lens, or the like. According to some embodiments the aspheric lens (or the aspheric component) utilized herein may comprise for example, a refractive axicon, a reflective axicon, waxicon, a spatial light modulator, a diffractive optic, or a cubically shaped optical element (not shown). In embodiments, the broken ring shape beam (broken RSB) portion propagates from the optical fiber 300', and the lens 605 forms the non-axisymmetric Bessel laser beam BLB such that the outer width of the Bessel laser beam BLB portion is at least ten times larger than the diameter $D_0$ of the optical fiber 300'. The Bessel laser beam BLB formed by the lens 605 is incident on an outer portion of the bifocal lens 610 which reshapes the non-axisymmetric Bessel laser beam BLB into a desirable "diffraction-free" beam (i.e., in this embodiment, into a quasi non-diffracting beam) that has a non-axisymmetric (e.g., elliptical) cross-section. Simultaneously, the Gaussian laser beam GLB portion of the beam exiting the second segment 330 of the optical fiber 300' passes through the at least one lens and is reimaged by a central portion of the bifocal lens 610. The bifocal lens 610 effectively combines the Bessel laser beam BLB portion and the Gaussian laser beam GLB portion together to form a hybrid beam 620 in which a majority of the hybrid beam 620 is "diffraction-free". Also, in embodiments where the Gaussian laser beam GLB is not desired or needed, the Gaussian laser beam GLB can be blocked by paint, an aperture, etc.

Referring to FIGS. 1A, 1B, 10-13, and 20, another optical system 700 for generating a "hybrid" Gauss-Bessel laser beam which has both "diffraction-free" and Gaussian properties is shown. The optical system 700 includes an optical fiber 300' with a first segment 310' optically coupled to a second segment 330' with a transition region 350'. The second segment 330' has an endface 303' with a tapered surface portion 304' and a flat core region 305' such that a non axisymmetric Bessel laser beam BLB portion and a Gaussian laser beam GLB portion exiting from an endface 303 of the optical fiber 300 have different optical paths and focal points which assists in converging and combining the Bessel laser beam BLB portion and the Gaussian laser beam GLB portion into a single beam which is "diffraction free". The optical system 700 also includes at least one lens 705 and a bifocal lens 710. A beam exiting the second segment 330' of the optical fiber 300' has a non-axisymmetric Bessel laser beam BLB portion and a Gaussian laser beam GLB portion, as described herein. The Bessel laser beam BLB portion emitted by the optical fiber 300' is initially reimaged by the endface 303' of the optical fiber 300' and then reimaged by the at least one lens 705 which may be, for example, a spherical lens, an aspherical lens, or the like. In embodiments, the lens 705 reimages the Bessel laser beam BLB such that the width (at least one outer diameter) of the Bessel laser beam BLB portion is at least ten times larger than the diameter $D_0$ of the optical fiber 300. The reimaged Bessel laser beam BLB is incident on an outer portion of the bifocal lens 710 which reshapes the Bessel laser beam BLB into a desirable non-diffracting beam or quasi non-diffracting beam. Simultaneously, the Gaussian laser beam GLB portion of the beam exiting the second segment 330' of the optical fiber 300' is initially reimaged by the flat core region 305' and thereafter passes through the at least one lens 705 and is reimaged by a central portion of the bifocal lens 710. The bifocal lens 710 effectively combines the Bessel laser beam BLB portion and the Gaussian laser beam GLB portion together to form a hybrid beam 720 in which a majority of the hybrid beam 720 is a "diffraction-free" beam (a quasi non-diffracting beam). In embodiments where the Gaussian laser beam GLB is not desired or need, the Gaussian laser beam GLB can be blocked by paint, an aperture, etc. It should be appreciated that the endface 303 of the second segment 330 may simplify the configuration of the lenses used to focus the beam emitted from the optical fiber 300. In embodiments, the endface 303' may be used to eliminate the at least one lens 705 and the bifocal lens 710 entirely.

EXAMPLES

The embodiments described herein will be further clarified by the following examples.

A summary of radii and relative refractive indices for five examples (Examples 1-5) of the optical fiber 100 depicted in FIGS. 1A and 5A-8A are shown in Table 1A below.

TABLE 1A

|  | Example 1 | Example 2 | Example 3 | Example 4 | Example 5 |
|---|---|---|---|---|---|
| $\Delta_{CH}\%$ | −26% | −26% | −26% | −26% | −26% |
| $\Delta_{AC}\%$ | 0.12% | 0.2% | 0.34% | 0.5% | 1% |
| $\Delta_{LIT}\%$ | −0.6% | −0.5% | −0.4% | −0.4% | 0% |
| $R_0$ (µm) | 10 | 20 | 15 | 25 | 30 |
| $R_1$ (µm) | 15 | 22.5 | 20 | 32 | 40 |
| $R_2$ (µm) | 20 | 34 | 25 | 32 | 40 |
| $R_3$ (µm) | 28 | 42.5 | 32 | 40 | 40 |
| $R_4$ (µm) | 125 | 80 | 75 | 83.3 | 73.5 |
| Taper ratio | 0.5 | 0.781 | 0.533 | 0.750 | 0.85 |
| $r_1$ (µm) | 5.7 | 8.3 | 7.2 | 15.7 | 24.6 |
| $r_2$ (µm) | 8.8 | 22.2 | 10.9 | 15.7 | 24.6 |
| $r_3$ (µm) | 13.2 | 30.2 | 15.4 | 24.6 | 24.6 |
| $r_4$ (µm) | 62.5 | 62.5 | 40.0 | 62.5 | 62.5 |

As shown in Table 1A, the relative refractive index $\Delta_{CH}\%$ for the channel 114 was −26% for Examples 1-5. The relative refractive index $\Delta_{AC}\%$ for the first annular core region 113 ranged from 0.12% to 1% and the relative refractive index $\Delta_{LIT}\%$ for the first low-index trench 124 ranged from 0% to −0.6%. The radius $R_0$ ranged from 10 µm to 30 µm; the radius $R_1$ ranged from 15 µm to 40 µm; the radius $R_2$ ranged from 20 µm to 40 µm; the radius $R_3$ ranged from 28 µm to 42.5 µm; and the radius $R_4$ ranged from 73.5 µm to 125 µm. The radial thickness $T_{AC}$ of the first annular core region 113 ranged from 2.5 µm to 10 µm; radial thickness $T_{ICL}$ of the first inner cladding portion 125 ranged from 0.0 µm to 12.5 µm; the radial thickness $T_{LIC}$ of the first low-index trench 124 ranged from 0.0 µm to 8.5 µm; and the radial thickness $T_{OCL}$ of the first outer cladding portion 123 ranged from 33.5 µm to 100 µm.

The taper ratio between the first segment 110 and the second segment 130 ranged from 0.5 to 0.85. The relative refractive index $\Delta_c\%$ for the second core portion 132 and the relative refractive index $\Delta_{lit}\%$ for the second low-index trench 144 were substantially equal to the relative refractive index $\Delta_{AC}\%$ for the first annular core region 113 and the relative refractive index $\Delta_{LIT}\%$ for the first low-index trench 124, respectively. The radius $r_1$ ranged from 5.7 µm to 24.6 µm; the radius $r_2$ ranged from 8.8 µm to 24.6 µm; the radius $r_3$ ranged from 13.2 µm to 30.2 µm; and the radius $r_4$ ranged from 40 µm to 62.5 µm. The radial thickness $t_{icl}$ of the second inner cladding portion 145 ranged from 0.0 µm to 13.9 µm; the radial thickness $t_{lic}$ of the second low-index trench 144 ranged from 0.0 µm to 8.9 µm; and the radial thickness $t_{ocl}$ of the second outer cladding portion 143 ranged from 24.6 µm to 49.3 µm.

The embodiments of optical fibers 100' (Examples 1'-5') are shown in Table 1B and are similar to the optical fiber 100 described above with reference to Table 1, and in cross-section A-A have a refractive index profiles of examples 1-5. For example, the core region 113' has a relative refractive index $\Delta_{AC}\%$, as shown in Table 1. However, optical fibers 100' utilize one or more regions R (e.g., comprising of pure silica, down doped silica, or air as shown in FIG. 5B, 7B) so that instead of having the first annular core region 113 that is axisymmetric (circularly symmetrical) the fibers 100' utilize a first core region 113' that is in the shape of a split or broken ring, or a partial ring (because regions R intercept the core region 113'). In the exemplary embodiments of Table 1B, regions R comprise down doped silica, pure silica or air, and has a width w=2$R_0$

TABLE 1B

|  | Example 1' | Example 2' | Example 3' | Example 4' | Example 5' |
|---|---|---|---|---|---|
| $\Delta_{CH}\%$ | −26% | −26% | −26% | −26% | −26% |
| $\Delta_{AC}\%$; | 0.12% | 0.2% | 0.34% | 0.5% | 1% |
| Region R = air | −26% | −26% | −26% | −26% | −26% |
| $\Delta_{LIT}\%$ | −0.6% | −0.5% | −0.4% | −0.4% | 0% |
| $R_0$ (μm) | 10 | 20 | 15 | 25 | 30 |
| $R_1$ (μm) | 15 | 22.5 | 20 | 32 | 40 |
| $R_2$ (μm) | 20 | 34 | 25 | 32 | 40 |
| $R_3$ (μm) | 28 | 42.5 | 32 | 40 | 40 |
| $R_4$ (μm) | 125 | 80 | 75 | 83.3 | 73.5 |
| Taper ratio | 0.5 | 0.781 | 0.533 | 0.750 | 0.85 |
| $r_1$ (μm) | 5.7 | 8.3 | 7.2 | 15.7 | 24.6 |
| $r_2$ (μm) | 8.8 | 22.2 | 10.9 | 15.7 | 24.6 |
| $r_3$ (μm) | 13.2 | 30.2 | 15.4 | 24.6 | 24.6 |
| $r_4$ (μm) | 62.5 | 62.5 | 40.0 | 62.5 | 62.5 |

A summary of radii and relative refractive indices for three examples (Examples 6-8) of the optical fiber 200 depicted in FIGS. 4A and 9A-12A are shown in Table 2A below.

TABLE 2A

|  | Example 6 | Example 7 | Example 8 |
|---|---|---|---|
| $\Delta_{LIC}\%$ | −0.5% | −0.5% | 0% |
| $\Delta_{AC}\%$ | 0.34% | 0.5% | 1% |
| $\Delta_{LIT}\%$ | −0.5% | −0.4% | 0% |
| $R_0$ (μm) | 3 | 5 | 4 |
| $R_1$ (μm) | 10 | 12 | 10 |
| $R_2$ (μm) | 18 | 12 | 10 |
| $R_3$ (μm) | 30 | 12 | 10 |
| $R_4$ (μm) | 125 | 125 | 125 |
| Taper ratio | 0.5 | 0.4 | 0.32 |
| $r_0$ (μm) | 1.5 | 2.0 | 1.3 |
| $r_1$ (μm) | 5.0 | 4.8 | 3.2 |
| $r_2$ (μm) | 9.0 | 4.8 | 3.2 |
| $r_3$ (μm) | 15.0 | 4.8 | 3.2 |
| $r_4$ (μm) | 62.5 | 50.0 | 40.0 |

As shown in Table 2A, the relative refractive index $\Delta_{LIC}\%$ for the first low-index core region 214 ranged from 0% to −0.5%; the relative refractive index $\Delta_{AC}\%$ for the first annular core region 213 ranged from 0.34% to 1% and the relative refractive index $\Delta_{LIT}\%$ for the first low-index trench 224 ranged from 0% to −0.5%. The radius $R_0$ ranged from 3 μm to 5 μm; the radius $R_1$ ranged from 10 μm to 12 μm; the radius $R_2$ ranged from 10 μm to 18 μm; the radius $R_3$ ranged from 10 μm to 30 μm; and the radius $R_4$ was 125 μm for Examples 6-8. The radial thickness $T_{AC}$ of the first annular core region 213 ranged from 6 μm to 7 μm; radial thickness $T_{ICL}$ of the first inner cladding portion 225 ranged from 0.0 μm to 8 μm; the radial thickness $T_{LIC}$ of the first low-index trench 224 ranged from 0.0 μm to 12 μm; and the radial thickness $T_{OCL}$ of the first outer cladding portion 223 ranged from 95 μm to 115 μm.

The taper ratio between the first segment 210 and the second segment 230 ranged from 0.32 to 0.5. The relative refractive index $\Delta_{lic}\%$ for the second low-index core region 234, the relative refractive index $\Delta_{ac}\%$ for the second annular core region 233 and the relative refractive index $\Delta_{lit}\%$ for the second low-index trench 244 were substantially equal to the relative refractive index $\Delta_{LIC}\%$ for the first low-index core region 214, the relative refractive index $\Delta_{AC}\%$ for the first annular core region 213 and the relative refractive index $\Delta_{LIT}\%$ for the first low-index trench 224, respectively. The radius $r_0$ ranged from 1.3 μm to 2 μm; the radius $r_1$ ranged from 3.2 μm to 5 μm; the radius $r_2$ ranged from 3.2 μm to 9 μm; the radius $r_3$ ranged from 3.2 μm to 15 μm; and the radius $r_4$ ranged from 40 μm to 62.5 μm. The radial thickness $t_{ac}$ of the second annular core region 233 ranged from 1.9 μm to 3.5 μm; the radial thickness $t_{icl}$ of the second inner cladding portion 245 ranged from 0.0 μm to 4 μm; the radial thickness $t_{lic}$ of the second low-index trench 244 ranged from 0.0 μm to 6 μm; and the radial thickness $t_{ocl}$ of the second outer cladding portion 243 ranged from 36.8 μm to 47.5 μm.

The embodiments of optical fibers 200' (Examples 6'-8') are shown in Table 2B and are similar to the optical fiber 200 described above with reference to Table 2A, and in cross-section A-A have a refractive index profiles of examples 6-8. For example, the core region 213' has a relative refractive index $\Delta_{AC}\%$, as shown in Table 2B and the core region 233' has the a relative refractive index $\Delta_{ac}\%$. However, optical fibers 200' utilize one or more regions R (e.g., comprising of pure silica, down doped silica, or air as shown in FIGS. 9B, 10B, 10C, 11B, 12B and 12C) so that instead of having the first annular core region 213 that is axisymmetrical, optical fibers 200' utilize a first core region 213' that is in a shape of a broken ring or a partial ring (because regions R intercept the core region 213'). In the exemplary embodiments of Table 2B, regions R are pure silica (but in alternative embodiments could be downdoped silica, or air) and have a width w=2$R_0$

TABLE 2B

|  | Example 6 | Example 7 | Example 8 |
|---|---|---|---|
| $\Delta_{LIC}\%$ | −0.5% | −0.5% | 0% |
| $\Delta_{AC}\%$; | 0.34 | 0.5% | 1% |
| Region R = pure silica | 0% | 0% | 0% |
| $\Delta_{LIT}\%$ | −0.5% | −0.4% | 0% |
| $R_0$ (μm) | 3 | 5 | 4 |
| $R_1$ (μm) | 10 | 12 | 10 |
| $R_2$ (μm) | 18 | 12 | 10 |
| $R_3$ (μm) | 30 | 12 | 10 |
| $R_4$ (μm) | 125 | 125 | 125 |
| Taper ratio | 0.5 | 0.4 | 0.32 |
| $r_0$ (μm) | 1.5 | 2.0 | 1.3 |
| $r_1$ (μm) | 5.0 | 4.8 | 3.2 |
| $r_2$ (μm) | 9.0 | 4.8 | 3.2 |
| $r_3$ (μm) | 15.0 | 4.8 | 3.2 |
| $r_4$ (μm) | 62.5 | 50.0 | 40.0 |

A summary of radii and relative refractive indices for three examples (Examples 9-11) of the optical fiber 300 depicted in FIGS. 4C and 13A-16A are shown in Table 3A below.

TABLE 3A

|  | Example 9 | Example 10 | Example 11 |
|---|---|---|---|
| $\Delta_{CC}\%$ | 0.34% | 0.1% | 0.2% |
| $\Delta_{LIC}\%$ | 0% | −0.2% | 0% |
| $\Delta_{AC}\%$ | 0.5% | 0.75% | 1% |
| $\Delta_{LIT}\%$ | −0.5% | −0.4% | 0% |
| $R_{00}$ (μm) | 4 | 6 | 7 |
| $R_0$ (μm) | 9 | 12 | 20 |
| $R_1$ (μm) | 15 | 22 | 30 |
| $R_2$ (μm) | 20 | 22 | 30 |
| $R_3$ (μm) | 30 | 50 | 30 |
| $R_4$ (μm) | 125 | 125 | 125 |
| Taper ratio | 0.5 | 0.4 | 0.5 |
| $r_{00}$ (μm) | 2.0 | 2.4 | 3.5 |
| $r_0$ (μm) | 4.5 | 4.8 | 10.0 |
| $r_1$ (μm) | 7.5 | 8.8 | 15.0 |
| $r_2$ (μm) | 10.0 | 8.8 | 15.0 |

TABLE 3A-continued

|  | Example 9 | Example 10 | Example 11 |
|---|---|---|---|
| $r_3$ (μm) | 15.0 | 20.0 | 15.0 |
| $r_4$ (μm) | 62.5 | 50.0 | 62.5 |

As shown in Table 3A, the relative refractive index $\Delta_{CC}\%$ for the first central core region 315 ranged from 0.1% to 0.34%; the relative refractive index $\Delta_{LIC}\%$ for the first low-index core region 314 ranged from 0% to −0.2%; the relative refractive index $\Delta_{AC}\%$ for the first annular core region 313 ranged from 0.5% to 1%; and the relative refractive index $\Delta_{LIT}\%$ for the first low-index trench 324 ranged from 0% to −0.5%. The radius $R_{00}$ ranged from 4 μm to 7 μm; the radius $R_0$ ranged from 9 μm to 20 μm; the radius $R_1$ ranged from 15 μm to 30 μm; the radius $R_2$ ranged from 20 μm to 30 μm; the radius $R_3$ ranged from 30 μm to 50 μm; and the radius $R_4$ was 125 μm for Examples 9-11. The radial thickness $T_{LIC}$ of the first low-index core region 314 ranged from 5 μm to 13 μm; radial thickness $T_{AC}$ of the first annular core region 313 ranged from 6 μm to 10 μm; the radial thickness $T_{ICL}$ of the first inner cladding portion 325 ranged from 0.0 μm to 5 μm; the radial thickness $T_{LIC}$ of the first low-index trench 324 ranged from 0.0 μm to 28 μm; and the radial thickness $T_{OCL}$ of the first outer cladding portion 323 ranged from 75 μm to 95 μm.

The taper ratio between the first segment 310 and the second segment 330 ranged from 0.4 to 0.5. The relative refractive index $\Delta_{cc}\%$ for the second central core region 335, the relative refractive index $\Delta_{lic}\%$ for the second low-index core region 334, the relative refractive index $\Delta_{ac}\%$ for the second annular core region 333, and the relative refractive index $\Delta_{lit}\%$ for the second low-index trench 344 were substantially equal to the relative refractive index $\Delta_{CC}\%$ for the first central core region 315, the relative refractive index $\Delta_{LIC}\%$ for the first low-index core region 314, the relative refractive index $\Delta_{AC}\%$ for the first annular core region 313, and the relative refractive index $\Delta_{LIT}\%$ for the first low-index trench 324, respectively. The radius $r_{00}$ ranged from 2 μm to 3.5 μm; the radius $r_0$ ranged from 4.5 μm to 10 μm; the radius $r_1$ ranged from 7.5 μm to 15 μm; the radius $r_2$ ranged from 8.8 μm to 15 μm; the radius $r_3$ ranged from 15 μm to 20 μm; and the radius $r_4$ ranged from 50 μm to 62.5 μm. The radial thickness $t_{lic}$ of the second low-index core region 334 ranged from 2.4 μm to 6.5 μm; the radial thickness $t_{ac}$ of the second annular core region 333 ranged from 3 μm to 5 μm; the radial thickness $t_{icl}$ of the second inner cladding portion 345 ranged from 0.0 μm to 2.5 μm; the radial thickness $t_{lic}$ of the second low-index trench 344 ranged from 0.0 μm to 11.2 μm; and the radial thickness $t_{ocl}$ of the second outer cladding portion 343 ranged from 30 μm to 47.5 μm.

The embodiments of optical fibers 300' (Examples 9'-11') are depicted in Table 3B and are similar to the optical fiber 300 described above with reference to Table 3A, and in cross-section A-A have refractive index profiles similar to those of examples 9-11. For example, the core region 325' has a relative refractive index $\Delta_{AC}\%$, as shown in Table 3A and the core region 333 has a relative refractive index $\Delta_{ac}\%$. However, optical fibers 300' utilize one or more regions R (e.g., comprising of pure silica, down doped silica, or air as shown in FIGS. 13B, 14B, 14C, 15B, and 15C) so that instead of having first annular core regions 313, 333 that are axisymmetrical, optical fibers 300' utilize core regions 313', 333' that are in the shape of a broken ring or a partial ring (because regions R intercept the core region 313', 333'). In the exemplary embodiments of Table 3B, regions R are air (but downdoped silica or pure can also be utilized), and have a width w=2$R_0$

TABLE 3B

|  | Example 9 | Example 10 | Example 11 |
|---|---|---|---|
| $\Delta_{CC}\%$ | 0.34% | 0.1% | 0.2% |
| $\Delta_{LIC}\%$ | 0% | −0.2% | 0% |
| $\Delta_{AC}\%$/ | 0.5% | 0.75% | 1% |
| Air | −26% | −26% | −26% |
| $\Delta_{LIT}\%$ | −0.5% | −0.4% | 0% |
| $R_{00}$ (μm) | 4 | 6 | 7 |
| $R_0$ (μm) | 9 | 12 | 20 |
| $R_1$ (μm) | 15 | 22 | 30 |
| $R_2$ (μm) | 20 | 22 | 30 |
| $R_3$ (μm) | 30 | 50 | 30 |
| $R_4$ (μm) | 125 | 125 | 125 |
| Taper ratio | 0.5 | 0.4 | 0.5 |
| $r_{00}$ (μm) | 2.0 | 2.4 | 3.5 |
| $r_0$ (μm) | 4.5 | 4.8 | 10.0 |
| $r_1$ (μm) | 7.5 | 8.8 | 15.0 |
| $r_2$ (μm) | 10.0 | 8.8 | 15.0 |
| $r_3$ (μm) | 15.0 | 20.0 | 15.0 |
| $r_4$ (μm) | 62.5 | 50.0 | 62.5 |

Optical fibers 100', 200', 300' can be manufactured, for example, by making a non-circularly symmetric optical fiber preform, above and then by drawing such fibers the non-circularly symmetrical preform. According to some embodiments, the non-circularly symmetrical preforms for making optical fibers 100', 200', 300' can be manufactured, for example, by: A) making a preform for the optical fiber 100 200, 300, then drilling air holes to form regions R in such a preform, or B) making a preform for the optical fiber 100 200, 300, then drilling holes that re filled with either pure silica rods, or by down doped silica to form regions R in such a preform, or C) cutting off a portion of the fiber preform for the optical fiber 100 200, 300 to form a D shaped preform, situating it in a glass-based tube together with a different D-shaped preform (e.g., downdoped or pure silica D-shaped preform), fusing them together in order to make an optical preform with a circular perimeter, or d) cutting off a portion of the fiber preform for the optical fiber 100 200, 300 to form a D shaped preform.

For example, according to some embodiments, in order to convert a Gaussian beam into an elliptically shaped Bessel beams, instead of having a circularly symmetrical core with an updoped ring shaped region (e.g., 113, 213, 313) the optical fiber 100', 200', 300' comprises two "D shaped" fiber portions D1, D2. FIGS. 21A-21D illustrate the cross-sections of split ring (also referred to herein as a "broken ring") fiber—i.e. a fiber that has an updoped region in a shape of a split ring, e.g., core regions 113', 213', 313'. For example, the optical fiber may have a ring-shaped core that is split into two D-shaped cores, for example, by either a slot or two holes. There is an unlimited number of structures or spacers that can be used to split the ring core, including but not limited to circular holes, square holes, or irregular structures. The width g of structure R separating the two portions of the core is preferably in the range of several microns to tens of microns so that the electric fields in the two D-shaped cores are not coupled. According to some embodiments the D-shaped core structures are slightly different in dimension or refractive index so that the two beam portions propagating through the two D shaped core portions have different phase and intensity. The width ratio $w_{r1}/w_{r2}$ between the two D-shaped structures preferably ranges from 0.8 to 1.3, or the length ratio L1/L2 of the two D-shaped structures preferably ranges from 0.8 to 1.3. Similarly, the refractive index ratio of the two portions of the broken ring (core regions) 13', 213', 313' may range from 0.8 to 1.3 so that the two laser beam portions propagating through the core within the have different phase and intensity. An elliptical Bessel beam can also be generated using one D-shaped "broken ring" core as shown in FIGS. 21E and 21F.

Figure 21A:
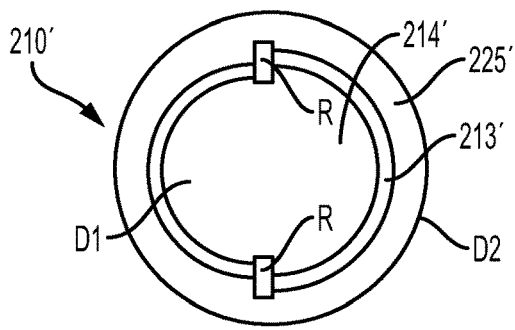
FIGS. 21A-21G illustrate schematically cross-sectional views of several embodiments of the optical fibers or the end-cups for use with optical fibers described herein.
Figure 21B:
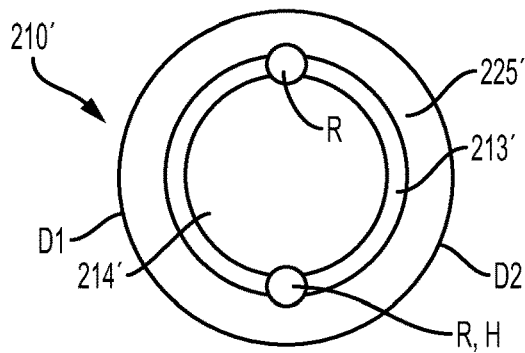
Figure 21C:
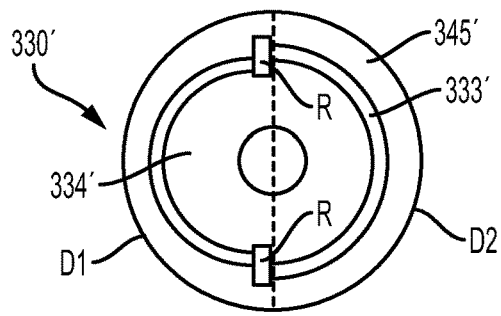
Figure 21D:
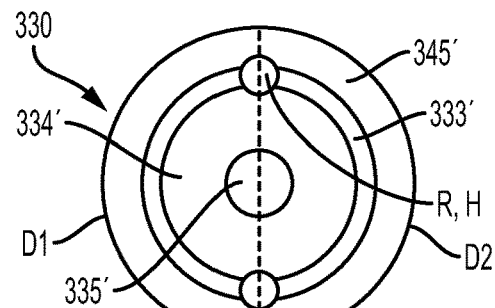
Figure 21E:
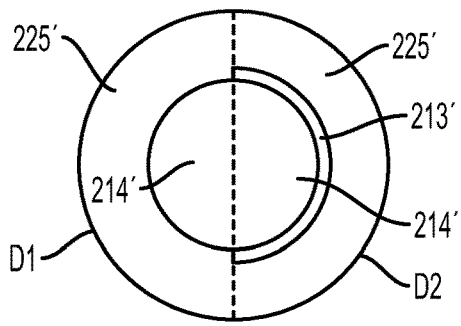
Figure 21F:
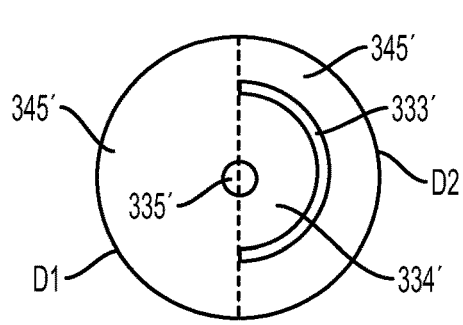

More specifically, FIGS. 21A-21F illustrate cross-sectional views of additional embodiments of the fibers optical fibers 200', 300' (or of the alternative end-cups 1000). In FIGS. 21A and 21B, for clarity, only the core 212' (including the first region 213') and the first cladding region 225' of the first segment 210' is depicted, i.e., the rest of the first cladding portion 222' is not shown. In these exemplary embodiments of fiber 200' corresponding to FIGS. 21A and 21B the regions R have the same index of refraction as regions 214' and 225'. In FIGS. 21C and 21D, for clarity, only the core 332' (including the updoped first region 333') and the first cladding region 345' of the fiber segment 330' is depicted in FIG. 21C, 21D, i.e., the rest of the first cladding portion 342' is not shown. In the exemplary embodiments of fiber 300' corresponding to FIGS. 21C and 21D the regions R have the same index of refraction as regions 334' and 345'.

Figure 21G:
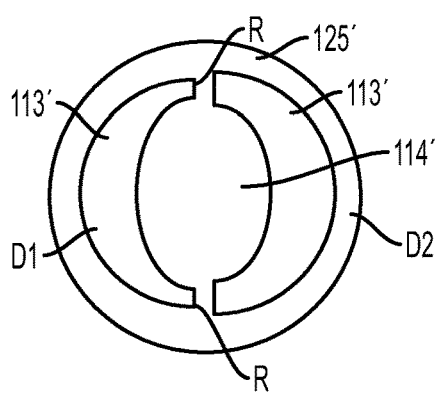

FIG. 21E illustrates another embodiment of the optical fiber 200'. The optical fiber 200' of this embodiment comprises two D-shaped portions, one of which (right hand side) comprises the core portion 212 (including the first region 213', shaped as a half-ring) and the cladding portion 245'. The left hand portion includes the core portion 225' and the cladding portion 225', but does not include the higher index portion first region 213'). Again, for clarity, only the core 212' (including the first region 213' situated in the right hand side of the fiber 200') and the first cladding region 225' is depicted in FIG. 21E. That is, the rest of the first cladding portion 222' is not shown. FIG. 21F illustrates another embodiment of the optical fiber 300'. The optical fiber 300' of this embodiment comprises two D-shaped portions D1, D1, one of which (right hand side D2) comprising the core portion 332' including the central core region 315', the down doped region first region 334' and the updoped region 333' shaped as a half-ring, and the cladding portion 345'. The left hand portion includes the core portion 335' and the cladding portion 345', but does not include the higher index portion first region 333'). Again, for clarity, only the core 332' (including the first region 333' situated in the right hand side of the fiber 300') and the first cladding region 345' are depicted in FIG. 21E, i.e., the rest of the first cladding portion 342' is not shown. FIG. 21G illustrates another embodiment of the fiber (fiber 100') for making non-axisymmetric Gaussian beam.

A segment of a split ring core or D-shaped ring core fiber 100', 200', 300', can be used as an end-cap with a ring core fiber 1000, 200, 300 to do beam conversion from a ring-shaped beam to a non-axisymmetric shape beam. The splitting of the core's symmetry so that the core is no longer circularly symmetric allows the conventional Bessel beam to be converted into two D-shaped beam when the end-cap fiber 1000 is attached to the fiber 100, 200, 300 (also referred to as a ring shaped fober).

Figure 22A:
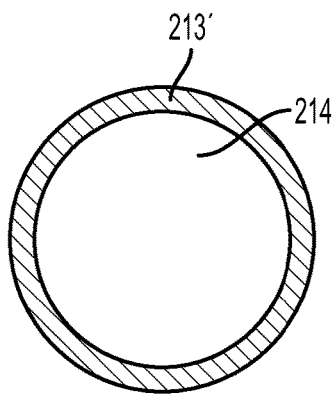
FIGS. 22A-22C illustrate schematically one exemplary method for making some of the fiber embodiments described herein.
Figure 22B:
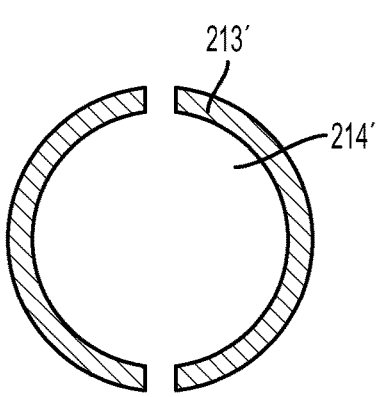
Figure 22C:
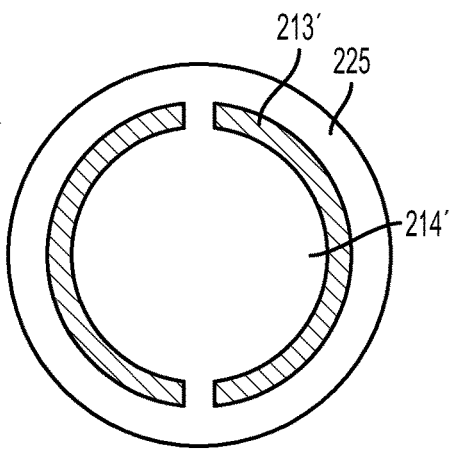

As discussed above, the proposed D-shaped ring core fibers can be made by several methods. FIGS. 22A-22C illustrate one method for making split ring core fiber. First a ring core preform (i.e., an optical fiber preform having a high index ring) with the ring core 213' on the outside of the preform is made, for example by OVD process. (See FIG. 22A). Then the two slots are made by removing glass in the two areas in the ring core to create regions R (see FIG. 22B). Then the preform is overclad using OVD to make the final optical fiber preform. The preform is drawn into fiber. (See FIG. 22C).

Figure 23A:
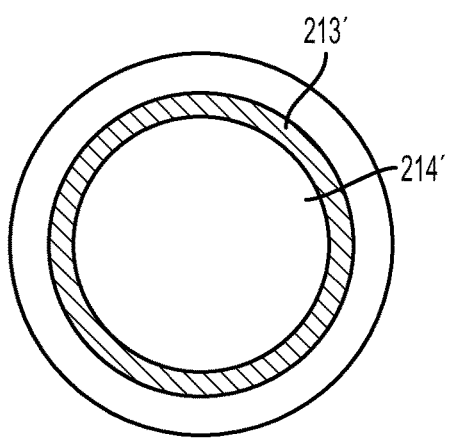
FIGS. 23A-23B illustrate schematically another exemplary method for making some of the fiber embodiments described herein.
Figure 23B:
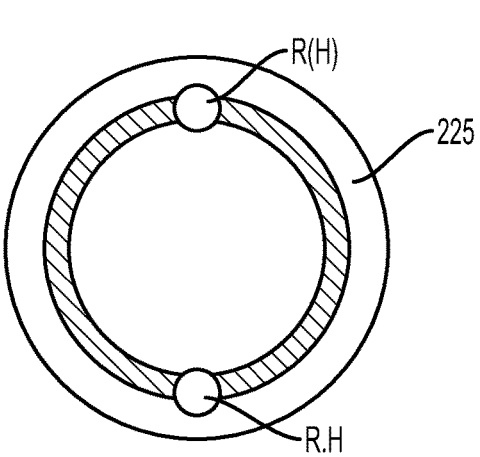

FIGS. 23A-23B illustrate another method for making split ring core fiber. First a ring core preform with the ring core and cladding is made by OVD process. (Aee FIG. 23A.) Then two holes are drilled in the ring core. (See FIG. 23B.) The preform is drawn into an optical fiber while keeping the holes open.

Figure 23C:
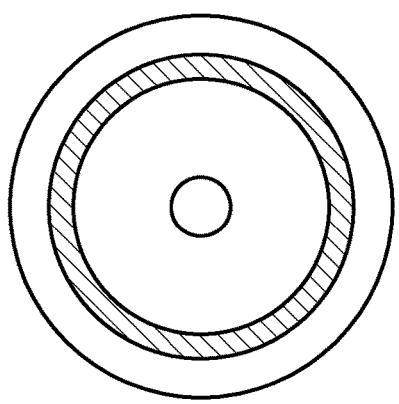
FIGS. 23C-23D illustrate yet exemplary method for making some of the fiber embodiments described herein.
Figure 23D:
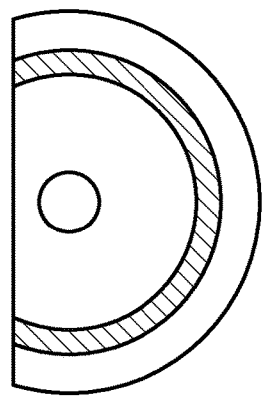

FIGS. 23C-23D illustrate a method for making D-shaped ring core fiber preform. First a ring core preform with the ring core and cladding is made by OVD process. (See FIG. 23C.) Then part of the cladding and ring core is removed to make a D-shaped optical preform. (See FIG. 23D.) The optical preform is drawn into a D-shaped fiber.

Based on the foregoing, it should now be understood that the optical fibers described herein convert a Gaussian laser beam into a Bessel beam, for example, a non-axisymmetric Bessel laser beam. It should also be understood that the optical fibers have relatively low bend losses. The optical fibers are particularly suitable for applications requiring a large depth of focus such as laser inspection techniques, laser processing techniques, and the like. Also based on foregoing, it should now be understood that some of the optical fibers described herein, when used in conjunction with the end-caps convert a Gaussian laser into a non-axisymmetric Bessel laser beam It will be apparent to those skilled in the art that various modifications and variations can be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

The invention claimed is:

1. A method for laser processing a transparent workpiece, the method comprising:
    forming a contour line in the transparent workpiece, the contour line comprising defects in the transparent workpiece, wherein forming the contour line comprises:
    directing a pulsed laser beam provided by a beam source through either:
    (a) an optical fiber comprising at least one segment with non-axisymmetric refractive index profile that forms a non-axisymmetric pulsed laser beam, or
    (b) an optical fiber generating a ring-shaped beam and an end-cap with non-axisymmetric refractive index profile coupled to the optical fiber generating a ring-shaped beam, such that the end-cap forms a non-axisymmetric pulsed laser beam;
    wherein a portion of the non-axisymmetric pulsed laser beam directed into the transparent workpiece generates an induced absorption within the transparent workpiece, the induced absorption producing a defect within the transparent workpiece, and the portion of the pulsed laser beam directed into the transparent workpiece comprises:
    a wavelength $\lambda$;
    an effective spot size $w_{o,\mathit{eff}}$; and
    a non-axisymmetric beam cross section that comprises a minimum Rayleigh range $Z_{Rx,min}$ in a cross-sectional x-direction and a minimum Rayleigh range $Z_{Ry,min}$ in a cross-sectional y-direction, wherein the smaller of $Z_{Rx,min}$ and $Z_{Ry,min}$ is greater than $$F_D \frac{\pi w_{0,eff}^2}{\lambda},$$

where $F_D$ is a dimensionless divergence factor comprising a value of 10 or greater.

2. The method of claim 1, further comprising translating the transparent workpiece and the non-axisymmetric pulsed laser beam relative to each other along the contour line, thereby laser forming a plurality of defects along the contour line within the transparent workpiece.

3. The method of claim 1, wherein the dimensionless divergence factor $F_D$ comprises a value of from about 50 to about 1500.

4. The method of claim 2, further comprising directing an infrared laser beam onto the transparent workpiece along or near the contour line to separate the transparent workpiece along the contour line.

5. The method of claim 1, wherein the beam source comprises a pulsed beam source that produces pulse bursts with from about 1 pulse per pulse burst to about 30 pulses per pulse burst and a pulse burst energy is from about 100 µJ to about 600 µJ per pulse burst.

6. The method of claim 1, wherein the non-axisymmetric beam cross section of the portion of the non-axisymmetric pulsed laser beam directed into the transparent workpiece comprises a long axis with spot size parameter $w_{o,max}$ and a short axis with spot size parameter $w_{o,min}$, wherein $w_{o,max}$ is longer than $w_{o,min}$ and an aspect ratio of $w_{o,max}$ to $w_{o,min}$ is greater than 1.3.

7. The method of claim 1, further comprising a focusing optical component.

8. The method of claim 7, wherein focusing optical component is a lens with at least one convex surface.

9. The method of claim 1 further comprising an aspheric optical element, wherein the aspheric optical element is a refractive axicon, a reflective axicon, waxicon, negative axicon, a spatial light modulator, a diffractive optic, or a cubically shaped optical element.

\* \* \* \* \*